US012604464B2

(12) United States Patent
Lee et al.

(10) Patent No.: US 12,604,464 B2
(45) Date of Patent: Apr. 14, 2026

(54) VERTICAL DIGIT LINES FOR SEMICONDUCTOR DEVICES

(71) Applicant: Micron Technology, Inc., Boise, ID (US)

(72) Inventors: Si-Woo Lee, Boise, ID (US); Sangmin Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 399 days.

(21) Appl. No.: 17/843,662

(22) Filed: Jun. 17, 2022

(65) Prior Publication Data

US 2022/0320103 A1     Oct. 6, 2022

Related U.S. Application Data

(62) Division of application No. 17/079,612, filed on Oct. 26, 2020, now Pat. No. 11,367,726.

(51) Int. Cl.
    *H10B 12/00*     (2023.01)
    *G11C 11/402*     (2006.01)
    (Continued)

(52) U.S. Cl.
    CPC .......... *H10B 12/36* (2023.02); *G11C 11/4023* (2013.01); *H01L 25/0657* (2013.01); *H01L 27/0688* (2013.01); *H10B 12/056* (2023.02)

(58) Field of Classification Search
    CPC .... H10B 12/36; H10B 12/056; H10B 12/482; H10B 12/488; H10B 12/05;
    (Continued)

(56) References Cited

U.S. PATENT DOCUMENTS 10,607,995 B2     3/2020  Roberts et al.
10,937,809 B1     3/2021  Sharangpani et al.
        (Continued)

OTHER PUBLICATIONS

DRAM Circuit Design: A Tutoriall Brent Keeth & R. Jacob Baker; 2000; IEEE Press Series on Microelectronic System (Year: 2000).*
        (Continued)

*Primary Examiner* — Mohammad A Rahman
(74) *Attorney, Agent, or Firm* — Brooks, Cameron & Huebsch, PLLC

(57)     ABSTRACT

Systems, methods and apparatus are provided for an array of vertically stacked memory cells having horizontally oriented access devices and access lines and vertically oriented digit lines having a first source/drain region and a second source drain region separated by a channel region, and gates opposing the channel region formed fully around every surface of the channel region as gate all around (GAA) structures, horizontal oriented access lines coupled to the gates and separated from a channel region by a gate dielectric. The memory cells have horizontally oriented storage nodes coupled to the second source/drain region and vertically oriented digit lines coupled to the first source/drain regions. A vertical body contact is formed in direct electrical contact with a body region of one or more of the horizontally oriented access devices and separate from the first source/drain region and the vertically oriented digit lines by a dielectric.

16 Claims, 51 Drawing Sheets

(51) Int. Cl.
  *H01L 25/065* (2023.01)
  *H01L 27/06* (2006.01)
(58) Field of Classification Search
  CPC . G11C 11/4023; G11C 11/408; G11C 11/401;
       G11C 11/4099; G11C 14/0009; G11C
       14/0045; G11C 2211/4016; G11C 11/04;
       G11C 11/419; H01L 25/0657; H01L
       27/0688; H01L 27/108; H01L 27/10897;
       H01L 2924/1436; H01L 2924/14369;
       H01L 27/1023; H01L 28/40; H01L 28/92;
       H01L 27/11; H01L 27/1116; H01L
       2924/1437; H01L 27/092; H01L 27/0928
  See application file for complete search history.

(56) References Cited

U.S. PATENT DOCUMENTS

| | | |
|---|---|---|
| 2014/0254231 A1 | 9/2014 | Cernea et al. |
| 2018/0323200 A1 | 11/2018 | Tang et al. |
| 2019/0103406 A1 | 4/2019 | Tang et al. |
| 2019/0164985 A1 | 5/2019 | Lee et al. |
| 2019/0187082 A1* | 6/2019 | Cao .................... G01N 27/07 |
| 2020/0083225 A1 | 3/2020 | Ma et al. |
| 2020/0111793 A1* | 4/2020 | Kim .................... H01L 28/86 |
| 2020/0227418 A1 | 7/2020 | Kim et al. |
| 2020/0279601 A1 | 9/2020 | Kim et al. |
| 2021/0091229 A1* | 3/2021 | Cheng ............. H01L 29/78681 |
| 2022/0068413 A1* | 3/2022 | Su ..................... G11C 17/16 |

OTHER PUBLICATIONS

DRAMCircuitDesign: ATutorial;BrentKeeth&R.JacobBaker; 2000; IEEE PressSeriesMicroelectronicSystem (Year: 2000).*

U.S. Appl. No. 16/204,224, entitled, "Memory Arrays," filed Nov. 29, 2018, 43 pages.

International Search Report and Written Opinion from related international application No. PCT/US2021/056395, dated Feb. 15, 2022, 11 pages.

\* cited by examiner (ALONG CUT-LINE A-A' IN FIG 5A)

(ALONG CUT-LINE A-A' IN FIG 6A)

(ALONG CUT-LINE B-B' IN FIG 6A)

(ALONG CUT-LINE C-C' IN FIG 6A)

(ALONG CUT-LINE D-D' IN FIG 6A)

(ALONG CUT-LINE A-A' IN FIG 7A)

(ALONG CUT-LINE B-B' IN FIG 7A)

(ALONG CUT-LINE C-C' IN FIG 7A)

(ALONG CUT-LINE D-D' IN FIG 7A)

(ALONG CUT-LINE A-A' IN FIG 8A)

(ALONG CUT-LINE B-B' IN FIG 8A)

(ALONG CUT-LINE C-C' IN FIG 8A)

(ALONG CUT-LINE D-D' IN FIG 8A)

(ALONG CUT-LINE A-A' IN FIG 9A)

(ALONG CUT-LINE B-B' IN FIG 9A)

(ALONG CUT-LINE C-C' IN FIG 9A)

(ALONG CUT-LINE D-D' IN FIG 9A)

(ALONG CUT-LINE A-A' IN FIG 10A)

(ALONG CUT-LINE B-B' IN FIG 10A)

(ALONG CUT-LINE C-C' IN FIG 10A)

(ALONG CUT-LINE D-D' IN FIG 10A)

(ALONG CUT-LINE A-A' IN FIG 11A)

(ALONG CUT-LINE B-B' IN FIG 11A)

(ALONG CUT-LINE C-C' IN FIG 11A)

(ALONG CUT-LINE D-D' IN FIG 11A)

(ALONG CUT-LINE A-A' IN FIG 12A)

(ALONG CUT-LINE B-B' IN FIG 12A)

(ALONG CUT-LINE C-C' IN FIG 12A)

(ALONG CUT-LINE D-D' IN FIG 12A)

1703-1

WL on ➪

1707-1

VERTICAL DIGIT LINES FOR SEMICONDUCTOR DEVICES

PRIORITY INFORMATION

This application is a Divisional of U.S. application Ser. No. 17/079,612, filed on Oct. 26, 2020, the contents of which are incorporated herein by reference.

TECHNICAL FIELD

The present disclosure relates generally to memory devices, and more particularly, to a vertical digit line for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
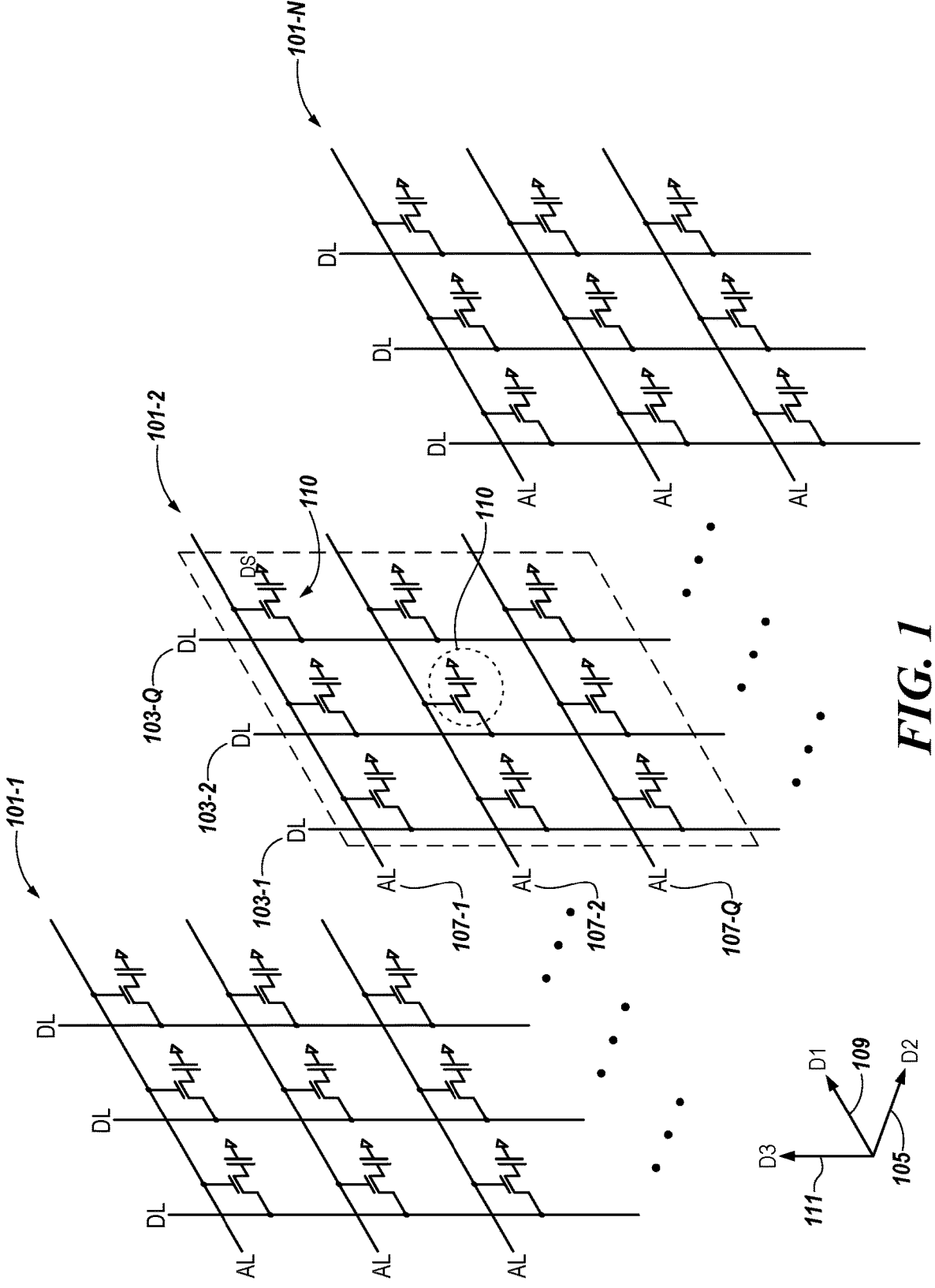
FIG. 1 is a schematic illustration of a vertical three dimensional (3D) memory in accordance a number of embodiments of the present disclosure.

Embodiments of the present disclosure describe a digit line and body contact for semiconductor devices. A vertically oriented digit line is formed with horizontally oriented access devices and access lines in an array of vertically stacked memory cells. The horizontal access devices are integrated with horizontally oriented access lines and integrated with vertically oriented digit lines. The vertical digit line may provide lower digit line capacitance, better geometry and a better voltage signal. The present disclosure describes a channel region formed from a thinner material than traditional channels. Combined with a gate all around (GAA) structure at the channel region of the semiconductor material, provides better electrostatic control on the channel, better subthreshold slope and a more cost effective process.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a wordlines). Also, each of the sub cell arrays, e.g., sub cell array 101-2, may include a plurality of digit lines 103-1, 103-2, . . . , 103-Q (which also may be referred to as bitlines, data lines, or sense lines). In FIG. 1, the access lines 107-1, 107-2, . . . , 107-Q are illustrated extending in a first direction (D1) 109 and the digit lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111.

The digit lines 103-1, 103-2, . . . , 103-Q may be or include conductive patterns (e.g., metal lines) extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 2:
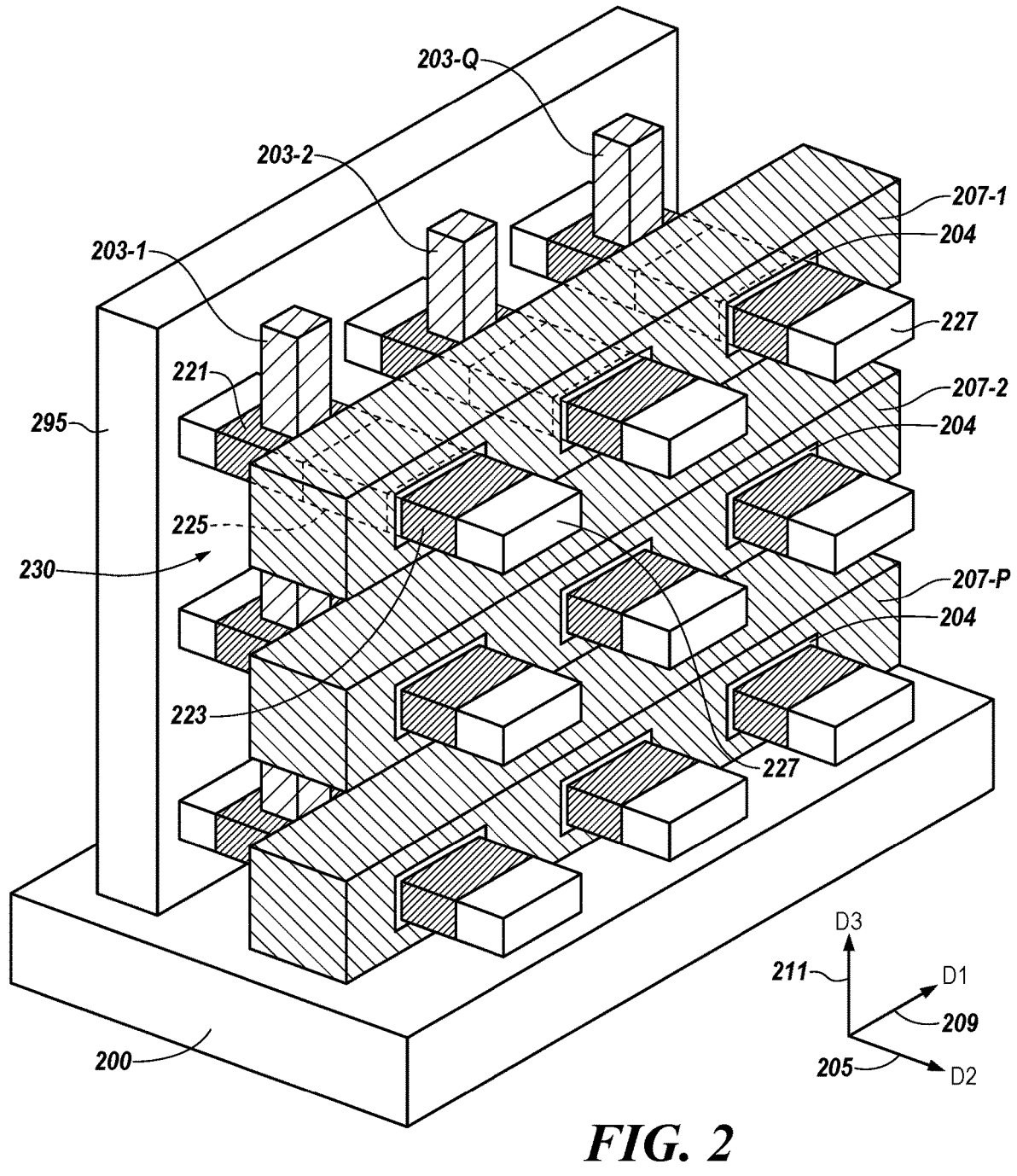
FIG. 2 is a perspective view illustrating a portion of a digit line and body contact for semiconductor devices in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1, and may be separated from the substrate 200 by an insulator material 220. Each of the repeating, vertical levels, L1, L2, and L3 may include a plurality of discrete components, e.g., regions, to the horizontally oriented access devices 230, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 230, e.g., transistors, may be formed in a plurality of iterations of vertically, repeating layers within each level, as described in more detail below in connection with FIGS. 4A-4K, and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented access lines 207-1, 207-2, . . . , 207-Q extend in the first direction (D1) 209, analogous to the first direction (D1) 109 in FIG. 1. The plurality of horizontally oriented access lines 207-1, 207-2, . . . , 207-Q may be analogous to the access lines 107-1, 107-2, . . . , 107-Q shown in FIG. 1. The plurality of horizontally oriented access lines 207-1, 207-2, . . . , 207-Q may be arranged, e.g., "stacked", along the third direction (D3) 211. The plurality of horizontally oriented access lines 207-1, 207-2, . . . , 207-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the horizontally oriented memory cells, e.g., memory cell 110 in FIG. 1, may be spaced apart from one another horizontally in the first direction (D1) 209. However, as described in more detail below in connection with FIG. 4 et. seq., the plurality of discrete components to the horizontally oriented access devices 230, e.g., first source/drain region 221 and second source/drain region 223 separated by a channel region 225, extending laterally in the second direction (D2) 205, and the plurality of horizontally oriented access lines 207-1, 207-2, . . . , 207-Q extending laterally in the first direction (D1) 209, may be formed within different vertical layers within each level. For example, the plurality of horizontally oriented access lines 207-1, 207-2, . . . , 207-Q, extending in the first direction (D1) 209, may be formed around and electrically coupled to the channel regions 225, separated therefrom by a gate dielectric 204, and orthogonal to horizontally oriented access devices 230, e.g., transistors, extending in laterally in the second direction (D2) 205. This embodiment illustrates the gate dielectric 204 being conformally deposited all around channel region 225. In some embodiments, the horizontally oriented access lines 207-1, 207-2, . . . , 207-Q, extending in the first direction (D1) 209, may be formed as a dual gate dielectric material, separating the channel region 225 from the horizontally oriented access lines 207-1, 207-2, . . . , 207-Q, on two sides, (for example, a top and a bottom side). In some embodiments, the plurality of horizontally oriented access lines 207-1, 207-2, . . . , 207-Q, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the horizontally oriented access device are formed.

As shown in the example embodiment of FIG. 2, the digit lines, 203-1, 203-2, . . . , 203-Q, extend in a vertical direction with respect to the substrate 200, e.g., in a third direction (D3) 211. Further, as shown in FIG. 2, the digit lines, 203-1, 203-2, . . . , 203-Q, in one sub cell array, e.g., sub cell array 101-2 in FIG. 1, may be spaced apart from each other in the first direction (D1) 209. The digit lines, 203-1, 203-2, . . . , 203-Q, may be provided, extending vertically relative to the substrate 200 in the third direction (D3) 211 in vertical alignment with source/drain regions to serve as first source/drain regions 221 or, as shown, be vertically adjacent first source/drain regions 221 for each of the horizontally oriented access devices 230, e.g., transistors, extending laterally in the second direction (D2) 205, but adjacent to each other on a level, e.g., first level (L1), in the first direction (D1) 209. Each of the digit lines, 203-1, 203-2, . . . , 203-Q, may vertically extend, in the third direction (D3), on sidewalls, adjacent first source/drain regions 221, of respective ones of the plurality of horizontally oriented access devices 230, e.g., transistors, that are vertically stacked. In some embodiments, the plurality of vertically oriented digit lines 203-1, 203-2, . . . , 203-Q, extending in the third direction (D3) 211, may be connected to side surfaces of the first source/drain regions 221 directly and/or through additional contacts including metal silicides.

For example, and as shown in more detail in FIG. 3, a first one of the vertically extending digit lines, e.g., 203-1, may be adjacent a sidewall of a first source/drain region 221 to a first one of the horizontally oriented access devices 230, e.g., transistors, in the first level (L1) 213-1, a sidewall of a first source/drain region 221 of a first one of the horizontally oriented access devices 230, e.g., transistors, in the second level (L2) 213-2, and a sidewall of a first source/drain region 221 a first one of the horizontally oriented access devices 230, e.g., transistors, in the third level (L3) 213-P, etc. Similarly, a second one of the vertically extending digit lines, e.g., 203-2, may be adjacent a sidewall to a first source/drain region 221 of a second one of the horizontally oriented access devices 230, e.g., transistors, in the first level (L1) 213-1, spaced apart from the first one of horizontally oriented access devices 230, e.g., transistors, in the first level (L1) 213-1 in the first direction (D1) 209. And the second one of the vertically extending digit lines, e.g., 203-2, may be adjacent a sidewall of a first source/drain region 221 of a second one of the laterally oriented access devices 230, e.g., transistors, in the second level (L2) 213-2, and a sidewall of a first source/drain region 221 of a second one of the horizontally oriented access devices 230, e.g., transistors, in the third level (L3) 213-P, etc. Embodiments are not limited to a particular number of levels.

The vertically extending digit lines, 203-1, 203-2, . . . , 203-Q, may include a conductive material, such as, for example, one of a doped semiconductor material, a conductive metal nitride, metal, and/or a metal-semiconductor compound. The digit lines, 203-1, 203-2, . . . , 203-Q, may correspond to digit lines (DL) described in connection with FIG. 1.

As shown in the example embodiment of FIG. 2, a conductive body contact may be formed extending in the first direction (D1) 209 along an end surface of the horizontally oriented access devices 230, e.g., transistors, in each level (L1) 213-1, (L2) 213-2, and (L3) 213-P above the substrate 200. The body contact may be connected to a body (as shown by 336 in FIG. 3) e.g., body region, of the horizontally oriented access devices 230, e.g., transistors, in each memory cell, e.g., memory cell 110 in FIG. 1. The body contact may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 3A:
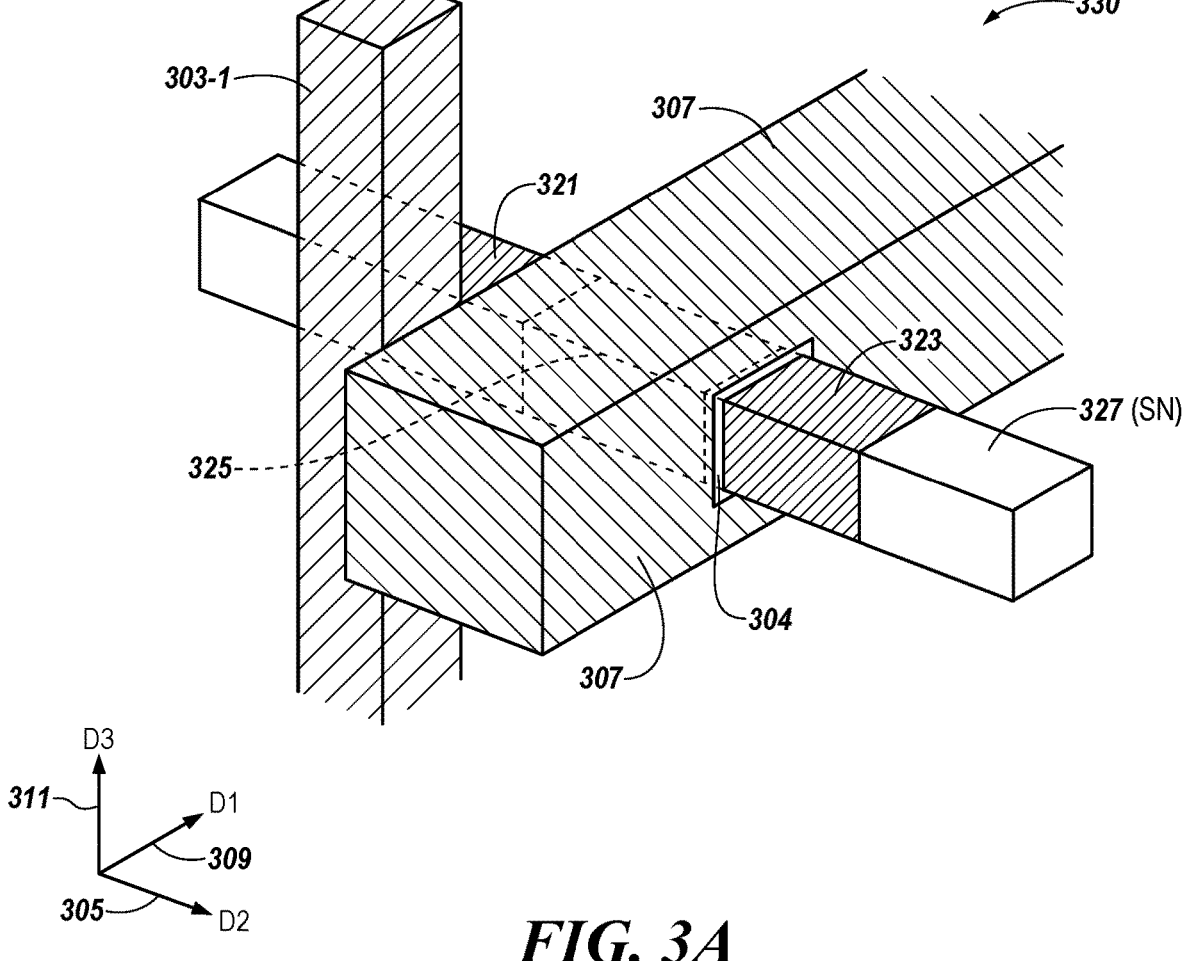
FIGS. 3A-3B illustrate a portion of a digit line and body contact for semiconductor devices in accordance with a number of embodiments of the present disclosure.

FIG. 3A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3A, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. The first and the second source/drain regions may be separated by a channel 325 formed in a body of semiconductor material, e.g., body region of the horizontally oriented access devices 330, e.g., transistors. The first and the second source/drain regions, 321 and 323, may be formed from an n-type or p-type dopant doped in the body region. Embodiments are not so limited.

For example, for an n-type conductivity transistor construction the body region of the laterally oriented access devices 330, e.g., transistors, may be formed of a low doped p-type (p−) semiconductor material. In one embodiment, the body region and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In2O3), or indium tin oxide (In2-xSnxO3), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 330, e.g., transistors, may be of a p-type conductivity construction in which case the impurity, e.g., dopant, conductivity types would be reversed.

As shown in the example embodiment of FIG. 3A, the first source/drain region 321 may occupy an upper portion in the body of the laterally oriented access devices 330, e.g., transistors. For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in electrical contact with the body contact. Further, as shown in the example embodiment of FIG. 3A, an access line, e.g., 307-1, analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a digit line, e.g., 303-1, analogous to the digit lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330, e.g., transistors horizontally conducting between the first and the second source/drain regions 321 and 323 along the second direction (D2) 305. In this embodiment, the vertically oriented digit line 303-1 is formed asymmetrically adjacent in electrical contact with the first source/drain regions 321. The digit line 303-1 may be formed as asymmetrically to reserve room for a body contact in the channel region 325.

Figure 3B:
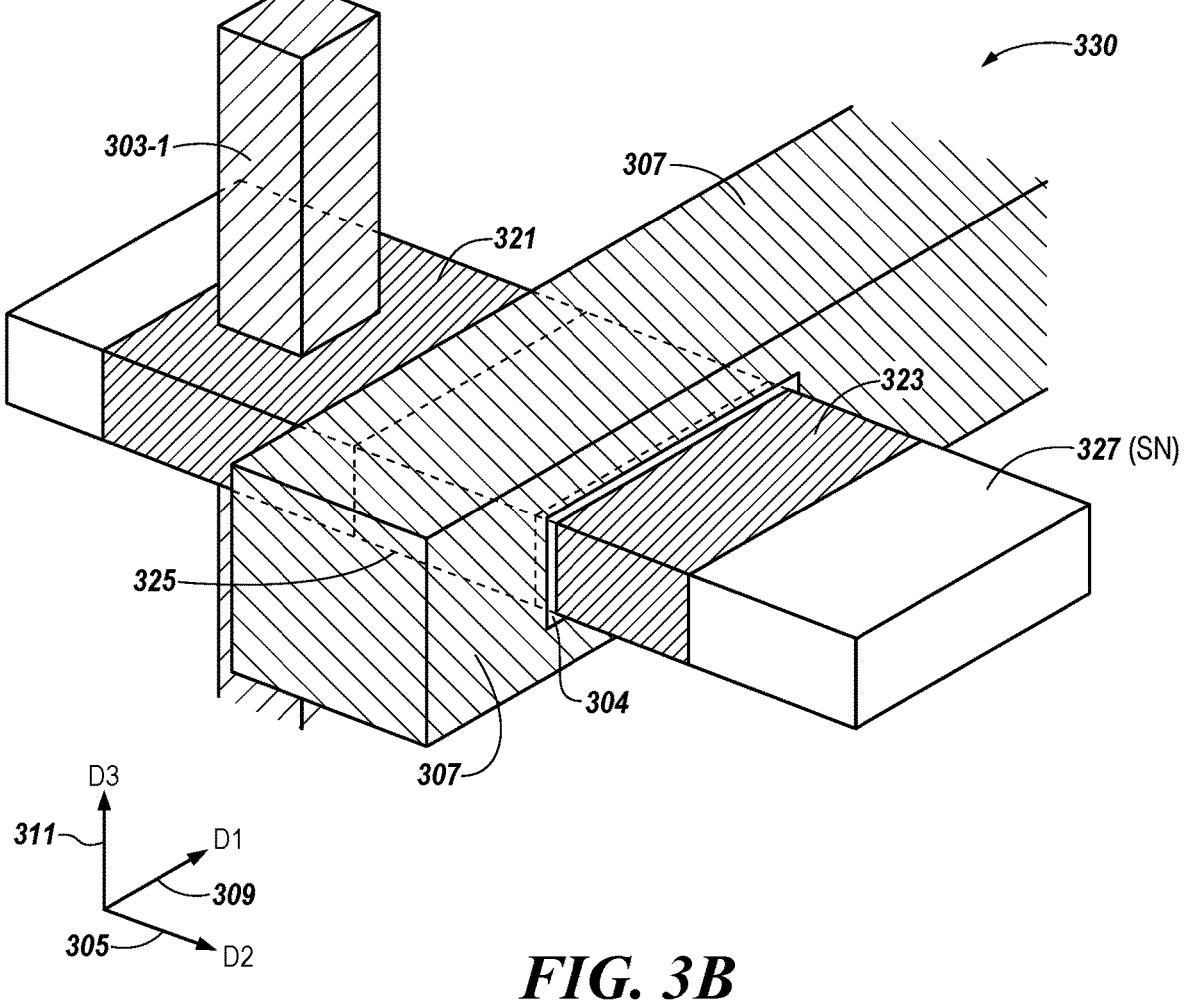

FIG. 3B illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3B, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions may be separated by a channel 325 formed in a body of semiconductor material, e.g., body region, of the horizontally oriented access devices 330, e.g., transistors. The first and the second source/drain regions, 321 and 323, may be formed from an n-type or p-type dopant doped in the body region. Embodiments are not so limited.

As shown in the example embodiment of FIG. 3B, a digit line, e.g., 303-1, analogous to the digit lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330, e.g., transistors horizontally conducting between the first and the second source/drain regions 321 and 323 along the second direction (D2) 305. In this embodiment, the vertically oriented digit line 303-1 is formed symmetrically, in vertical alignment, in electrical contact with the first source/drain region 321. The digit line 303-1 may be formed in contact with an insulator material such that there is no body contact within channel 325.

As shown in the example embodiment of FIG. 3B, the digit line 303-1 may be formed symmetrically within the first source/drain region 321 such that the first source/drain region 321 surrounds the digit line 303-1 all around. The first source/drain region 321 may occupy an upper portion in the body of the laterally oriented access devices 330, e.g., transistors. For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in contact with the body contact. An insulator material may fill the body contact such that the first source/drain region 321 may not be in electrical contact with channel 325. Further, as shown in the example embodiment of FIG. 3B, an access line, e.g., 307-1, analogous to the access lines 207-1, 207-2, . . . , 207-Q in FIGS. 2 and 107-1, 107-2, . . . , 107-Q shown in FIG. 1, may disposed all around and coupled to a channel region 325, separated therefrom by a gate dielectric 304.

Figure 4:
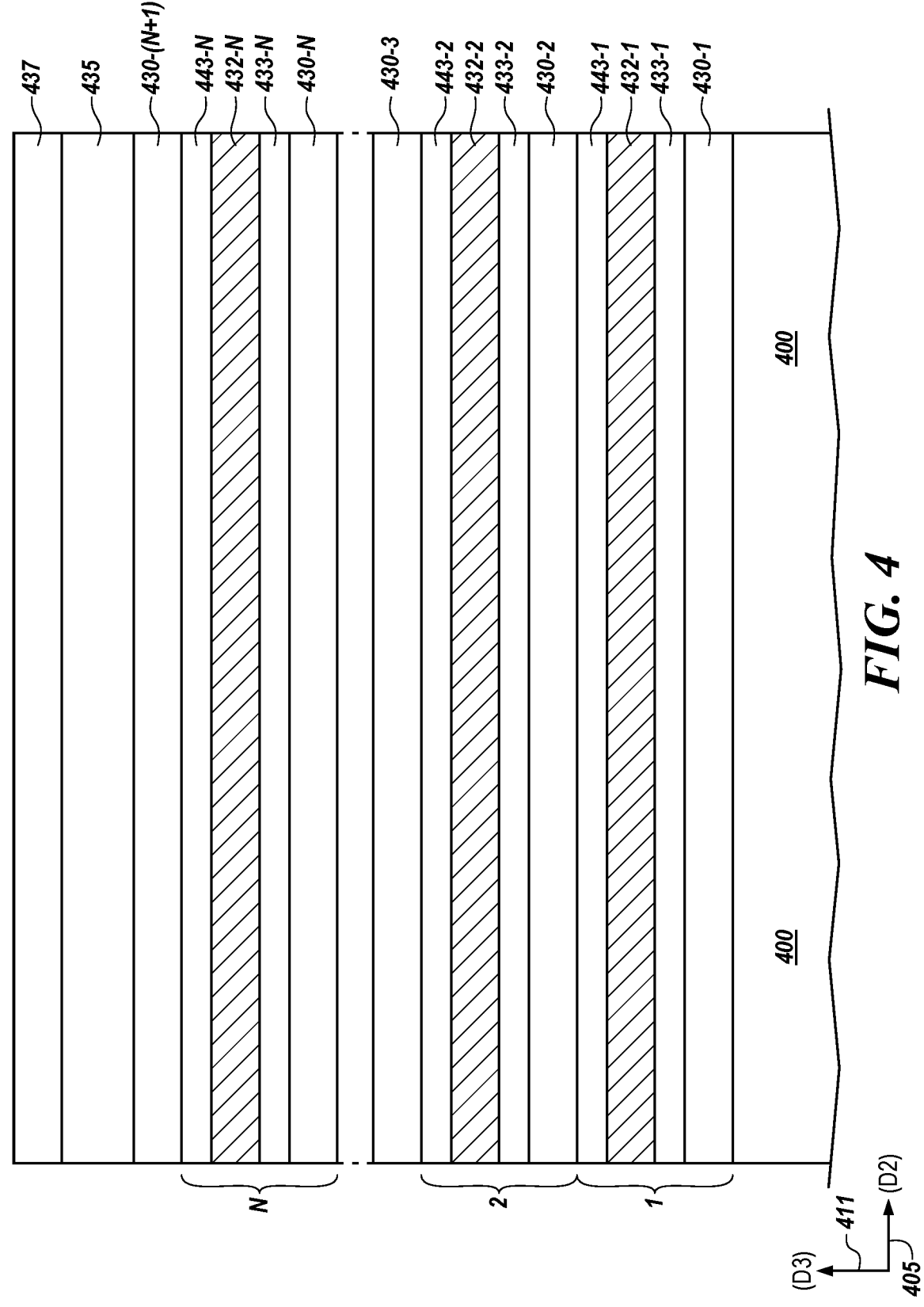
FIG. 4 is a cross-sectional view for forming arrays of vertically stacked memory cells, at multiple stages of a semiconductor fabrication process, to form vertical digit lines for semiconductor devices in accordance with a number of embodiments of the present disclosure.

FIG. 4 is a cross-sectional view, at one stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure.

In the example embodiment shown in the example of FIG. 4, the method comprises depositing alternating layers of a first dielectric material, 430-1, 430-2, . . . , 430-N (collectively referred to as first dielectric material 430), a second dielectric material, 433-1, 433-2, . . . , 433-N (collectively referred to as second dielectric 433) a semiconductor material, 432-1, 432-2, . . . , 432-N (collectively referred to as semiconductor material 432), and a third dielectric material, 443-1, 443-2, . . . , 443-N (collectively referred to as second dielectric 443), in repeating iterations to form a vertical stack 401 on a working surface of a semiconductor substrate 400. The alternating materials in the repeating, vertical stack 401 may be separated from the substrate 400 by an insulator material 420. In one embodiment, the first dielectric material 430 can be deposited to have a thickness, e.g., vertical height in the third direction (D3), in a range of thirty (30) nanometers (nm) to sixty (60) nm. In one embodiment, the semiconductor material 432 can be deposited to have a thickness (t2), e.g., vertical height, in a range of five (5) nm to thirty (30) nm. In one embodiment, the second dielectric material 433 and third dielectric material 443 can be deposited to have a thickness (t1), e.g., vertical height, in a range of ten (10) nm to thirty (30) nm. Embodiments, however, are not limited to these examples. As shown in FIG. 4, a vertical direction 411 is illustrated as a third direction (D3), e.g., z-direction in an x-y-z coordinate system, analogous to the third direction (D3), among first, second, and third directions, shown in FIGS. 1-3.

In some embodiments, the first dielectric material, 430-1, 430-2, . . . , 430-N, may be an interlayer dielectric (ILD). By way of example, and not by way of limitation, the first dielectric material, 430-1, 430-2, . . . , 430-N, may comprise an oxide material, e.g., $SiO_2$. In another example the first dielectric material, 430-1, 430-2, . . . , 430-N, may comprise a silicon nitride ($Si_3N_4$) material (also referred to herein as "SiN"). In another example the first dielectric material, 430-1, 430-2, . . . 430-N, may comprise a silicon oxy-carbide ($SiO_xC_y$) material. In another example the first dielectric material, 430-1, 430-2, . . . , 430-N, may include silicon oxy-nitride ($SiO_xN_y$) material (also referred to herein as "SiON"), and/or combinations thereof. Embodiments are not limited to these examples.

In some embodiments, the semiconductor material, 432-1, 432-2, . . . 432-N, may comprise a silicon (Si) material in a polycrystalline and/or amorphous state. The semiconductor material, 432-1, 432-2, . . . , 432-N, may be a low doped, p-type (p−) silicon material. The semiconductor material, 432-1, 432-2, . . . , 432-N, may be formed by gas phase doping boron atoms (B), as an impurity dopant, at a low concentration to form the low doped, p-type (p−) silicon material. The low doped, p-type (p−) silicon material may be a polysilicon material. Embodiments, however, are not limited to these examples.

In some embodiments, the second dielectric material, 433-1, 433-2, . . . 433-N and third dielectric material, 443-1, 443-2, . . . , 443-N, may be a same dielectric material. In some embodiments, the second dielectric material, 433-1, 433-2, . . . , 433-N and third dielectric material, 443-1, 443-2, . . . , 443-N, may be an interlayer dielectric (ILD). By way of example, and not by way of limitation, the second dielectric material, 433-1, 433-2, . . . , 433-N, and third dielectric material, 443-1, 443-2, . . . , 443-N, may comprise a nitride material. The nitride material may be a silicon nitride ($Si_3N_4$) material (also referred to herein as "SiN"). In another example the second dielectric material, 433-1, 433-2, . . . , 433-N, and third dielectric material, 443-1, 443-2, . . . , 443-N, may comprise a silicon oxy-carbide (SiOC) material. In another example the second dielectric material, 433-1, 433-2, . . . , 433-N, and third dielectric material, 443-1, 443-2, . . . , 443-N, may include silicon oxy-nitride (SiON), and/or combinations thereof. Embodiments are not limited to these examples.

The second dielectric material, 433-1, 433-2, . . . , 433-N and third dielectric material, 443-1, 443-2, . . . , 443-N, may be a same dielectric material to provide better access to selectively etch above and below the semiconductor material, 432-1, 432-2, . . . , 432-N. However, according to embodiments, the second dielectric material, 433-1, 433-2, . . . , 433-N, and third dielectric material, 443-1, 443-2, . . . , 443-N, are purposefully chosen to be different in material or composition than the first dielectric material, 430-1, 430-2, . . . , 430-N, such that a selective etch process may be performed on one of the first or second and third dielectric layers, for example the other one of the first and the second and third dielectric layers and/or semiconductor material 432, e.g, the second SiN dielectric material, 433-1, 433-2, . . . , 433-N, may be selectively etched relative to the semiconductor material, 432-1, 432-2, . . . , 432-N, and a first oxide dielectric material, 430-1, 430-2, . . . , 430-N.

The repeating iterations of alternating first dielectric material, 430-1, 430-2, . . . , 430-N layers, second dielectric material, 433-1, 433-2, . . . , 433-N layers, semiconductor material, 432-1, 432-2, . . . , 432-N layers, and a third dielectric material, 443-1, 443-2, . . . , 443-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a second dielectric material a semiconductor material, and a third dielectric material, in repeating iterations to form the vertical stack 401.

The layers may occur in repeating iterations vertically. In the example of FIG. 4, three tiers, numbered 1, 2, and 3, of the repeating iterations are shown. For example, the stack may include: a first dielectric material 430-1, a second dielectric material 433-1, a semiconductor material 432-1, a third dielectric material 443-1, a fourth dielectric material 430-2, a fifth dielectric material 433-2, a second semiconductor material 432-2, a sixth dielectric material 443-2, a seventh dielectric material 430-3, an eighth dielectric material 433-3, a third semiconductor material 432-3, and a ninth dielectric material 443-3. As such, a stack may include: a first oxide material 430-1, a first nitride material 433-1, a first semiconductor material 432-1, a second nitride material 443-1, a second oxide material 430-2, a third nitride material 433-2, a second semiconductor material 432-2, a fourth nitride material 443-2, a third oxide material 430-3, a fifth nitride material 433-3, a third semiconductor material 432-3, and a sixth nitride material 443-3 in further repeating iterations. Embodiments, however, are not limited to this example and more or fewer repeating iterations may be included.

Figure 5A:
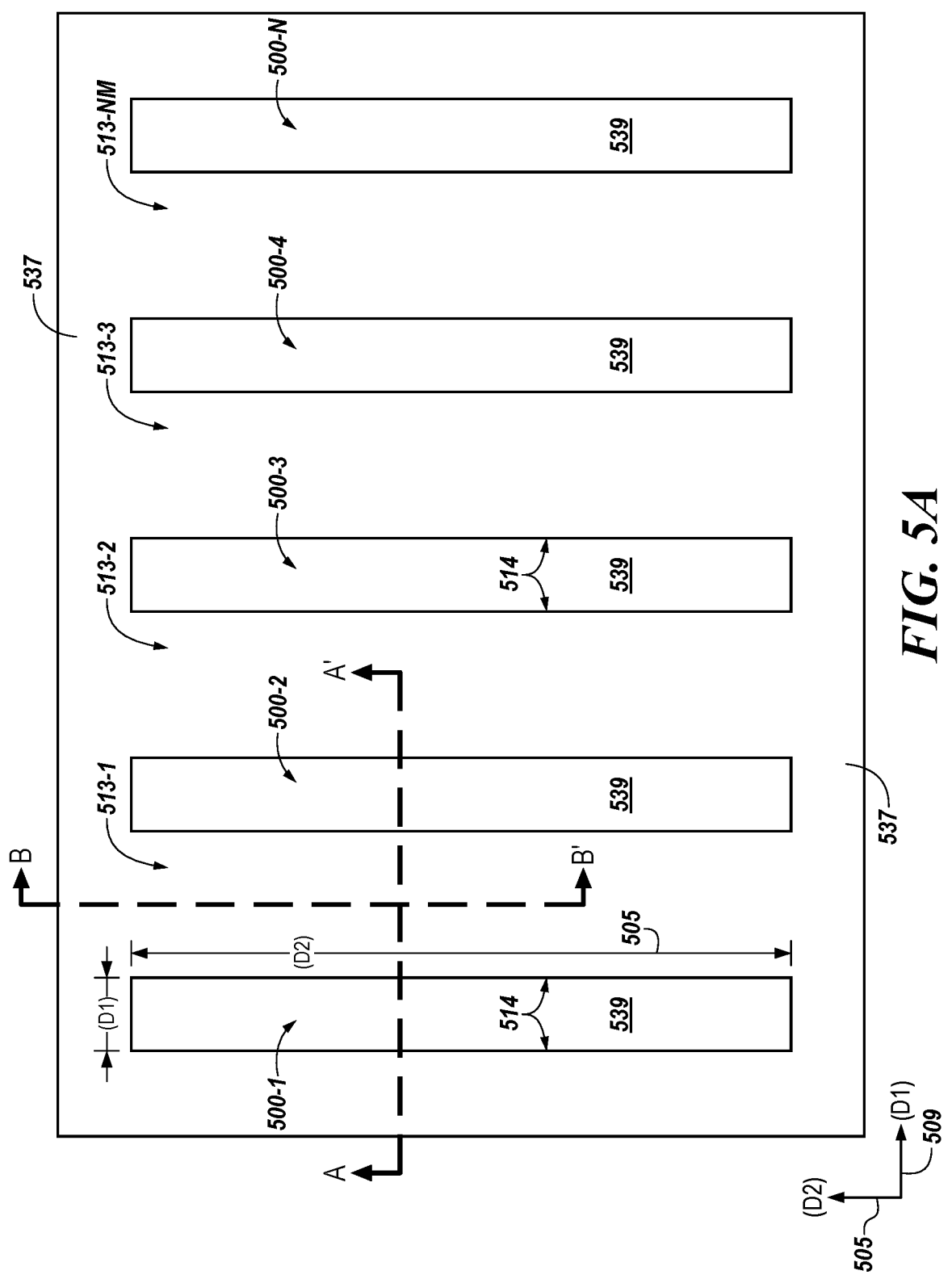
FIGS. 5A-5B illustrate an example method, at one stage of a semiconductor fabrication process, for forming arrays of vertically stacked memory cells, having vertical digit lines for semiconductor devices and horizontally oriented access lines, in accordance with a number of embodiments of the present disclosure.

FIG. 5A illustrates an example method, at one stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 500, having a first horizontal direction (D1) 509 and a second horizontal direction (D2) 505, through the vertical stack to the substrate. In one example, as shown in FIG. 5A, the plurality of first vertical openings 500 are extending predominantly in the second horizontal direction (D2) 505 and may form elongated vertical, pillar columns 513-1, 513-2, . . . , 513-M (collectively and/or independently referred to as 513), with sidewalls 514 in the vertical stack. The plurality of first vertical openings 500 may be formed using photolithographic techniques to pattern a photolithographic mask 537, e.g., to form a hard mask (HM), on the vertical stack prior to etching the plurality of first vertical openings 500. Similar semiconductor process techniques may be used at other points of the semiconductor fabrication process described herein.

The openings 500 may be filled with a dielectric material 539. In one example, a spin on dielectric process may be used to fill the openings 500. In one embodiment, the dielectric material 539 may be an oxide material. However, embodiments are not so limited.

Figure 5B:
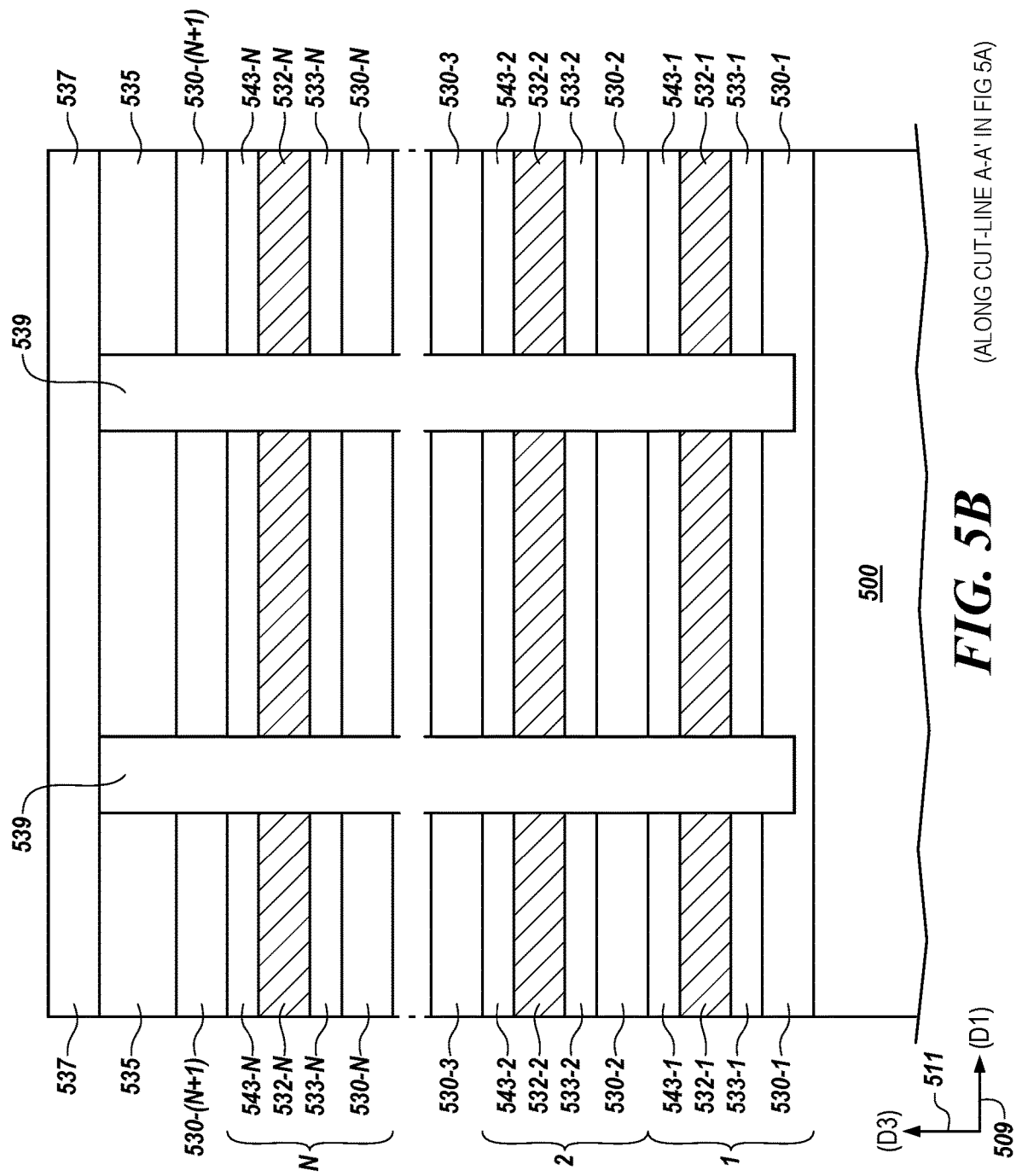

FIG. 5B is a cross sectional view, taken along cut-line A-A' in FIG. 5A, showing another view of the semiconductor structure at a particular time in the semiconductor fabrication process. The cross sectional view shown in FIG. 5B shows the repeating iterations of alternating layers of a first dielectric material, 530-1, 530-2, . . . , 530-N, a second dielectric material, 533-1, 533-2, . . . , 533-N, a semiconductor material, 532-1, 532-2, . . . , 532-N, and a third dielectric material, 543-1, 543-2, . . . , 543-N on a semiconductor substrate 500 to form the vertical stack, e.g. 401 as shown in FIG. 4.

As shown in FIG. 5B, a plurality of first vertical openings may be formed through the layers within the vertically stacked memory cells to expose vertical sidewalls in the vertical stack and form elongated vertical pillar columns 513 and then filled with a fourth dielectric material 539. The first vertical openings may be formed through the repeating iterations of the oxide material 530, the semiconductor material 532, and the nitride material 533. As such, the first vertical openings may be formed through the first oxide material 530-1, the first semiconductor material 532-1, the first nitride material 533-1, the second oxide material 530-2, the second semiconductor material 532-2, the second nitride material 533-2, the third oxide material 530-3, the third semiconductor material 532-3, and the third nitride material 533-3. Embodiments, however, are not limited to the vertical opening(s) shown in FIG. 5B. Multiple vertical openings may be formed through the layers of materials. The first vertical openings may be formed to expose vertical sidewalls in the vertical stack. The first vertical openings may extend in a second horizontal direction (D2) 505 to form elongated vertical, pillar columns 513 with first vertical sidewalls in the vertical stack and then filled with third dielectric 539.

As shown in FIG. 5B, a fourth dielectric material 539, such as an oxide or other suitable spin on dielectric (SOD), may be deposited in the first vertical openings, using a process such as CVD, to fill the first vertical openings. Fourth dielectric material 539 may also be formed from a silicon nitride ($Si_3N_4$) material. In another example, the fourth dielectric material 539 may include silicon oxynitride ($SiO_xN_y$), and/or combinations thereof. Embodiments are not limited to these examples. The plurality of first vertical openings may be formed using photolithographic techniques to pattern a photolithographic mask 537, e.g., to form a hard mask (HM), on the vertical stack prior to etching the plurality of first vertical openings. In one embodiment, hard mask 537 may be deposited over third dielectric material 539. In some embodiments, a subsequent photolithographic material 537, e.g., hard mask, may be deposited using CVD and planarized using CMP to cover and close the first vertical openings over the vertical stack and the previous hard mask 537. Similar semiconductor process techniques may be used at other points of the semiconductor fabrication process described herein.

Figure 6A:
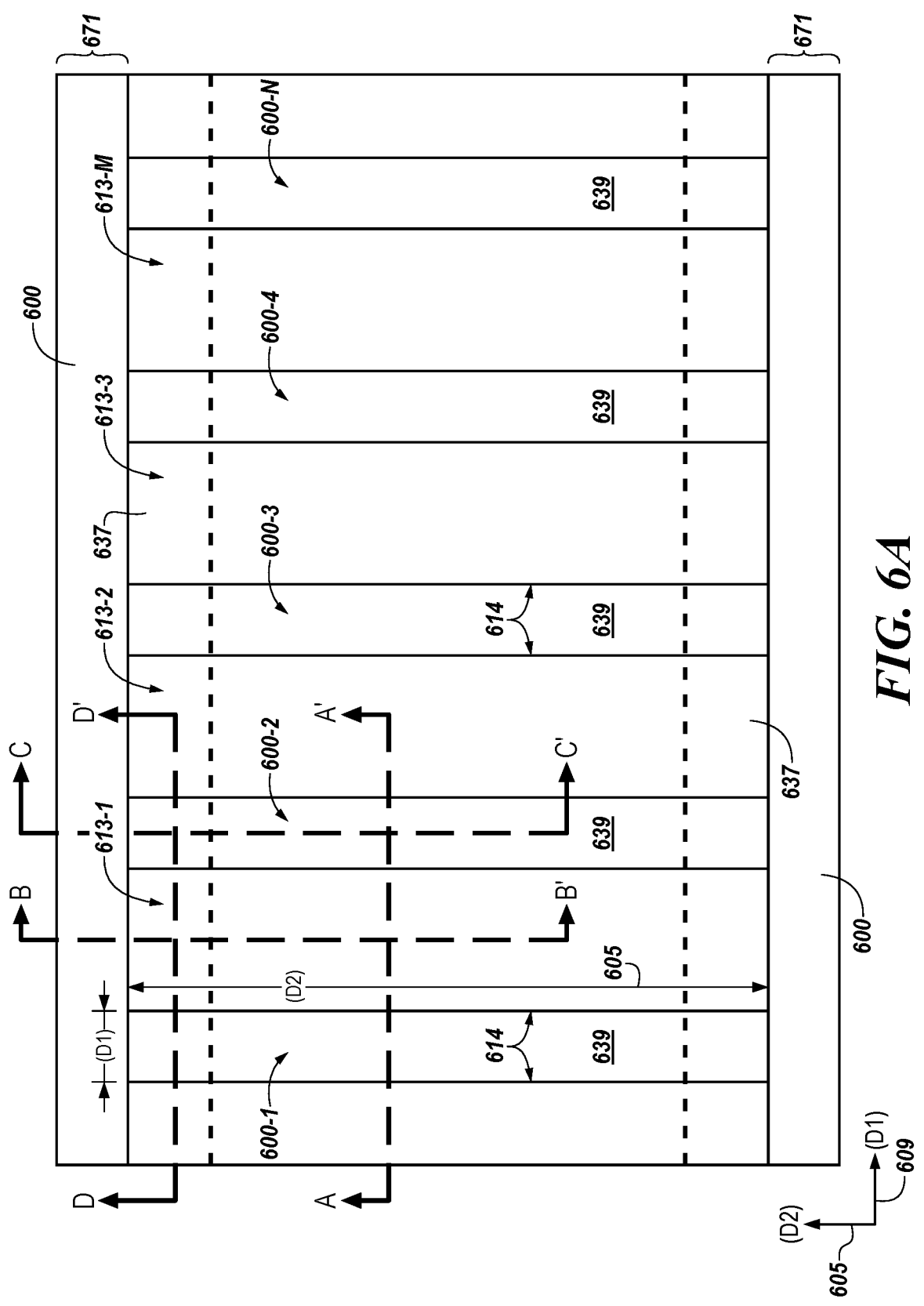
FIGS. 6A to 6E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 6A illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment shown in the example of FIG. 6A, the method comprises using an etchant process to form a plurality of first vertical openings 600, having a first horizontal direction (D1) 609 and a second horizontal direction (D2) 605, through the vertical stack to the substrate. In one example, as shown in FIG. 6A, the plurality of first vertical openings 600 are extending predominantly in the second horizontal direction (D2) 605 and may form elongated vertical, pillar columns 613 with sidewalls 614 in the vertical stack. The plurality of first vertical openings 600 may be formed using photolithographic techniques to pattern a photolithographic mask 637, e.g., to form a hard mask (HM), on the vertical stack prior to etching the plurality of first vertical openings 600.

Figure 6B:
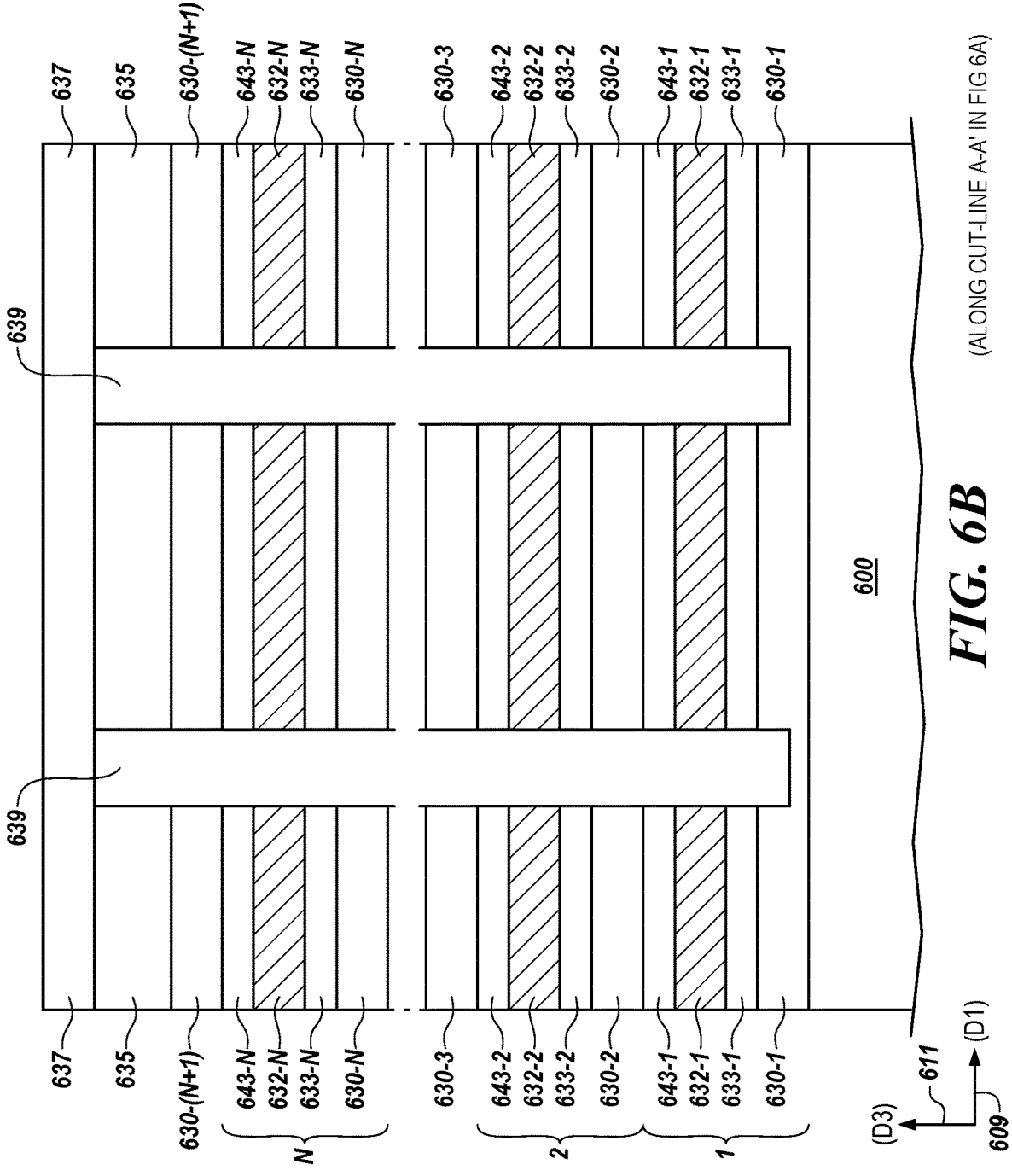

FIG. 6B is a cross sectional view, taken along cut-line A-A' in FIG. 6A, showing another view of the semiconductor structure at a particular time in the semiconductor fabrication process. The cross sectional view shown in FIG. 6B shows the repeating iterations of alternating layers of a first dielectric material, 630-1, 630-2, . . . , 630-N, a second dielectric material, 633-1, 633-2, . . . , 633-N a semiconductor material, 632-1, 632-2, . . . , 632-N, and a third dielectric material, 643-1, 643-2, . . . , 643-N, on a semiconductor substrate 600 to form the vertical stack, e.g. 401 as shown in FIG. 4.

As shown in FIG. 6B, a plurality of first vertical openings may be formed through the layers within the vertically stacked memory cells to expose vertical sidewalls in the vertical stack. The first vertical openings may be formed through the repeating iterations of the oxide material 630, the semiconductor material 632, and the nitride material 633. As such, the first vertical openings may be formed through the first oxide material 630-1, the first semiconductor material 632-1, the first nitride material 633-1, the second oxide material 630-2, the second semiconductor material 632-2, the second nitride material 633-2, the third oxide material 630-3, the third semiconductor material 632-3, and the third nitride material 633-3. Embodiments, however, are not limited to the vertical opening(s) shown in FIG. 6B. Multiple vertical openings may be formed through the layers of materials. The first vertical openings may be formed to expose vertical sidewalls in the vertical stack. The first vertical openings may extend in a second horizontal direction (D2) 605 to form elongated vertical, pillar columns with first vertical sidewalls in the vertical stack.

As shown in FIG. 6B, a fourth dielectric material 639, such as an oxide or other suitable spin on dielectric (SOD), may be deposited in the first vertical openings, using a process such as CVD, to fill the first vertical openings. A photolithographic material 637, e.g., hard mask, may be deposited using CVD and planarized using chemical mechanical planarization (CMP) to cover and close the first vertical openings over the vertical stack. Similar semiconductor process techniques may be used at other points of the semiconductor fabrication process described herein.

Figure 6C:
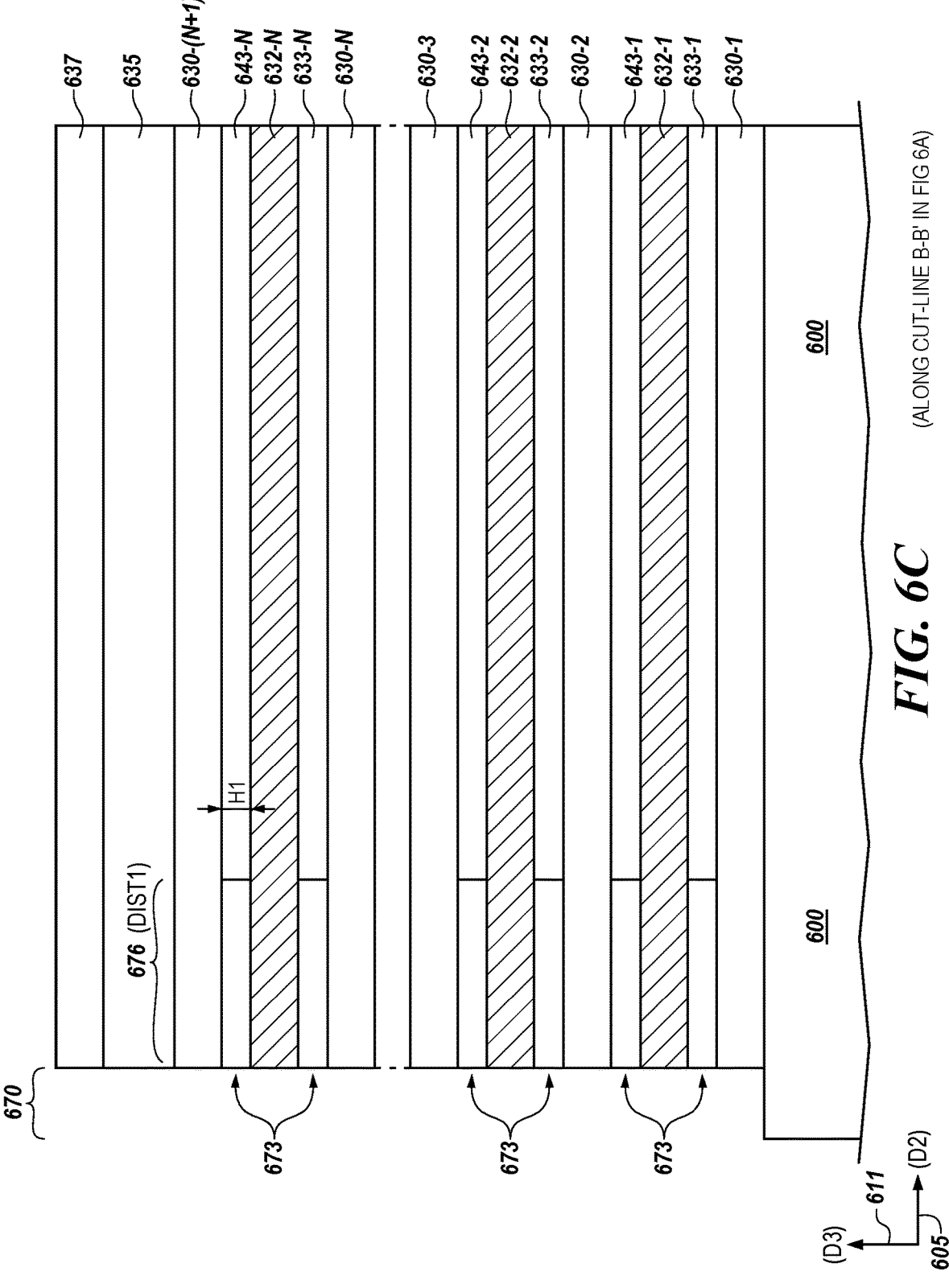

FIG. 6C is a cross-sectional view, at another stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure. FIG. 6C illustrates a cross sectional view, taken along cut-line B-B' in FIG. 6A.

An etchant may be flowed into the second vertical opening 670 to selectively etch a portion of the second dielectric material 633 and third dielectric material 643. For example, an etchant may be flowed into the second vertical opening 670 to selectively etch the nitride material 633. The etchant may target all iterations of the second dielectric material 633 and third dielectric material 643 within the stack. As such, the etchant may target the first nitride material 633-1, the second nitride material 633-2, and the third nitride material 633-3 within the stack.

The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) may be utilized. As another example, a dry etch chemistries of $O_2$ or of $O_2$ and nitrogen ($N_2$) may be used to selectively etch the second dielectric material 633 and third dielectric material 643. Alternatively, or in addition, a selective etch to remove the second dielectric material 633 and third dielectric material 643 may comprise a selective etch chemistry of phosphoric acid ($H_3PO_4$) or hydrogen fluoride (HF) and/or dissolving the second dielectric material 633 and third dielectric material 643 using a selective solvent, among other possible etch chemistries or solvents.

The selective etchant process may etch the nitride material 633 to form a first horizontal opening 673. The selective etchant process may be performed such that the first horizontal opening 673 has a length or depth (DIST 1) a first distance 676 from the second vertical opening 670. The first distance (DIST 1) 676 may be a further distance than used to form a first source/drain region or a first channel region. The second dielectric material 633 and third dielectric material 643 may be etched a first distance (DIST 1) 676 in a range of approximately fifty (50) to two hundred and fifty (250) nanometers (nm) back from the second vertical opening. The first distance (DIST 1) 676 may be controlled by controlling time, composition of etchant gas, and etch rate of a reactant gas flowed into the second vertical opening 670, e.g., rate, concentration, temperature, pressure, and time parameters. As such, the nitride material 633 may be etched a first distance 676 from the vertical opening. The selective etch may be isotropic, but selective to the second dielectric material 633 and third dielectric material 643, substantially stopping on the first dielectric material 630 and the semiconductor material. Thus, in one example embodiment, the selective etchant process may remove substantially all of the nitride material 633 from a top surface of the semiconductor material 632 to a bottom surface of the first dielectric material, e.g., oxide material, in a layer above while etching horizontally a first distance (DIST 1) 676 from the second vertical opening 670 adjacent a first region of the semiconductor material 632. In this example the horizontal opening 673 will have a height (H1) substantially equivalent to and be controlled by a thickness, to which the second dielectric layer 633 and third dielectric material 643, e.g., nitride material, were deposited. Embodiments, however, are not limited to this example. As described herein, the selective etchant process may etch the nitride material 633 to a first distance (DIST 1) 676 and to a height (H1).

Figure 6D:
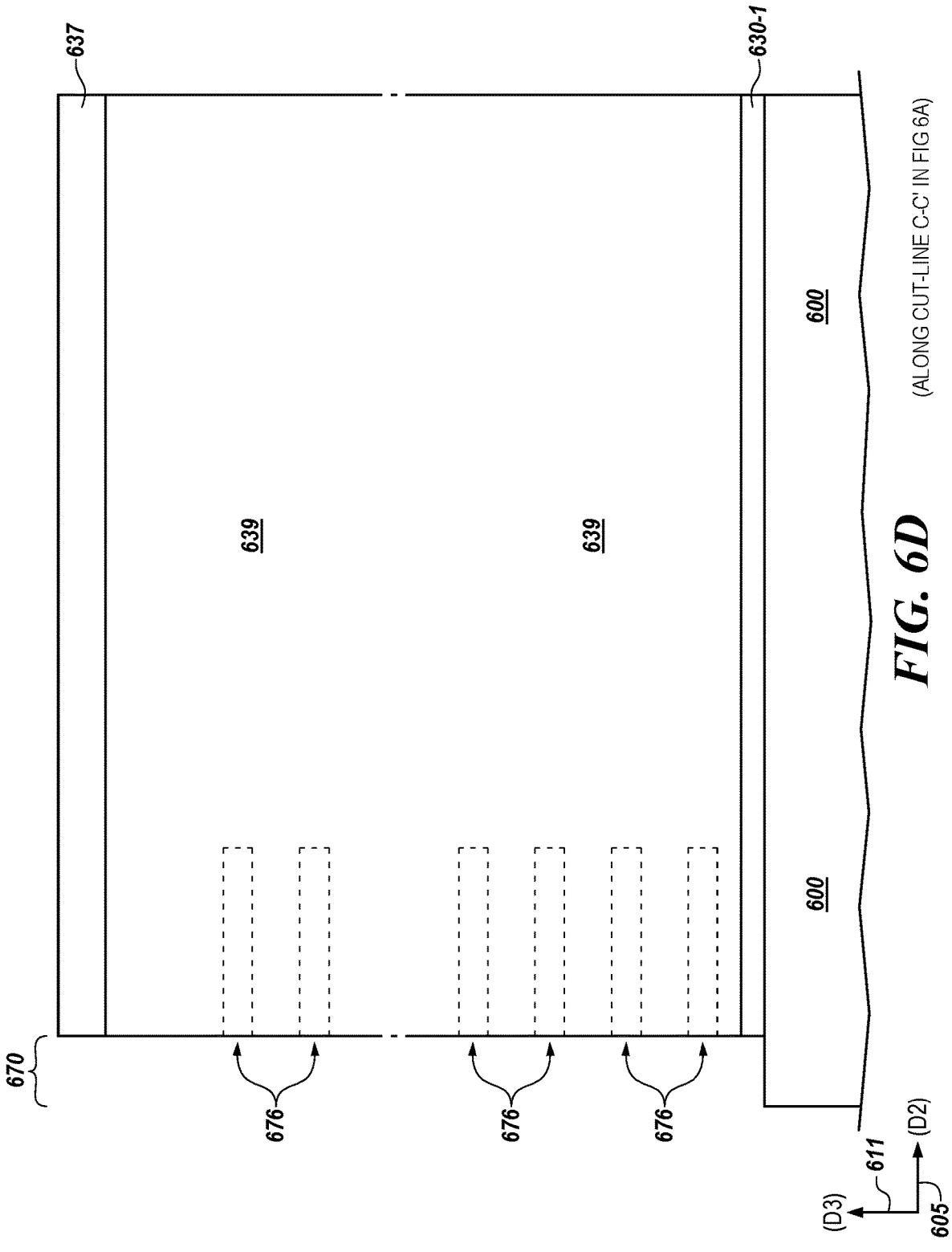

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second horizontal direction (D2) 605, outside of a region for the horizontally oriented access devices and horizontally oriented storage nodes.

Figure 6E:
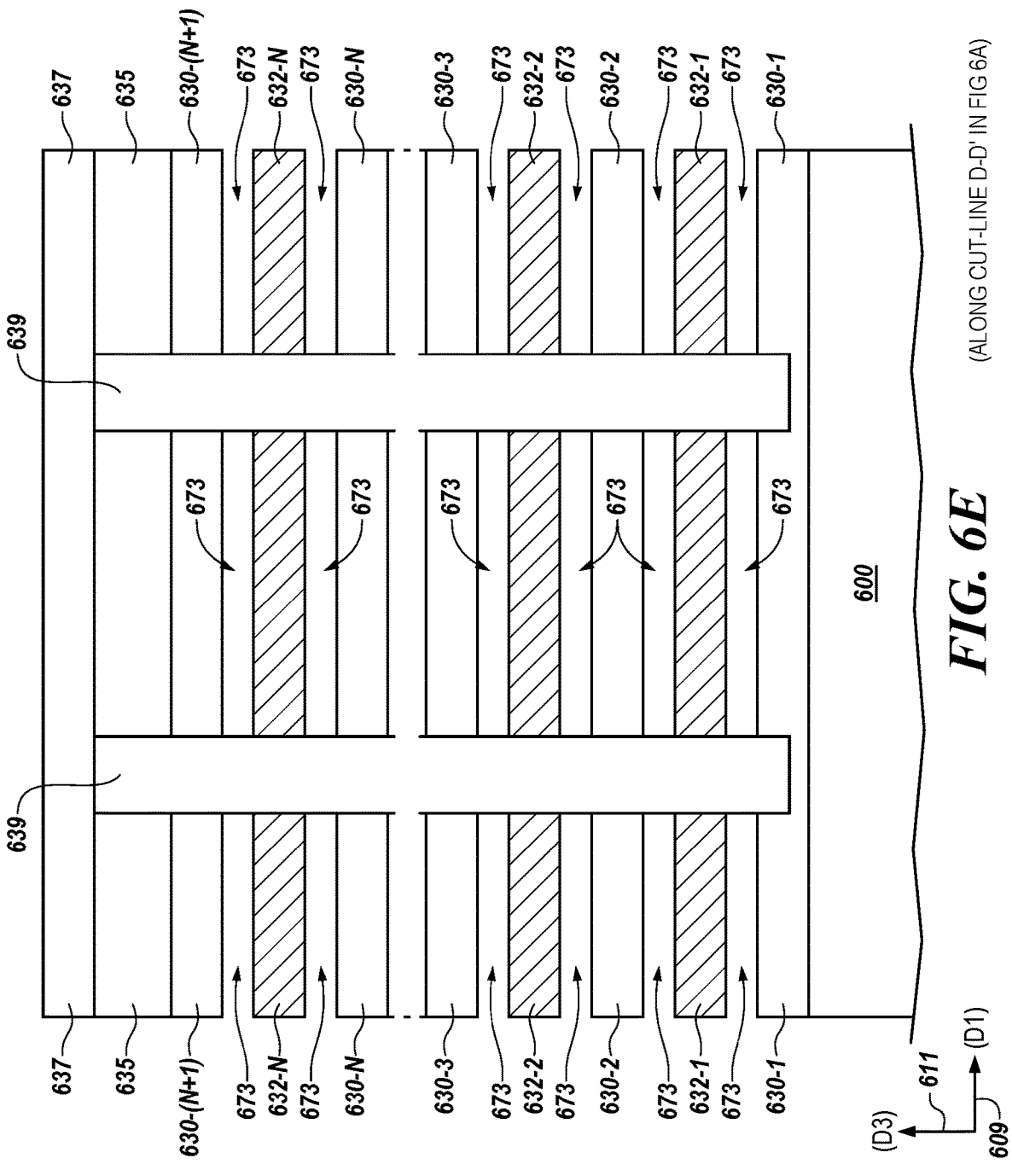

In FIG. 6E, the fourth dielectric material 639, such as an oxide or other suitable spin on dielectric (SOD), may be deposited in the first vertical openings, using a process such as CVD. The fourth dielectric material 639 is shown spaced along a first direction (D1), extending into and out from the plane of the drawings sheet, for a three dimensional array of vertically oriented memory cells. A hard mask 637, which may be deposited using CVD and planarized using chemical mechanical planarization (CMP), may be seen over the fourth dielectric material 639. Similar semiconductor process techniques may be used at other points of the semiconductor fabrication process described herein.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-N and a semiconductor material, 632-1, 632-2, . . . , 632-N, intersecting across the plurality of fourth dielectric fill material 639.

In this cross sectional view, the etched second dielectric material 633-1, 633-2, . . . , 633-N and third dielectric material, 643-1, 643-2, . . . , 643-N may be seen such that the second dielectric material 633-1, 633-2, . . . , 633-N and third dielectric material, 643-1, 643-2, . . . , 643-N may seem completely removed by selective etching to form first horizontal opening 673. In FIG. 6E, the fourth dielectric fill material 639 is shown separating the space between the first horizontal openings 673, which can be spaced along a first direction (D1) 609 and stacked vertically in arrays extending in the third direction (D3) 611 in the three dimensional (3D) memory. A hard mask 637, may be deposited using CVD and planarized using chemical mechanical planarization (CMP) to cover and close the first vertical openings over the vertical stack.

Figure 7A:
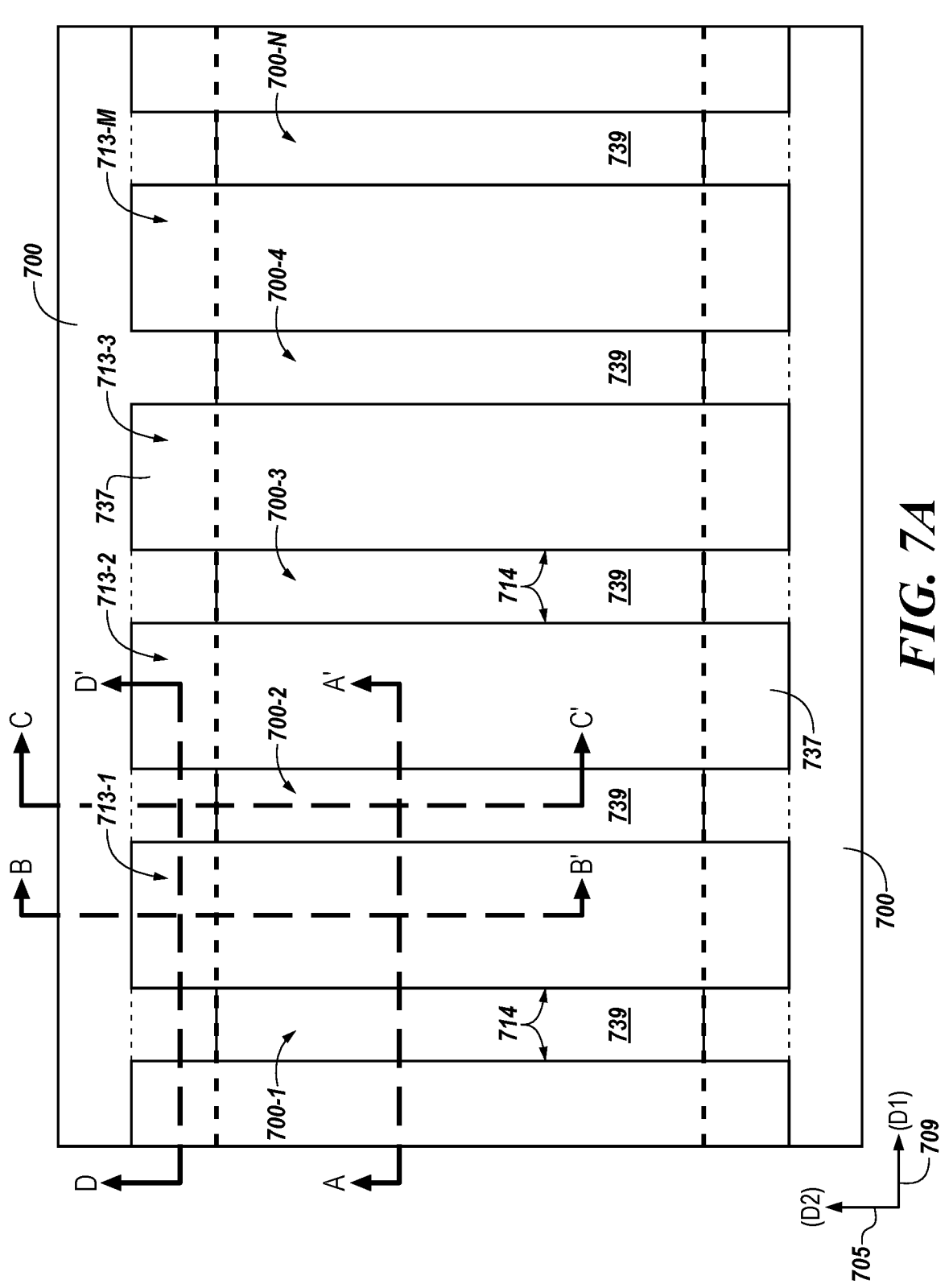
FIGS. 7A to 7E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 7A illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment shown in FIG. 7A, the method comprises using an etchant process to etch through the fourth dielectric material 739 that filled in the plurality of first vertical openings 700, having a first horizontal direction (D1) 709 and a second horizontal direction (D2) 705, through the vertical stack to the substrate. The plurality of first vertical openings 700 may be viewed within the hard mask 737 covering the working surface of the vertical semiconductor stack. The fourth dielectric material 739 may be etched to a height within the hard mask 737.

Figure 7B:
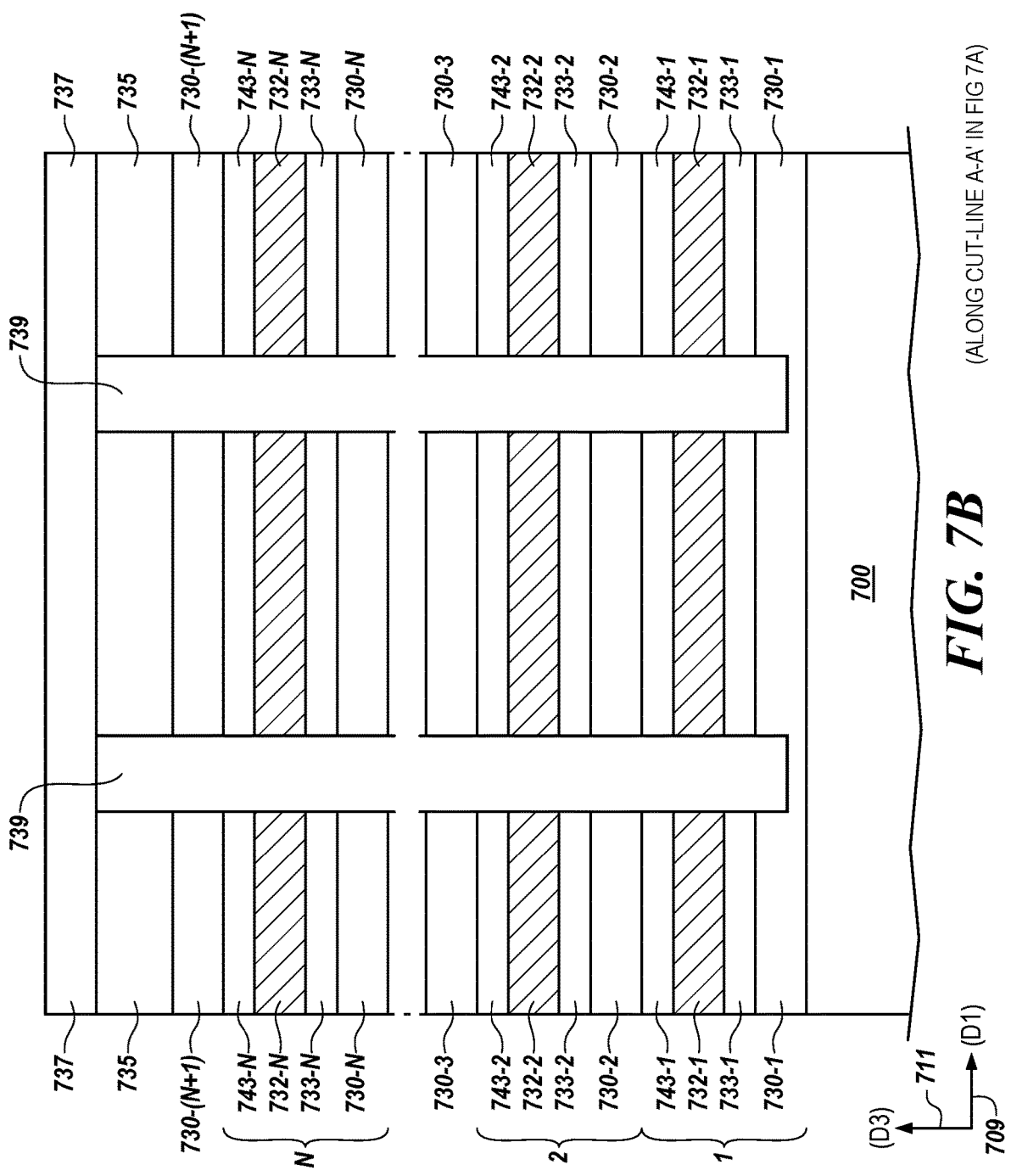

FIG. 7B is a cross sectional view, taken along cut-line A-A' in FIG. 7A, showing another view of the semiconductor structure at a particular time in the semiconductor fabrication process. The cross sectional view shown in FIG. 7B shows the repeating iterations of alternating layers of a first dielectric material, 730-1, 730-2, . . . , 730-N, a second dielectric material, 733-1, 733-2, . . . , 733-N a semiconductor material, 732-1, 732-2, . . . , 732-N, and a third dielectric material, 743-1, 743-2, . . . , 743-N, on a semiconductor substrate 700.

As shown in FIG. 7B, a plurality of first vertical openings may be formed through the layers within the vertically stacked memory cells to expose vertical sidewalls in the vertical stack. The first vertical openings may be formed through the repeating iterations of the oxide material 730, the semiconductor material 732, and the nitride material 733. As such, the first vertical openings may be formed through the first oxide material 730-1, the first semiconductor material 732-1, the first nitride material 733-1, the second oxide material 730-2, the second semiconductor material 732-2, the second nitride material 733-2, the third oxide material 730-3, the third semiconductor material 732-3, and the third nitride material 733-3. Embodiments, however, are not limited to the vertical opening(s) shown in FIG. 7B. Multiple vertical openings may be formed through the layers of materials. The first vertical openings may be formed to expose vertical sidewalls in the vertical stack. The first vertical openings may extend in a second horizontal direction (D2) 705 to form elongated vertical, pillar columns with first vertical sidewalls in the vertical stack.

As shown in FIG. 7B, a fourth dielectric material 739, such as an oxide or other suitable spin on dielectric (SOD), may be viewed in the first vertical openings, filling the first vertical openings. A hard mask 737 may be deposited to cover and close the first vertical openings over the vertical stack. Similar semiconductor process techniques may be used at other points of the semiconductor fabrication process described herein.

Figure 7C:
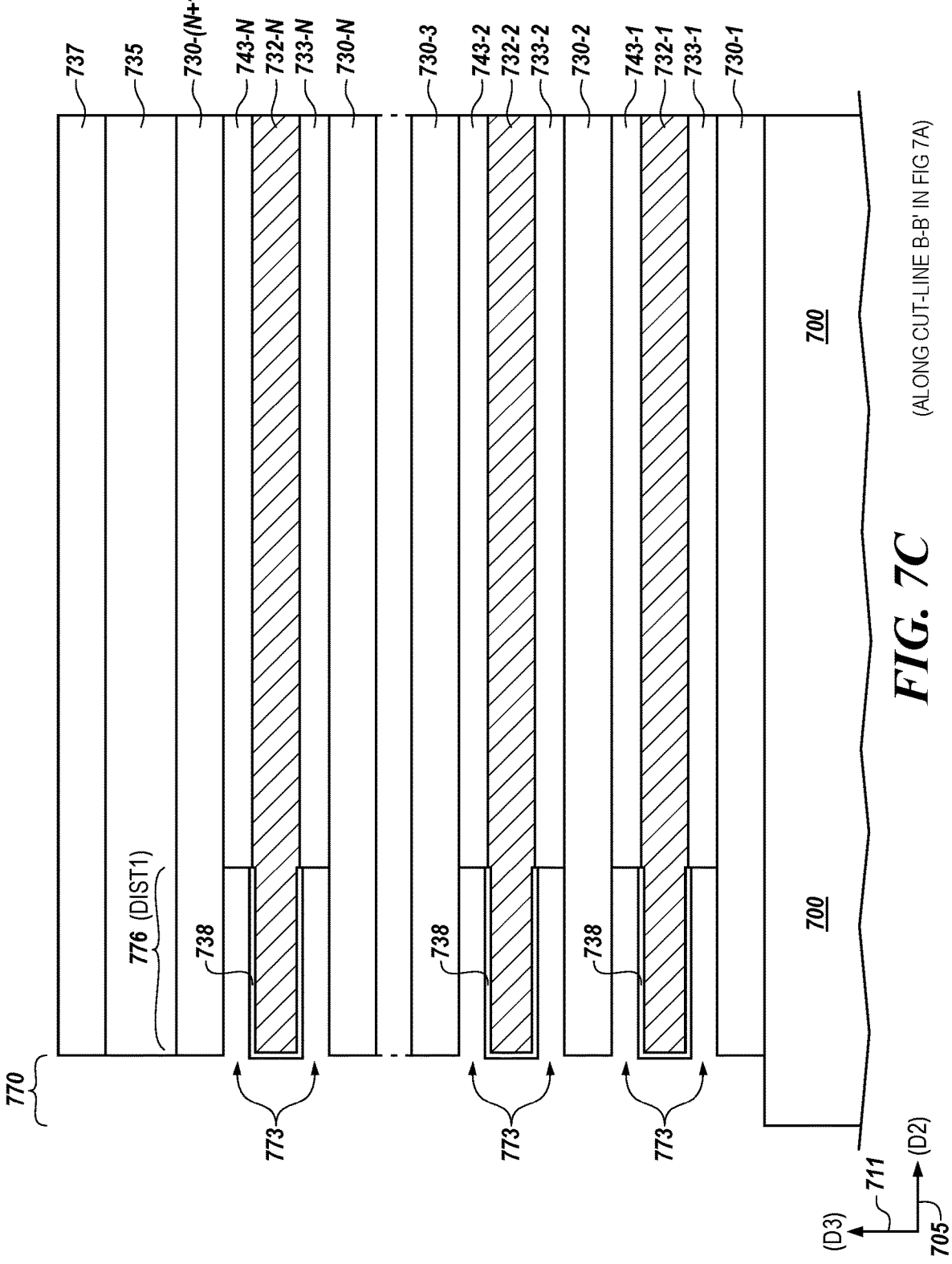

FIG. 7C is a cross-sectional view, at another stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure. FIG. 7C illustrates a cross sectional view, taken along cut-line B-B' in FIG. 7A.

The second dielectric material 733 and third dielectric material 743 may be selectively etched in the second horizontal direction (D2) 705 to form a plurality of first horizontal openings 773. An etchant may be flowed into the second vertical opening 770 to selectively etch a portion of the second dielectric material 733 and third dielectric material 743. As such, the etchant may target the first nitride material 733-1, the second nitride material 733-2, and the third nitride material 733-3 within the stack. The selective etchant process may etch the nitride material 733 to form a first horizontal opening 773. The selective etchant process may etch the nitride material 733 to a first distance (DIST 1) 776 and to a height (H1).

A gate dielectric material 738 may be deposited in the plurality of first horizontal openings 773 created by the etched second dielectric material 733. The gate dielectric material 738 may be conformally deposited all around the semiconductor material 732. A gate dielectric material 738 may be conformally deposited in the plurality of first horizontal openings 773 using a chemical vapor deposition (CVD) process, plasma enhanced CVD (PECVD), atomic layer deposition (ALD), or other suitable deposition process, to cover a bottom surface and the vertical sidewalls of the plurality of first horizontal openings 773. In another embodiment, gate dielectric material 738 may be thermally grown onto a surface of semiconductor material 732. By way of example, and not by way of limitation, the gate dielectric 738 may comprise a silicon dioxide (SiO$_2$) material, aluminum oxide (Al$_2$O$_3$) material, high dielectric constant (k), e.g., high-k, dielectric material, and/or combinations thereof.

Figure 7D:
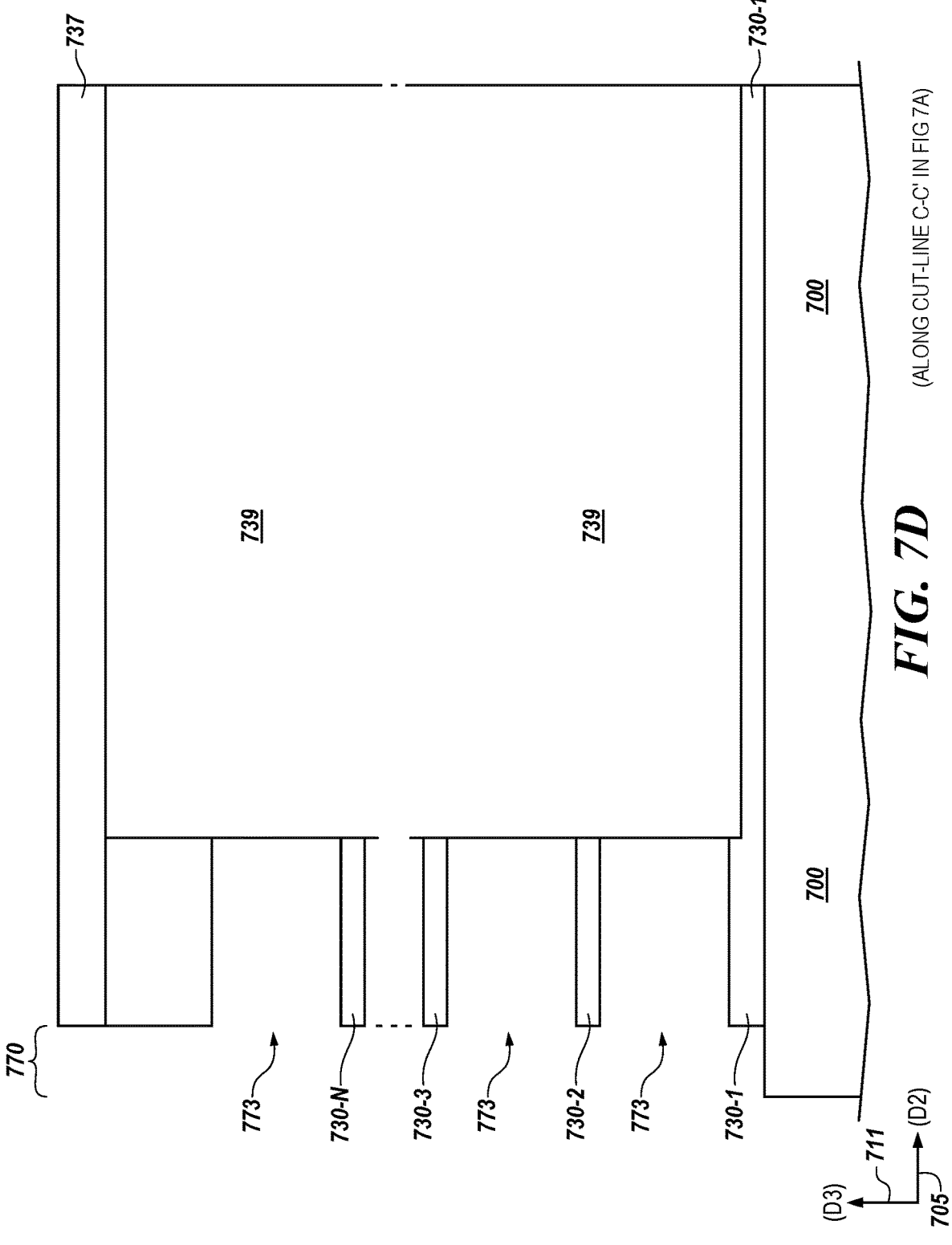

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second horizontal direction (D2) 705, outside of a region for the horizontally oriented access devices and horizontally oriented storage nodes.

In FIG. 7D, the fourth dielectric material 739 is shown filling the space along a first direction (D1), extending into and out from the plane of the drawings sheet, for a three dimensional array of vertically oriented memory cells. A portion of the fourth dielectric material 739 may be etched in a horizontal direction to view repeating iterations of alternating layers of a first dielectric material, 730-1, 730-2, . . . , 730-N and a semiconductor material, 732-1, 732-2, . . . , 732-N. A lateral punch may be applied to the dielectric material 739 to etch through. The cross sectional view shown in FIG. 7D is illustrated, right to left in the plane of the drawing sheet, extending in the first direction (D1) 709 along an axis of the repeating iterations of alternating layers of a first dielectric material, 730-1, 730-2, . . . , 730-N and a semiconductor material, 732-1, 732-2, . . . , 732-N, intersecting the fourth dielectric fill material 739. The hard mask 737 over the repeating iterations of alternating layers of a first dielectric material, 730-1, 730-2, . . . , 730-N and a semiconductor material, 732-1, 732-2, . . . , 732-N may be viewed over fourth dielectric material 739.

Figure 7E:
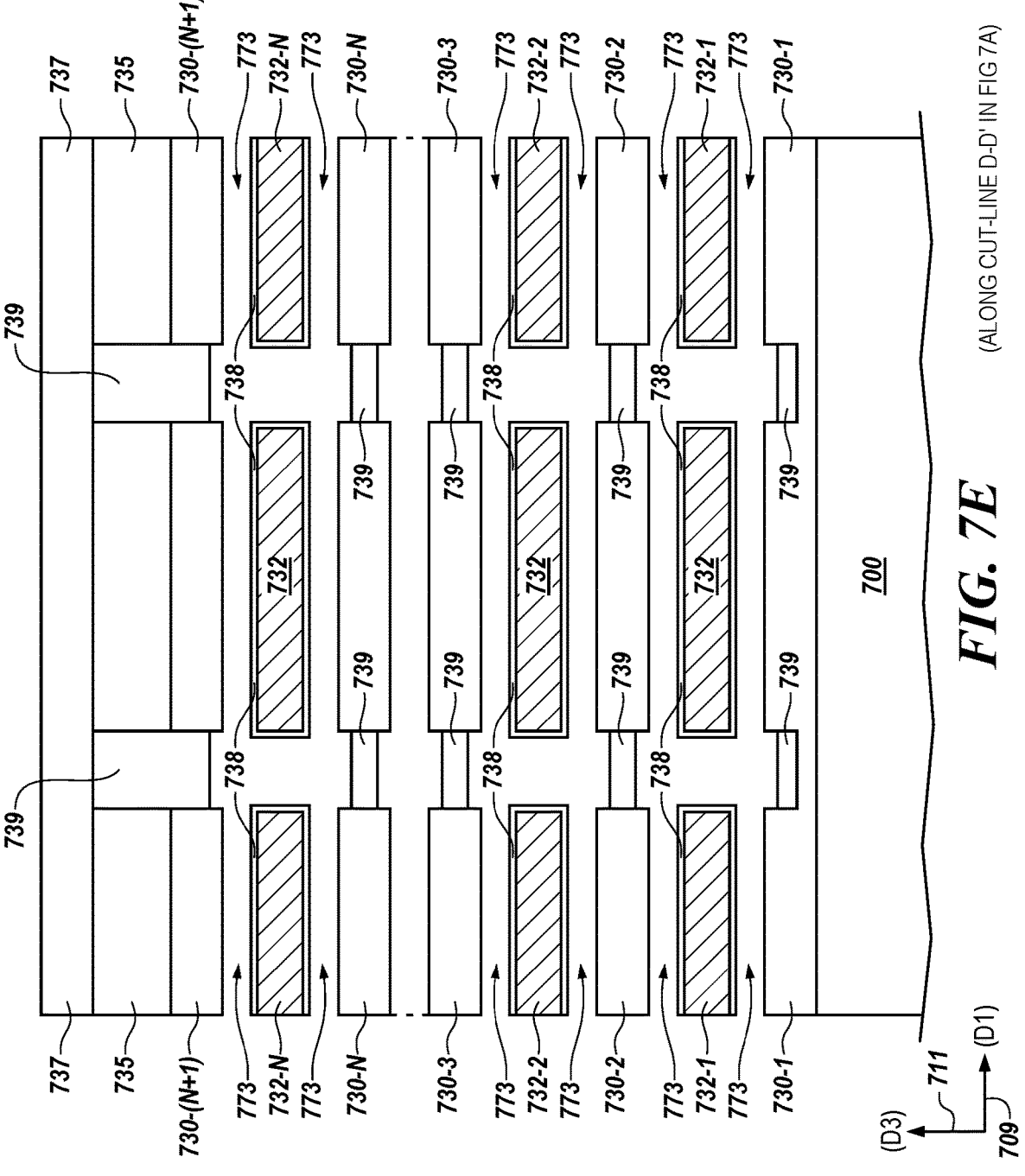

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a first dielectric material, 730-1, 730-2, . . . , 730-N and a semiconductor material, 732-1, 732-2, . . . , 732-N, intersecting across the plurality of fourth dielectric fill material 739.

In FIG. 7E, the fourth dielectric fill material 739 is shown separating the space between the first horizontal openings

773 and can be spaced along a first direction (D1) 709 and stacked vertically in arrays extending in the third direction (D3) 711 in the three dimensional (3D) memory. A portion of the fourth dielectric material 739 may be etched vertically. A portion of the fourth dielectric fill 739 within the plurality of first vertical openings may be removed. The openings created by the etched fourth dielectric material 739 may form continuous second horizontal openings 779 that extend in the first horizontal direction 709. A hard mask 737, covering the first vertical openings over the vertical stack may be etched in the same manner as the fourth dielectric material 739.

Figure 8A:
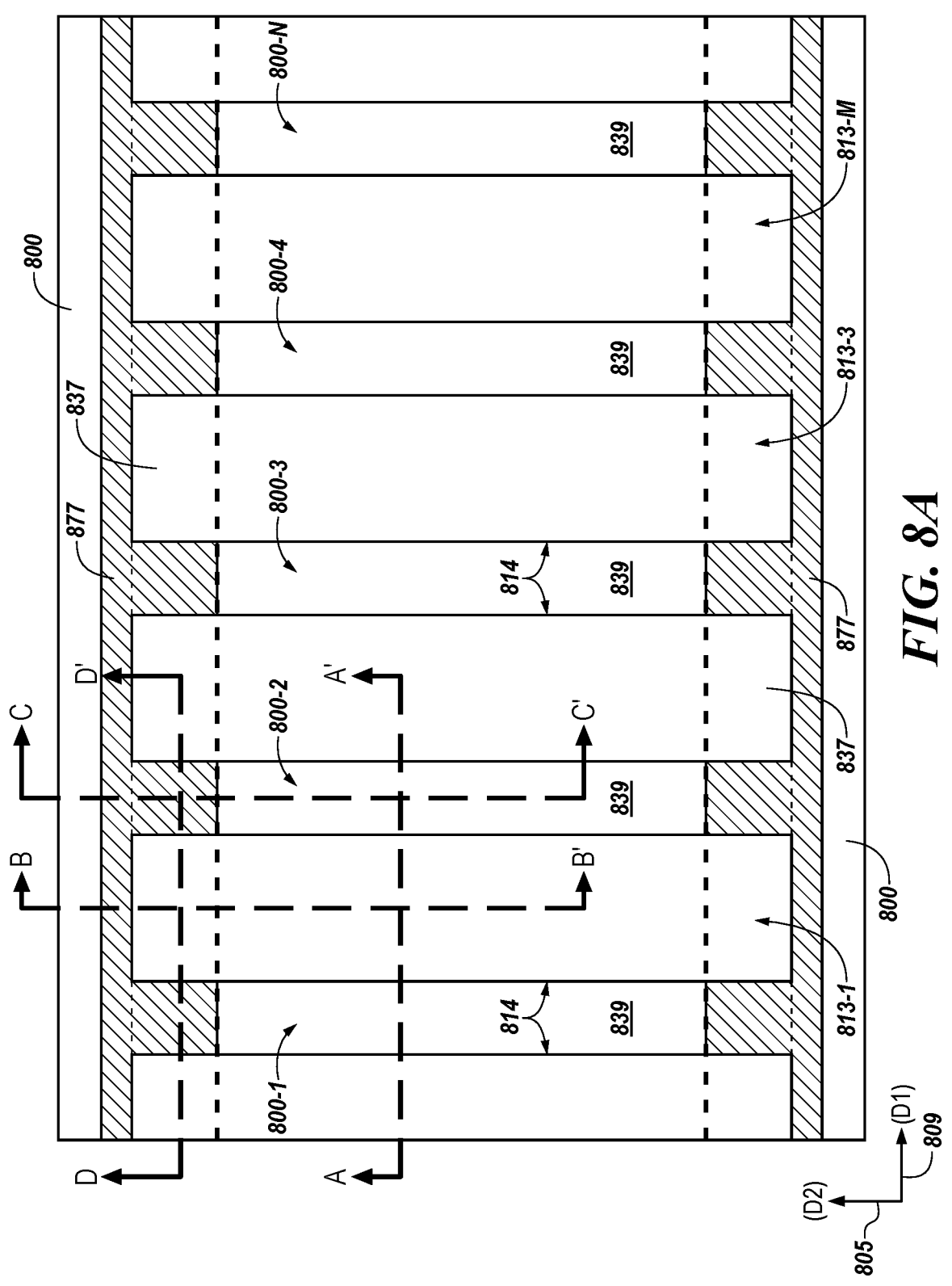
FIGS. 8A to 8E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 8A illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment shown in FIG. 8A, the method comprises using an etchant process to etch through the fourth dielectric material 839 that filled in the plurality of first vertical openings 800, having a first horizontal direction (D1) 809 and a second horizontal direction (D2) 805, through the vertical stack to the substrate. The plurality of first vertical openings 800 may be viewed within the hard mask 837 covering the working surface of the vertical semiconductor stack. The fourth dielectric material 839 may be etched to a height between cut-line A-A' and cut-line D-D' within the hard mask 837. A first conductive material 877 may be deposited above the plurality of first vertical openings 800.

Figure 8B:
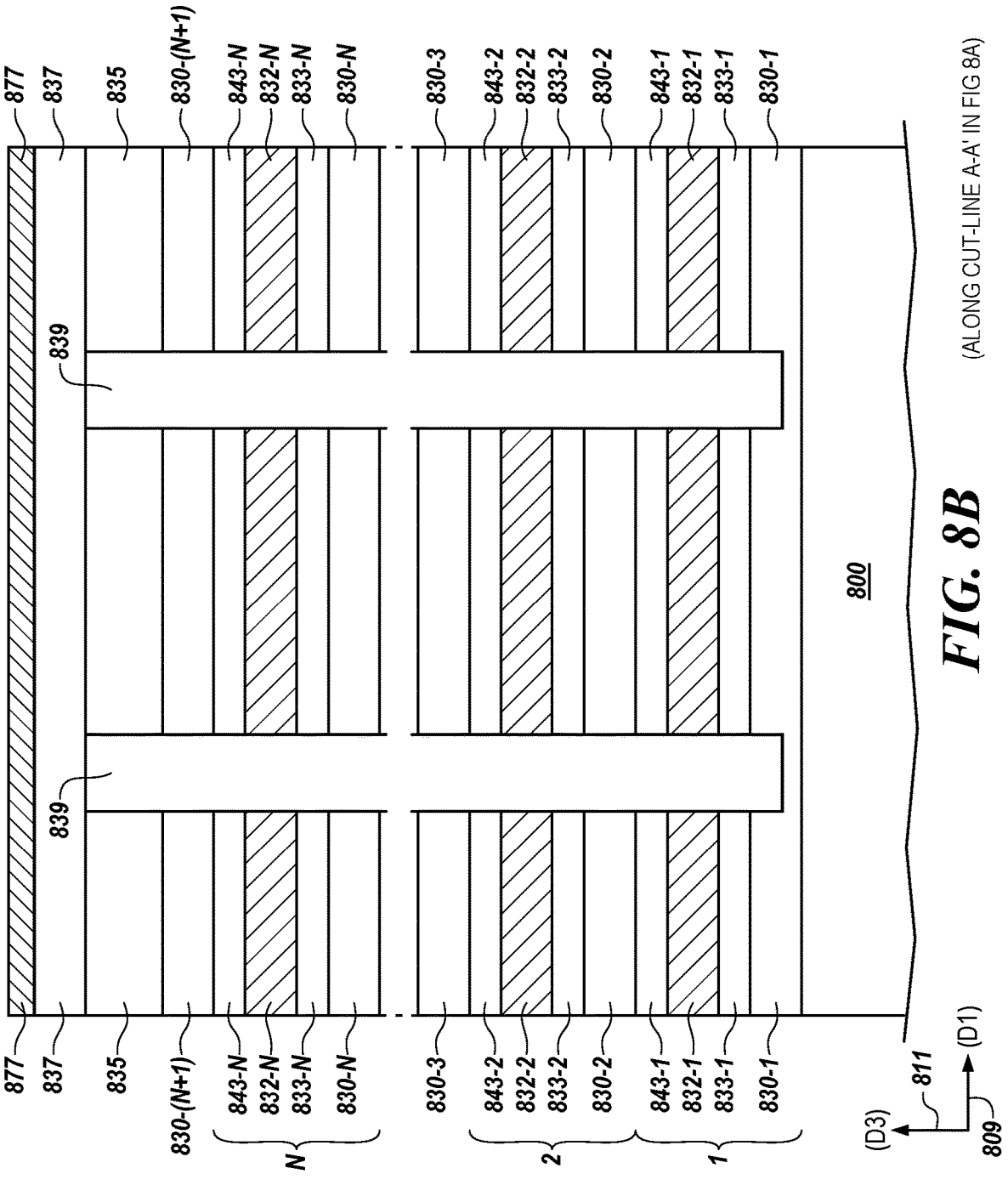

FIG. 8B is a cross sectional view, taken along cut-line A-A' in FIG. 8A, showing another view of the semiconductor structure at a particular time in the semiconductor fabrication process. The cross sectional view shown in FIG. 8B shows the repeating iterations of alternating layers of a first dielectric material, 830-1, 830-2, . . . , 830-N, a second dielectric material, 833-1, 833-2, . . . , 833-N a semiconductor material, 832-1, 832-2, . . . , 832-N, and a third dielectric material, 843-1, 843-2, . . . , 843-N, on a semiconductor substrate 800.

As shown in FIG. 8B, a plurality of first vertical openings may be formed through the layers within the vertically stacked memory cells to expose vertical sidewalls in the vertical stack. The first vertical openings may be formed through the repeating iterations of the oxide material 830, the semiconductor material 832, and the nitride material 833. As such, the first vertical openings may be formed through the first oxide material 830-1, the first semiconductor material 832-1, the first nitride material 833-1, the second oxide material 830-2, the second semiconductor material 832-2, the second nitride material 833-2, the third oxide material 830-3, the third semiconductor material 832-3, and the third nitride material 833-3. Embodiments, however, are not limited to the vertical opening(s) shown in FIG. 8B. Multiple vertical openings may be formed through the layers of materials. The first vertical openings may be formed to expose vertical sidewalls in the vertical stack. The first vertical openings may extend in a second horizontal direction (D2) 805 to form elongated vertical, pillar columns with first vertical sidewalls in the vertical stack.

As shown in FIG. 8B, a fourth dielectric material 839, such as an oxide or other suitable spin on dielectric (SOD), may be viewed in the first vertical openings, filling the first vertical openings. A first conductive material 877 may be deposited over hard mask 837 covering the first vertical openings. Similar semiconductor process techniques may be used at other points of the semiconductor fabrication process described herein.

Figure 8C:
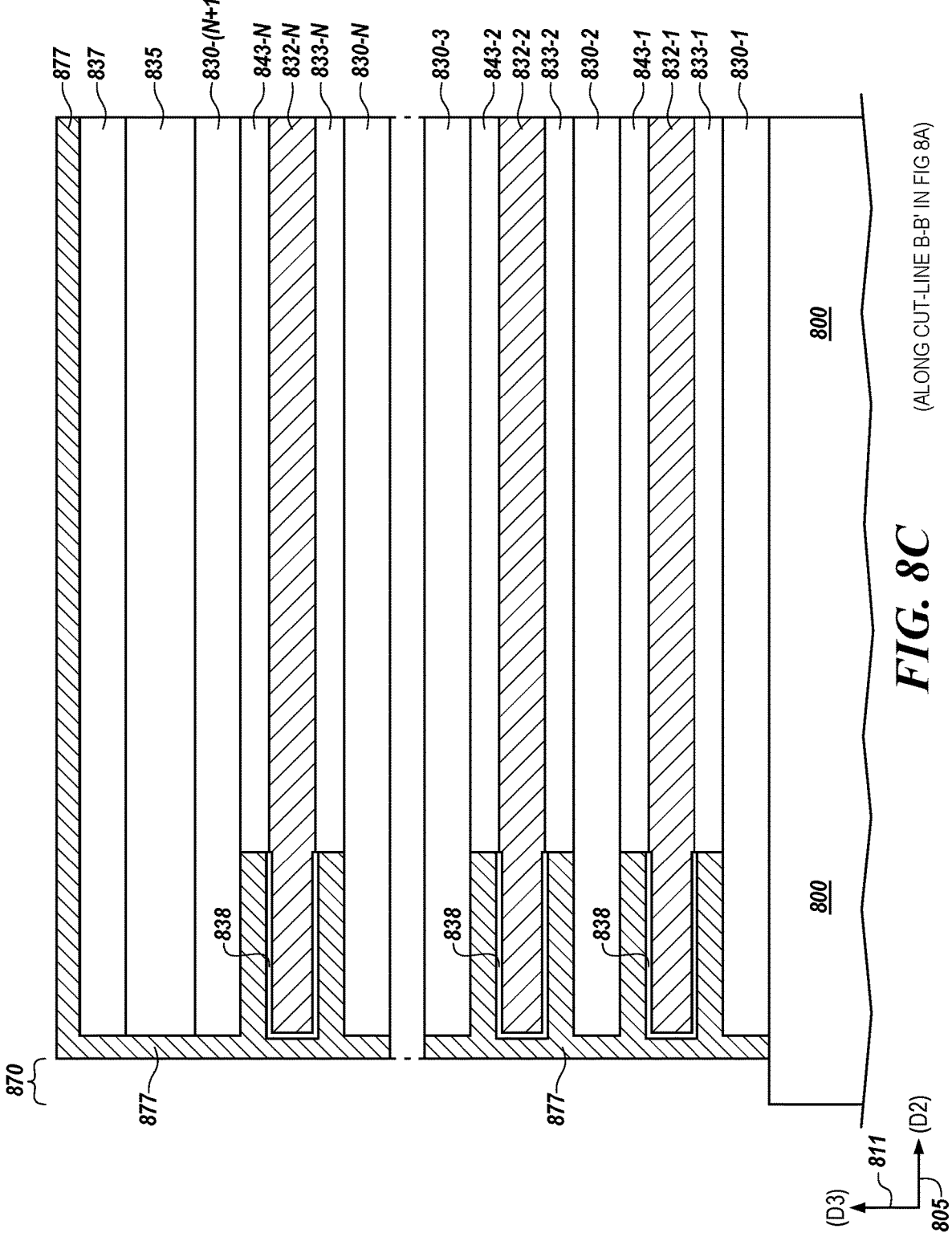

FIG. 8C is a cross-sectional view, at another stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure. FIG. 8C illustrates a cross sectional view, taken along cut-line B-B' in FIG. 8A.

A first conductive material, 877-1, 877-2, . . . , 877-N (collectively referred to as first conductive material 877), may be deposited on the gate dielectric material 838 all around the semiconductor material 832 and may be so entwined as to be indistinguishable. The first conductive material 877 may be deposited fully around every surface of the semiconductor material, to form gate all around (GAA) gate structures, at the channel region of the semiconductor material. The gates opposing the channel regions provide a subthreshold voltage (sub-Vt) slope in a range of approximately 45 to 100 millivolts per decade (mV/dec).

The first conductive material 877 may be conformally deposited into a portion of the second vertical opening 870, using a chemical vapor deposition (CVD) process, plasma enhanced CVD (PECVD), atomic layer deposition (ALD), or other suitable deposition process, such that the first conductive material 877 may also be deposited into the first horizontal opening 873. The first conductive material 877 may be entwined with a gate dielectric material 838.

In some embodiments, the first conductive material, 877-1, 877-2, . . . , 877-N, may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof as also described in FIG. 3. The first conductive material 877 entwined with the gate dielectric material 838 may form horizontally oriented access lines opposing a channel region of the semiconductor material, such as shown as access lines 103-1, 103-2, . . . , 103-Q (which also may be referred to as wordlines).

Figure 8D:
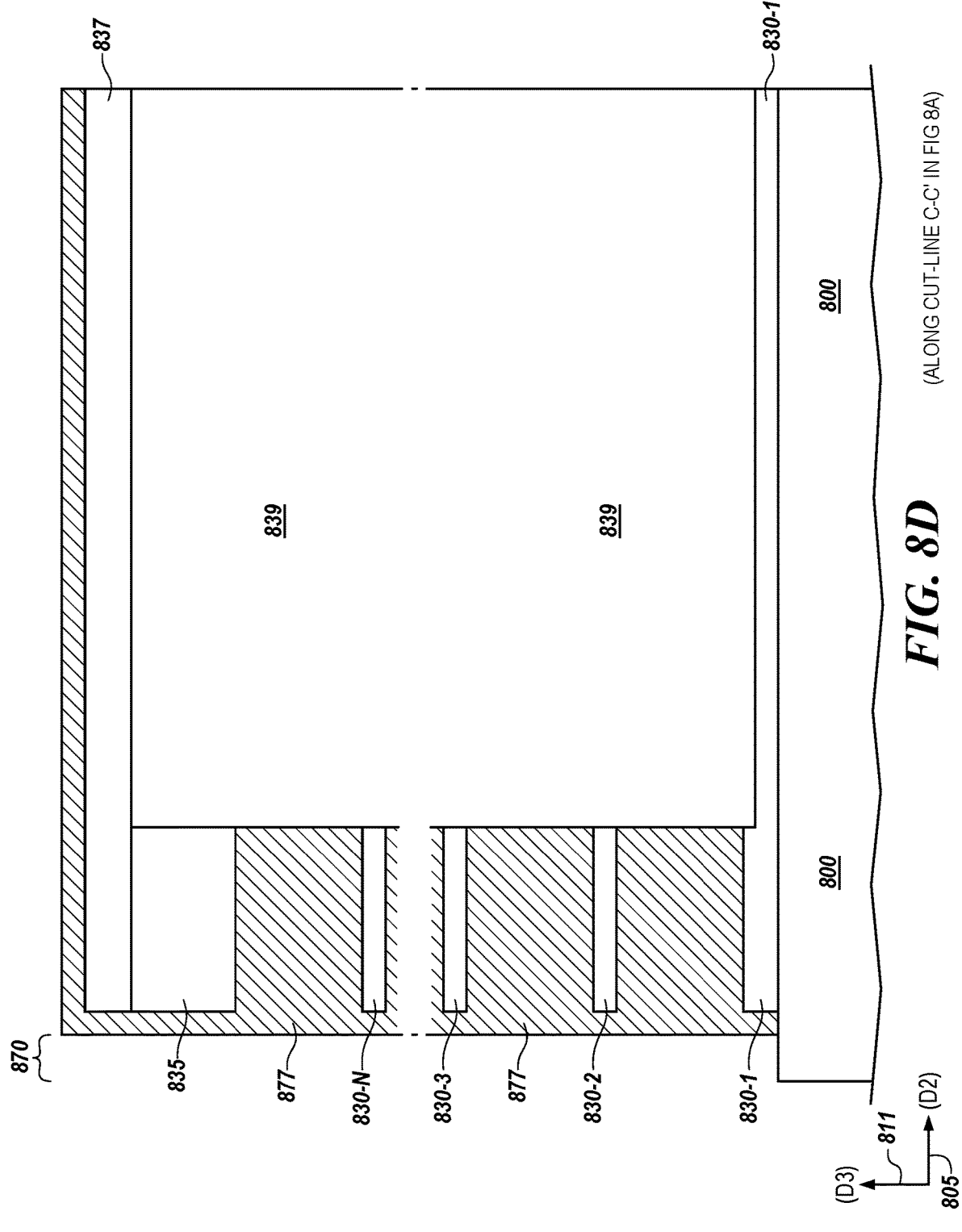

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second horizontal direction (D2) 805, outside of a region for the horizontally oriented access devices and horizontally oriented storage nodes.

In FIG. 8D, the fourth dielectric material 839 is shown filling the space along a first direction (D1), extending into and out from the plane of the drawings sheet, for a three dimensional array of vertically oriented memory cells. The cross sectional view shown in FIG. 8D is illustrated, right to left in the plane of the drawing sheet, extending in the first direction (D1) 809 along an axis of the repeating iterations of alternating layers of a first conductive material, 877-1, 877-2, . . . 877-N and a first dielectric material, 830-1, 830-2, . . . , 830-N intersecting the fourth dielectric fill material 839. Semiconductor material, 832-1, 832-2, . . . , 832-N, though present may be too thin to be seen in this view, The first conductive material, 877-1, 877-2, . . . ,

877-N, may fill the openings created by the etched second dielectric material 833 and third dielectric material 843. That is, the first conductive material, 877-1, 877-2, . . . , 877-N, may be seen in the second vertical opening 870. The first conductive material, 877-1, 877-2, . . . , 877-N, may be conformally deposited using a chemical vapor deposition (CVD) process, plasma enhanced CVD (PECVD), atomic layer deposition (ALD), or other suitable deposition process, such that the first conductive material 877 may also be deposited into the first horizontal opening 873. The first conductive material 877 may be entwined with a gate dielectric material 838.

The hard mask 837 over the repeating iterations of alternating layers of a first dielectric material, 877-1, 877-2, . . . , 877-N, and a semiconductor material, 832-1, 832-2, . . . , 832-N, may be viewed over fourth dielectric material 839. The first conductive material, 877-1, 877-2, . . . , 877-N, may be deposited over the hard mask 837.

Figure 8E:
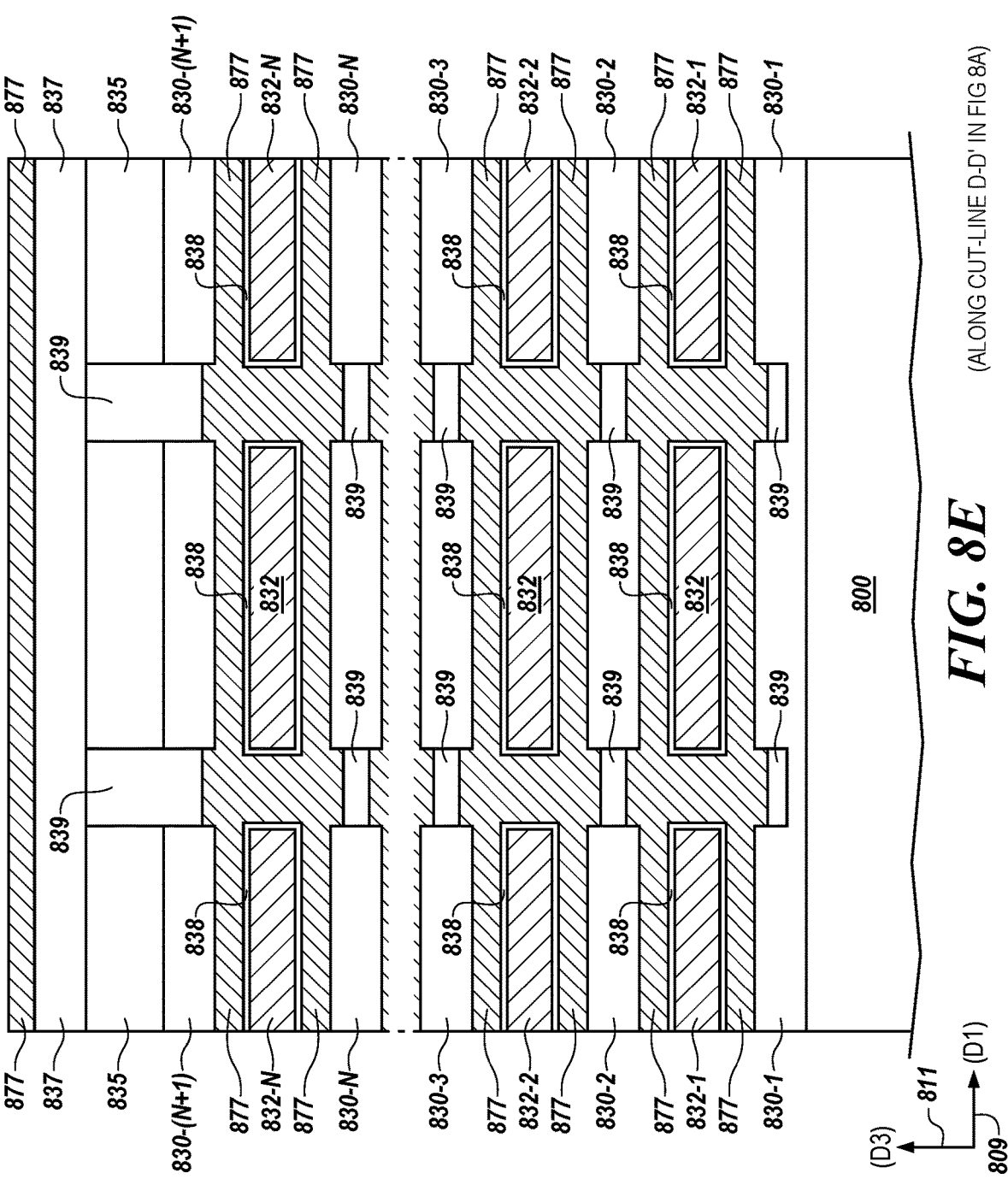

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a first conductive material, 877-1, 877-2, . . . , 877-N entwined with a gate dielectric material 838, a first dielectric material, 830-1, 830-2, . . . , 830-N, and a semiconductor material, 832-1, 832-2, . . . , 832-N, intersecting across the plurality of fourth dielectric fill material 839.

In FIG. 8E, the first conductive material, 877-1, 877-2, . . . , 877-N, is shown filling in the space in the second vertical opening 870 left by the etched portion of the second dielectric material and third dielectric material (illustrated as 533 and 543 in FIG. 5). Fourth dielectric fill material 839 is shown spaced along a first direction (D1) 809 and stacked vertically in arrays extending in the third direction (D3) 811 in the three dimensional (3D) memory. The first conductive material, 877-1, 877-2, . . . , 877-N entwined with a gate dielectric material 838, may fill the openings created by the etched second dielectric material 833 and third dielectric material 843. A hard mask 837, covering the first vertical openings over the vertical stack may be etched in the same manner as the fourth dielectric material 839. The first conductive material, 877-1, 877-2, . . . , 877-N, may be deposited over the hard mask 837.

Figure 9A:
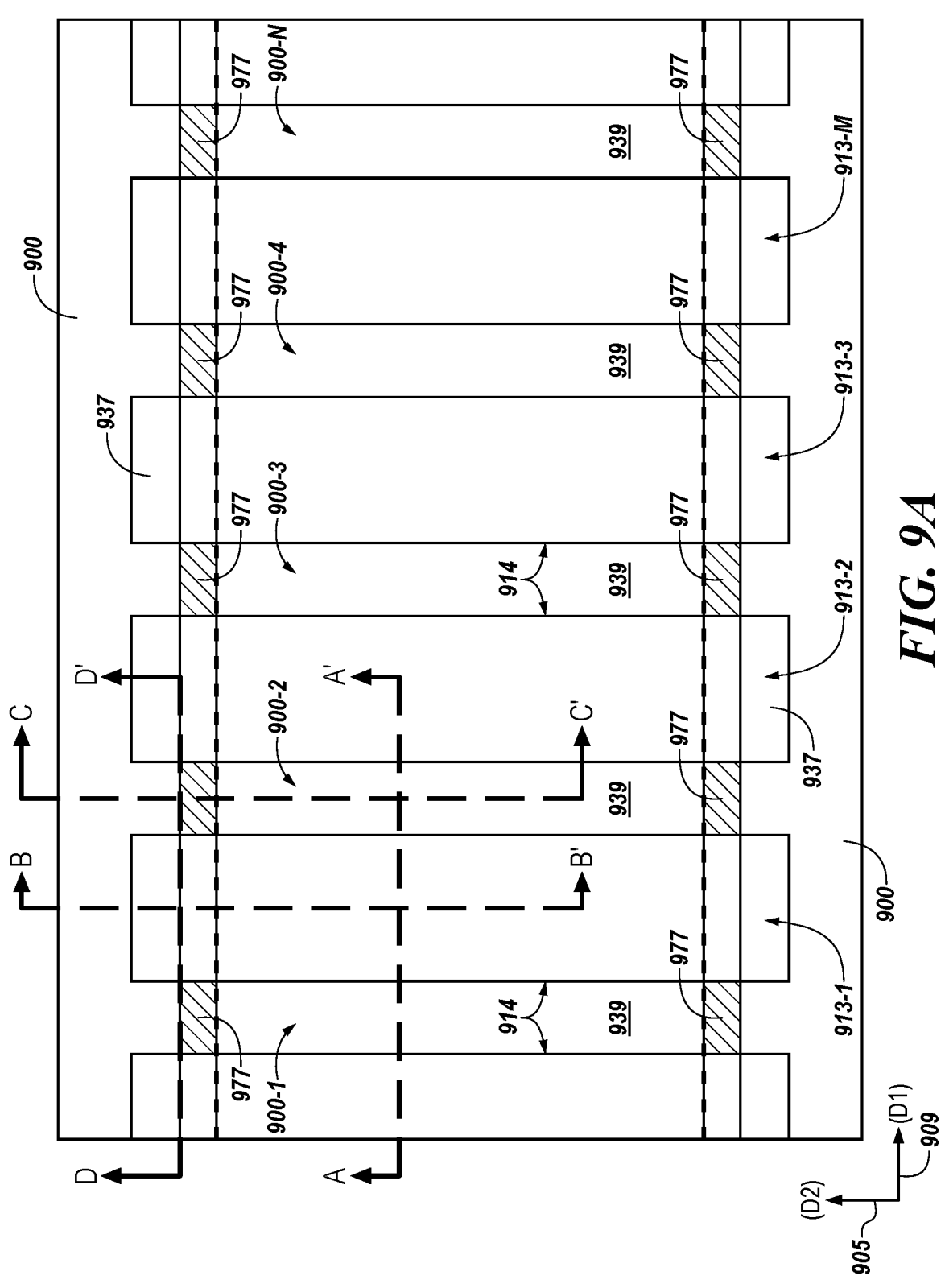
FIGS. 9A to 9E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 9A illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment shown in FIG. 9A, the method comprises using an etchant process to etch through the first conductive material, 977-1, 977-2, . . . , 977-N, that was formed over the fourth dielectric material 939 in the plurality of first vertical openings 900, having a first horizontal direction (D1) 909 and a second horizontal direction (D2) 905, through the vertical stack to the substrate. The fourth dielectric material 939 may be etched back vertically to the cut-line D-D'. The plurality of first vertical openings 900 may be viewed within the hard mask 937 covering the working surface of the vertical semiconductor stack.

Figure 9B:
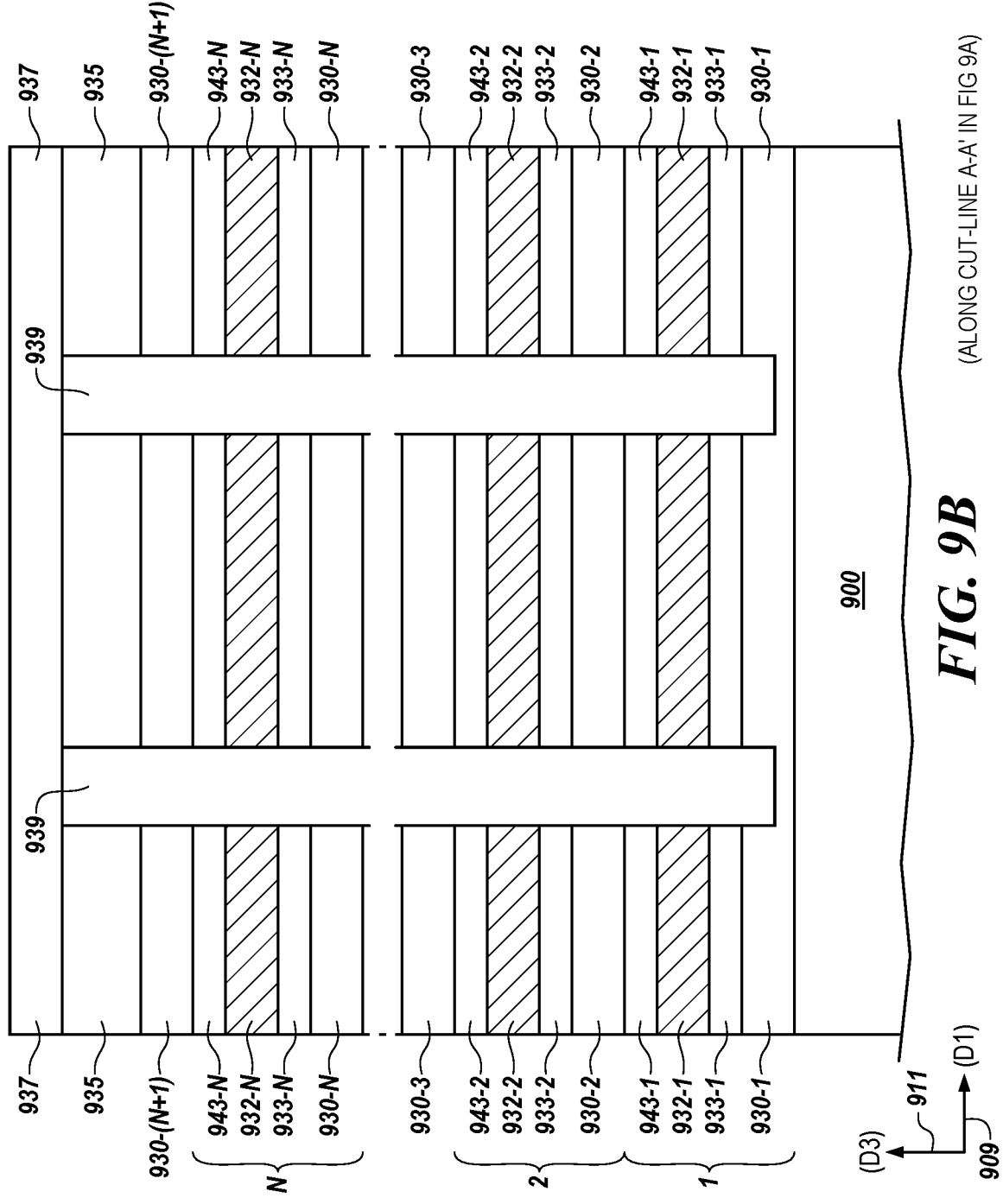

FIG. 9B is a cross sectional view, taken along cut-line A-A' in FIG. 9A, showing another view of the semiconductor structure at a particular time in the semiconductor fabrication process. The cross sectional view shown in FIG. 9B shows the repeating iterations of alternating layers of a first dielectric material, 930-1, 930-2, . . . , 930-N, a second dielectric material, 933-1, 933-2, . . . , 933-N a semiconductor material, 932-1, 932-2, . . . , 932-N, and a third dielectric material, 943-1, 943-2, . . . , 943-N, on a semiconductor substrate 900.

As shown in FIG. 9B, a plurality of first vertical openings may be formed through the layers within the vertically stacked memory cells to expose vertical sidewalls in the vertical stack. The first vertical openings may be formed through the repeating iterations of the oxide material 930, the semiconductor material 932, and the nitride material 933. As such, the first vertical openings may be formed through the first oxide material 930-1, the first semiconductor material 932-1, the first nitride material 933-1, the second oxide material 930-2, the second semiconductor material 932-2, the second nitride material 933-2, the third oxide material 930-3, the third semiconductor material 932-3, and the third nitride material 933-3. Embodiments, however, are not limited to the vertical opening(s) shown in FIG. 9B. Multiple vertical openings may be formed through the layers of materials. The first vertical openings may be formed to expose vertical sidewalls in the vertical stack. The first vertical openings may extend in a second horizontal direction (D2) 905 to form elongated vertical, pillar columns with first vertical sidewalls in the vertical stack.

As shown in FIG. 9B, a fourth dielectric material 939, such as an oxide or other suitable spin on dielectric (SOD), may be viewed in the first vertical openings, filling the first vertical openings. A first conductive material 977 may be deposited over hard mask 937 covering the first vertical openings. Similar semiconductor process techniques may be used at other points of the semiconductor fabrication process described herein.

Figure 9C:
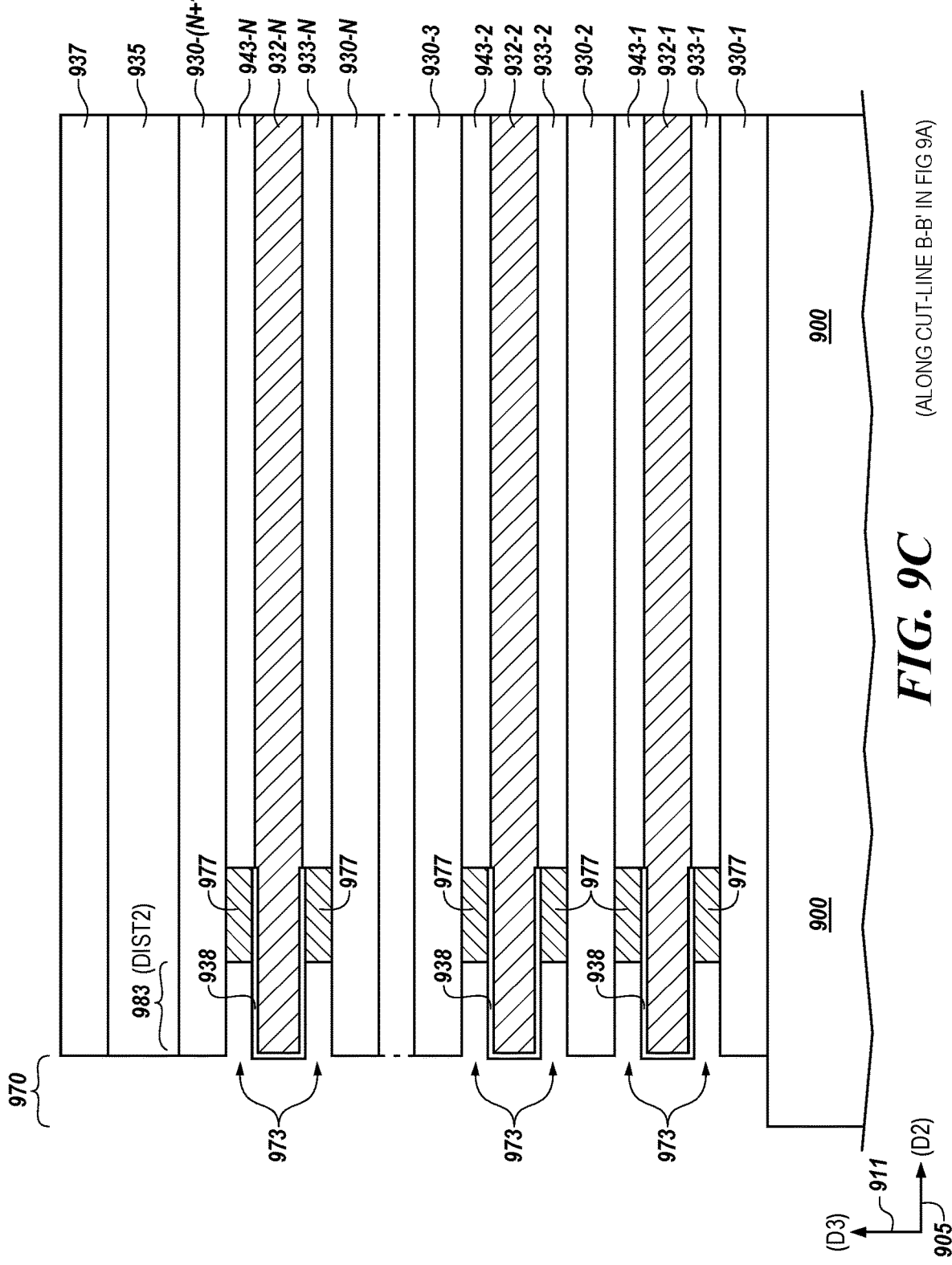

FIG. 9C is a cross-sectional view, at another stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure. FIG. 9C illustrates a cross sectional view, taken along cut-line B-B' in FIG. 9A.

The first conductive material, 977-1, 977-2, . . . , 977-N, may be recessed back in the first horizontal opening 973, e.g., etched away from the second vertical opening 970 using an atomic layer etching (ALE) or other suitable technique. In some examples, the first conductive material 977 may be etched back in the horizontal opening 973 a second distance (DIST 2) 983 into the continuous second horizontal openings 979. The first conductive material 977 may be etched back in the horizontal opening 973 a second distance (DIST 2) 983 for a range of twenty (20) to one hundred and fifty (150) nanometers (nm) back from the second vertical opening 970. The first conductive material 977 may be selectively etched, leaving the oxide material 930, a portion of the first conductive material 977, and the semiconductor material 932 intact. The unetched first conductive material 977 may form a first portion 977-1 formed above the semiconductor material 977 and a second portion 977-2 formed below the semiconductor material 977-2. The first portion of the first conductive material 977-1 and the second portion of the first conductive material 977-2 may be collectively referred to as first conductive material 977. In some embodiments, the first conductive material 977 may be etched using an atomic layer etching (ALE) process. In some embodiments, the first conductive material 977 may be etched using an isotropic etch process. For example, the first conductive material 977 may be recessed a second distance (DIST 2) 983 back into the continuous second horizontal openings 979 extending in the first horizontal direction using an atomic layer etching (ALE) process The first conductive material 977 may be recessed the second distance (DIST 2) 983 back in the first horizontal opening 973 to remain in direct contact with the remaining portion of the nitride material 933 and on a top surface of the semiconductor material 932. As such, the first conductive material 977 entwined with the gate dielectric material 938 may form horizontally oriented access lines opposing a channel region of the semiconductor material.

Figure 9D:
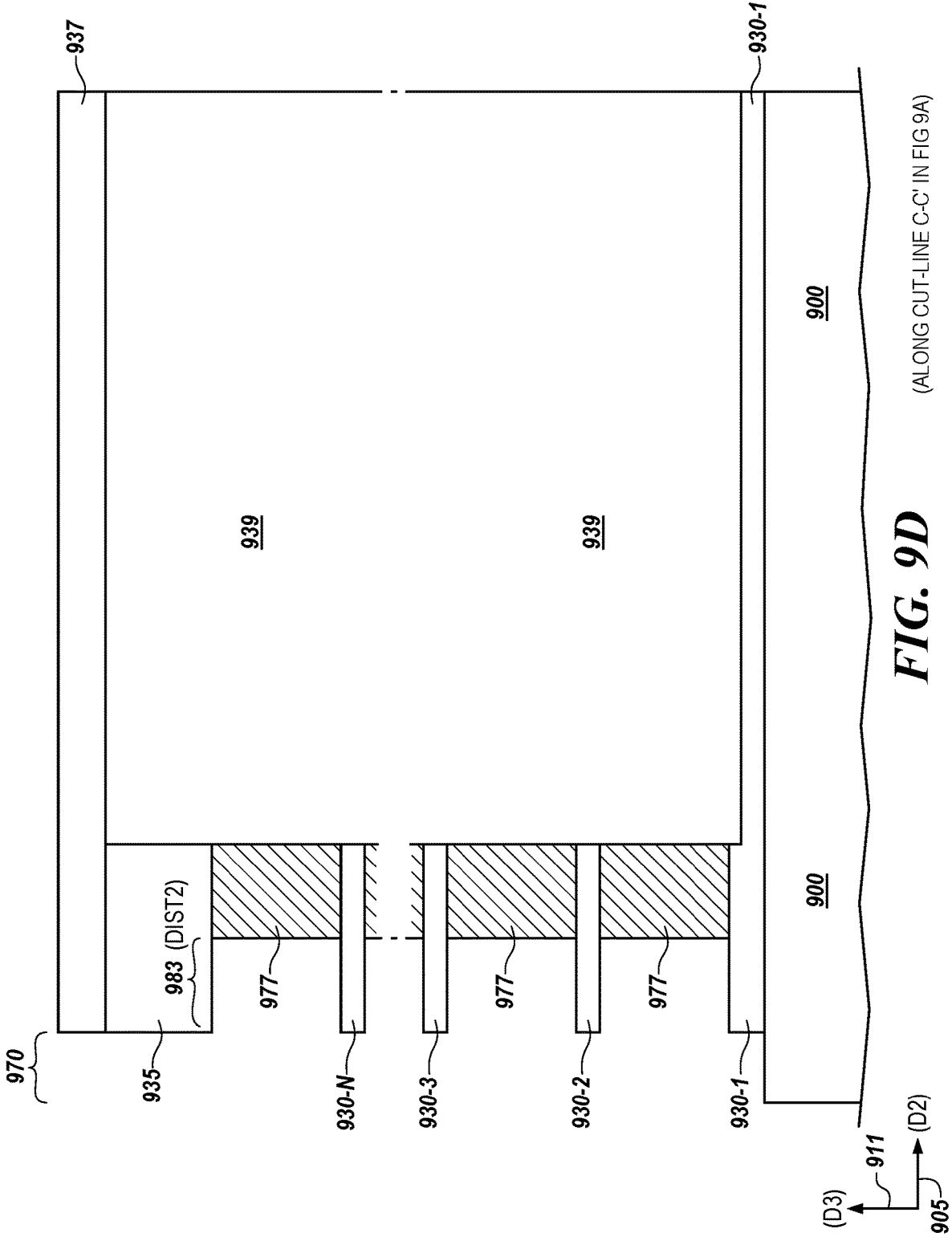

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second horizontal direction (D2) 905, outside of a region for the horizontally oriented access devices and horizontally oriented storage nodes.

In FIG. 9D, the fourth dielectric material 939 is shown filling the space along a first direction (D1), extending into and out from the plane of the drawings sheet, for a three dimensional array of vertically oriented memory cells. The cross sectional view shown in FIG. 9D is illustrated, right to left in the plane of the drawing sheet, extending in the first direction (D1) 909 along an axis of the repeating iterations of alternating layers of an etched portion of the first conductive material, 977-1, 977-2, . . . , 977-N, and a first dielectric material, 930-1, 930-2, . . . , 930-N, intersecting the fourth dielectric fill material 939. Semiconductor material, 932-1, 932-2, . . . , 932-N, though present may be too thin to be seen in this view. The first conductive material, 977-1, 977-2, . . . , 977-N, may fill the openings created by the etched second dielectric material 933 and third dielectric material 943. The first conductive material, 977-1, 977-2, . . . , 977-N, may be recessed back in the first horizontal opening 973, e.g., etched away from the second vertical opening 970. The hard mask 937 over the repeating iterations of alternating layers of a first dielectric material, 930-1, 930-2, . . . , 930-N, and a semiconductor material, 932-1, 932-2, . . . , 932-N, may be viewed over fourth dielectric material 939. The first conductive material, 977-1, 977-2, . . . , 977-N, (deposited over the hard mask 937 in FIG. 8D) may be etched away.

Figure 9E:
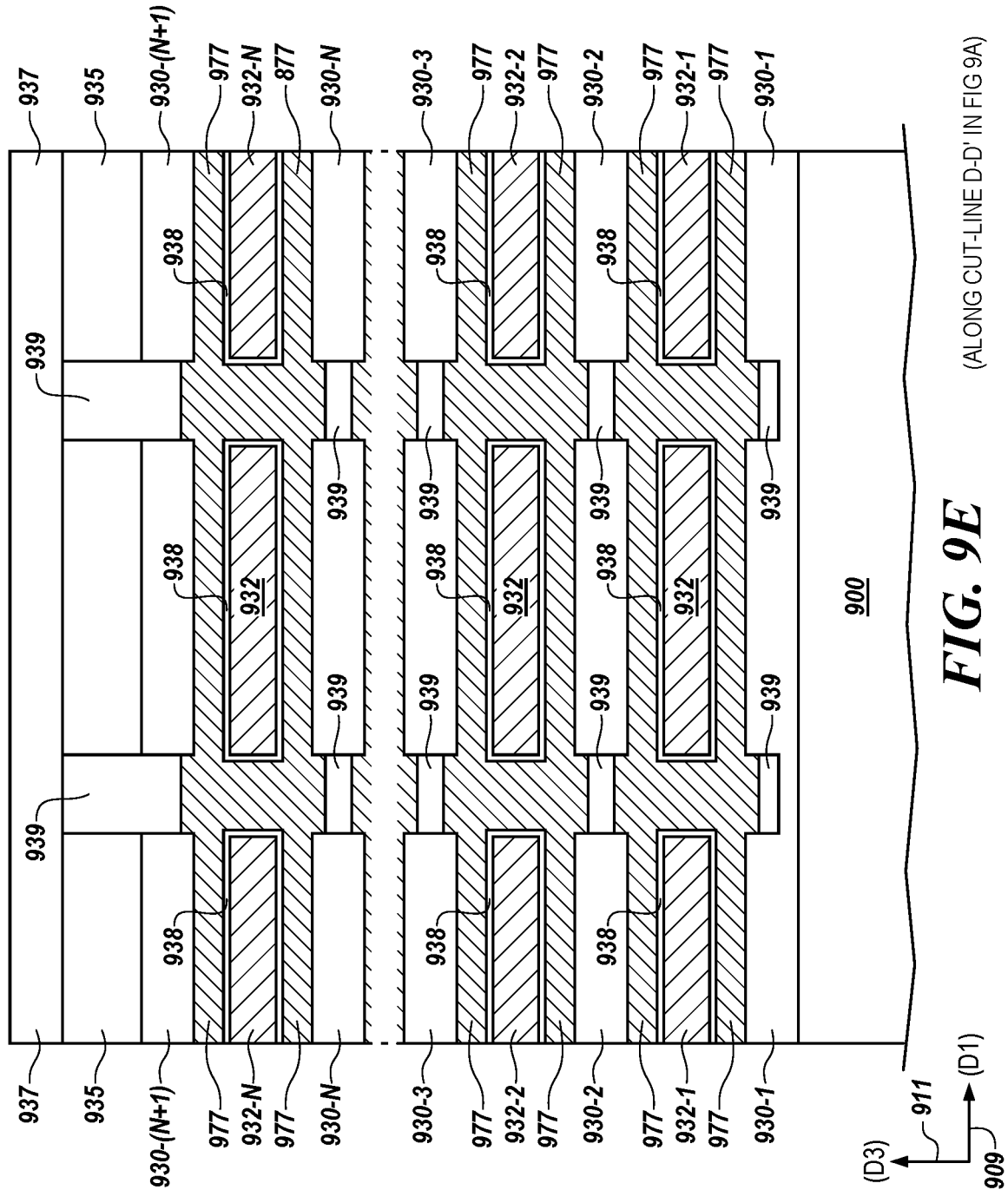

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 809 along an axis of the repeating iterations of alternating layers of a first conductive material, 977-1, 977-2, . . . , 977-N entwined with a gate dielectric material 938, a first dielectric material, 930-1, 930-2, . . . , 930-N, and a semiconductor material, 932-1, 932-2, . . . , 932-N, intersecting across the plurality of fourth dielectric fill material 939.

In FIG. 9E, the first conductive material, 977-1, 977-2, . . . , 977-N, is shown filling in the space in the second vertical opening 970 left by the etched portion of the second dielectric material 933 and third dielectric material 943. Fourth dielectric fill material 939 is shown spaced along a first direction (D1) 909 and stacked vertically in arrays extending in the third direction (D3) 911 in the three dimensional (3D) memory. The first conductive material, 977-1, 977-2, . . . , 977-N, may fill the openings created by the etched second dielectric material 933 and third dielectric material 943. A hard mask 937, covering the first vertical openings over the vertical stack may be etched in the same manner as the fourth dielectric material 939. The first conductive material, 977-1, 977-2, . . . , 977-N, may be deposited over the hard mask 937.

Figure 10A:
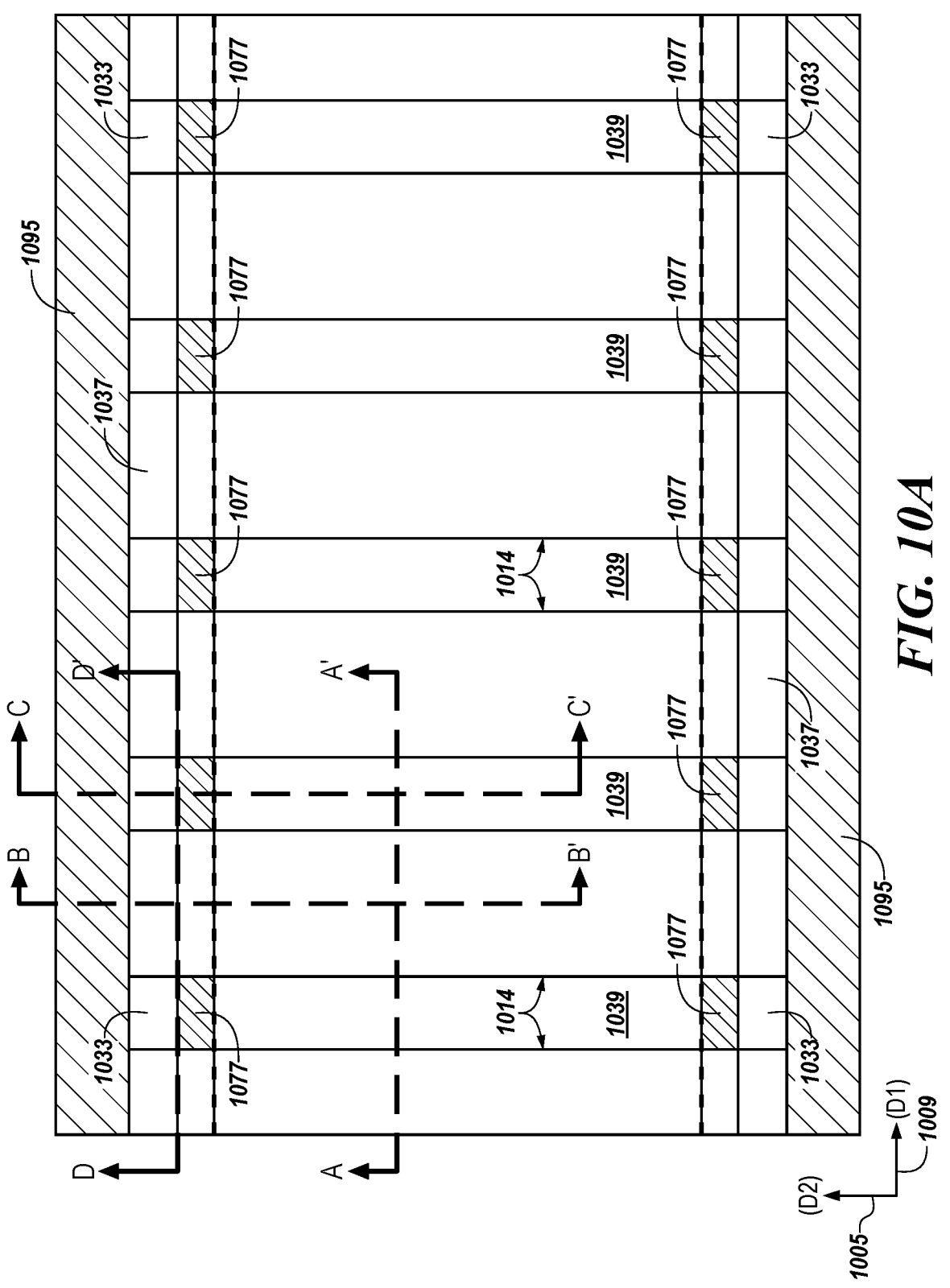
FIGS. 10A to 10E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 10A illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure. FIG. 10A illustrates a top down view of a semiconductor structure, at a particular point in time, in a semiconductor fabrication process, according to one or more embodiments. In the example embodiment shown in FIG. 10A, the method comprises depositing a fifth dielectric material 1074 and sixth dielectric material 1084 above the etched first conductive material 1077. The method further comprises depositing a high doped semiconductor material 1095 over the hard mask 1037, the fifth dielectric material 1074, and sixth dielectric material 1084 within the plurality of first vertical openings 1000, having a first horizontal direction (D1) 1009 and a second horizontal direction (D2) 1005, through the vertical stack to the substrate. The fourth dielectric material 1039 formed within the plurality of first vertical openings 1000 may be viewed covering the working surface of the vertical semiconductor stack.

Figure 10B:
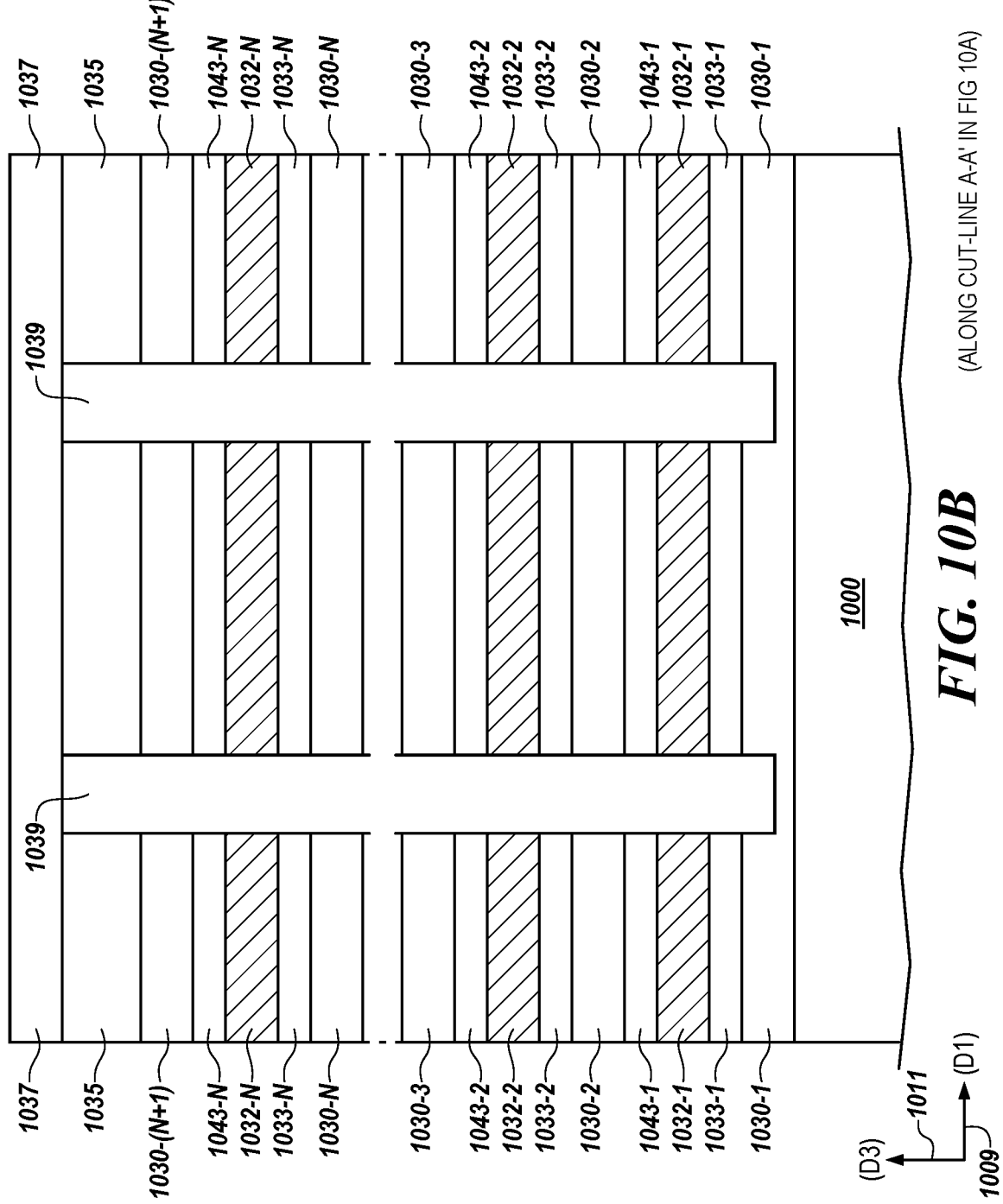

FIG. 10B is a cross sectional view, taken along cut-line A-A' in FIG. 10A, showing another view of the semiconductor structure at a particular time in the semiconductor fabrication process. The cross sectional view shown in FIG. 10B shows the repeating iterations of alternating layers of a first dielectric material, 1030-1, 1030-2, . . . , 1030-N, a second dielectric material, 1033-1, 1033-2, . . . 1033-N a semiconductor material, 1032-1, 1032-2, . . . , 1032-N, and a third dielectric material, 1043-1, 1043-2, . . . , 1043-N, on a semiconductor substrate 1000.

As shown in FIG. 10B, a plurality of first vertical openings may be formed through the layers within the vertically stacked memory cells to expose vertical sidewalls in the vertical stack. The first vertical openings may be formed through the repeating iterations of the oxide material 1030, the semiconductor material 1032, and the nitride material 1033. As such, the first vertical openings may be formed through the first oxide material 1030-1, the first semiconductor material 1032-1, the first nitride material 1033-1, the second oxide material 1030-2, the second semiconductor material 1032-2, the second nitride material 1033-2, the third oxide material 1030-3, the third semiconductor material 1032-3, and the third nitride material 1033-3. Embodiments, however, are not limited to the vertical opening(s) shown in FIG. 10B. Multiple vertical openings may be formed through the layers of materials. The first vertical openings may be formed to expose vertical sidewalls in the vertical stack. The first vertical openings may extend in a second horizontal direction (D2) 1005 to form elongated vertical, pillar columns with third vertical sidewalls in the vertical stack.

As shown in FIG. 10B, a fourth dielectric material 1039, such as an oxide or other suitable spin on dielectric (SOD), may be viewed in the first vertical openings, filling the first vertical openings. Similar semiconductor process techniques may be used at other points of the semiconductor fabrication process described herein.

Figure 10C:
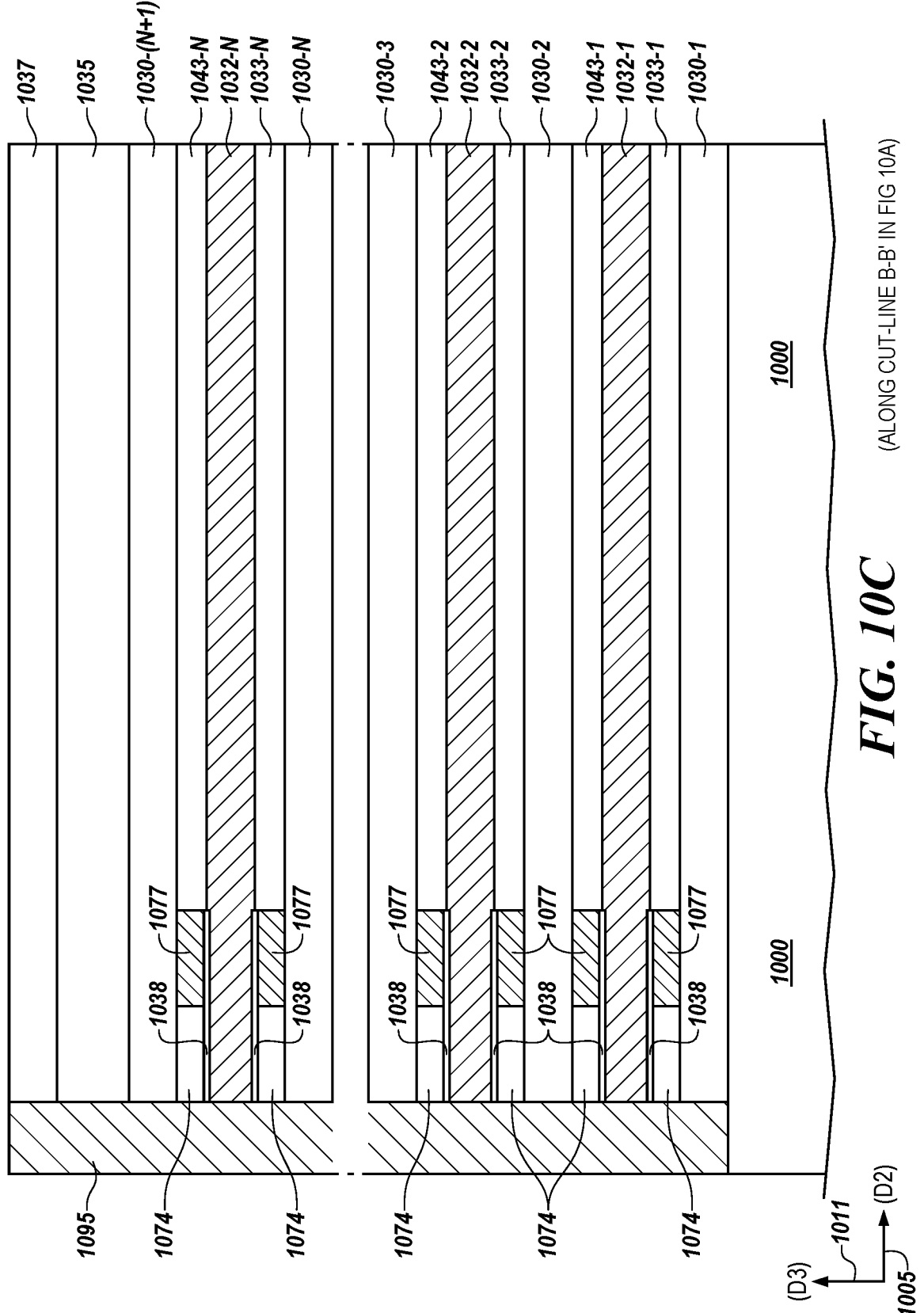

FIG. 10C is a cross-sectional view, at another stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure. FIG. 10C illustrates a cross sectional view, taken along cut-line B-B' in FIG. 10A.

A fifth dielectric material 1074 and sixth dielectric material 1084 may be conformally deposited, e.g., using a CVD process, into the first horizontal opening 1073 adjacent the first conductive material 1077, e.g., horizontal, conductive access line extending in the first direction (D1) 109 in FIG. 1. The fifth dielectric material 1074 may be deposited adjacent first conductive material 1077-1 while the sixth dielectric material 1084 may be deposited adjacent first conductive material 1077-2. In some embodiments, the fifth dielectric material 1074 may be below the first dielectric material 1030, above the low doped semiconductor material 1032 while the sixth dielectric material 1084 may be below the low doped semiconductor material 1032, above the low doped semiconductor material 1032. The fifth dielectric material 1074 and sixth dielectric material 1084 may be in direct contact with the first conductive material 1077 and the low doped semiconductor material 1032. Embodiments, however, are not limited to this example.

The fifth dielectric material 1074 and sixth dielectric material 1084 may be the same material or a different material as the second dielectric material 1033. For example, the second dielectric material 1033 and third dielectric material 1043 may be $Si_3N_4$ and the fifth dielectric material 1074 and sixth dielectric material 1084 may also be $Si_3N_4$. In another example, the fifth dielectric material 1074 and sixth dielectric material 1084 may comprise a silicon dioxide ($SiO_2$) material. In another example, the fifth dielectric material 1074 and sixth dielectric material 1084 may comprise a silicon oxy-carbide ($SiO_xC_y$) material. In another example, the fifth dielectric material 1074 and sixth dielectric material 1084 may include silicon oxy-nitride ($SiO_xN_y$), and/or combinations thereof. Embodiments are not limited to these examples.

A high doped semiconductor material 1095 may be deposited into the second vertical opening (as illustrated by 970 in FIG. 9) to form a conductive body contact with the low doped, e.g., p-type, low doped (p−), semiconductor material 1032. The high doped semiconductor material 1095 may also be in contact with the fifth dielectric material 1074, the sixth dielectric material 1084, and the first dielectric material 1030. In some embodiments, the high doped semiconductor material 1095 may be a metal such as tungsten (W). Embodiments, however, are not so limited. In some embodiments, the high doped semiconductor material 1095 may be a high doped, e.g., p-type, high doped (p+), semiconductor material that may be deposited into the second vertical opening. In this example, the high doped semiconductor material 1095 may be a high doped, p-type (p+) silicon material. The high doped, p-type (p+) silicon material 1095 may be a polysilicon material. In one example, forming the high doped semiconductor material 1095 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In some examples, the high doped semiconductor material 1095 may be a high doped, p-type (p+) silicon-germanium (SiGe) material. The SiGe material may be deposited into the second vertical opening at a relatively lower temperature. Embodiments, however, are not limited to these examples.

Figure 10D:
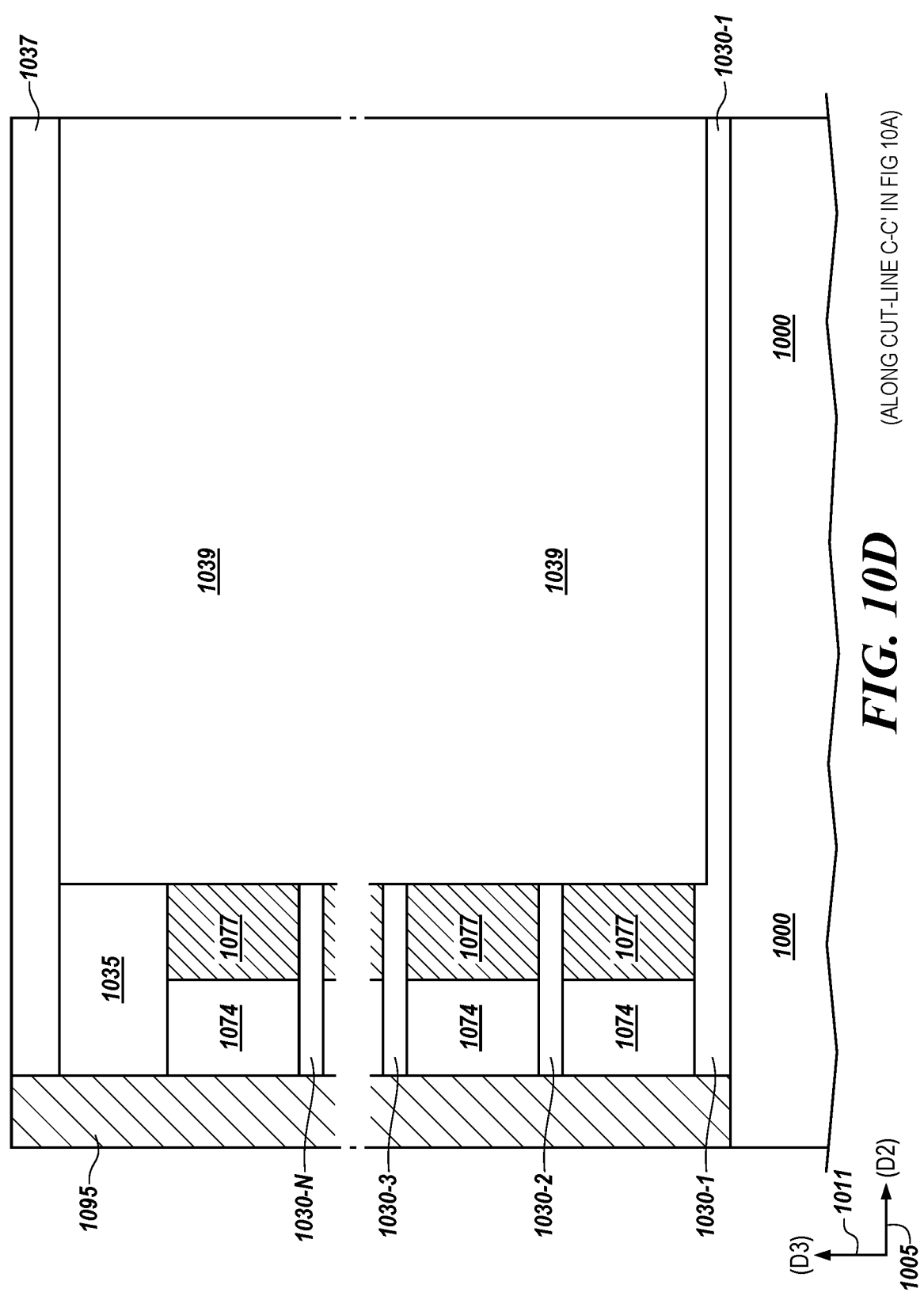

FIG. 10D illustrates a cross sectional view, taken along cut-line C-C' in FIG. 10A, showing another view of the semiconductor structure at this particular point in one example semiconductor fabrication process of an embodiment of the present disclosure. The cross sectional view shown in FIG. 10D is illustrated extending in the second horizontal direction (D2) 1005, outside of a region for the horizontally oriented access devices and horizontally oriented storage nodes.

In FIG. 10D, a fifth dielectric material 1074 and a sixth dielectric material 1084 are shown conformally deposited, e.g., using a CVD process, into the first horizontal opening 1073 adjacent the first conductive material 1077. The fifth dielectric material 1074 and sixth dielectric material 1084 may be shown as one material in this view. The fifth dielectric material 1074 and sixth dielectric material 1084 may be in direct contact with the first conductive material 1077. A high doped semiconductor material 1095 may be deposited into the second vertical opening to form a conductive body contact with the low doped, e.g., p-type, low doped (p−), semiconductor material 1032. The low doped semiconductor material 1032, though present, may be formed from a material too thin to see in this view. The high doped semiconductor material 1095 may also be in contact with the fifth dielectric material 1074, the sixth dielectric material 1084, and the first dielectric material 1030.

The hard mask 1037 over the repeating iterations of alternating layers of a first dielectric material, 1030-1, 1030-2, . . . , 1030-N, a portion of the first conductive material, 1077-1, 1077-2, . . . , 1077-N, the deposited fourth dielectric material 1074, and the semiconductor material, 1032-1, 1032-2, . . . , 1032-N may be viewed over fourth dielectric material 1039.

Figure 10E:
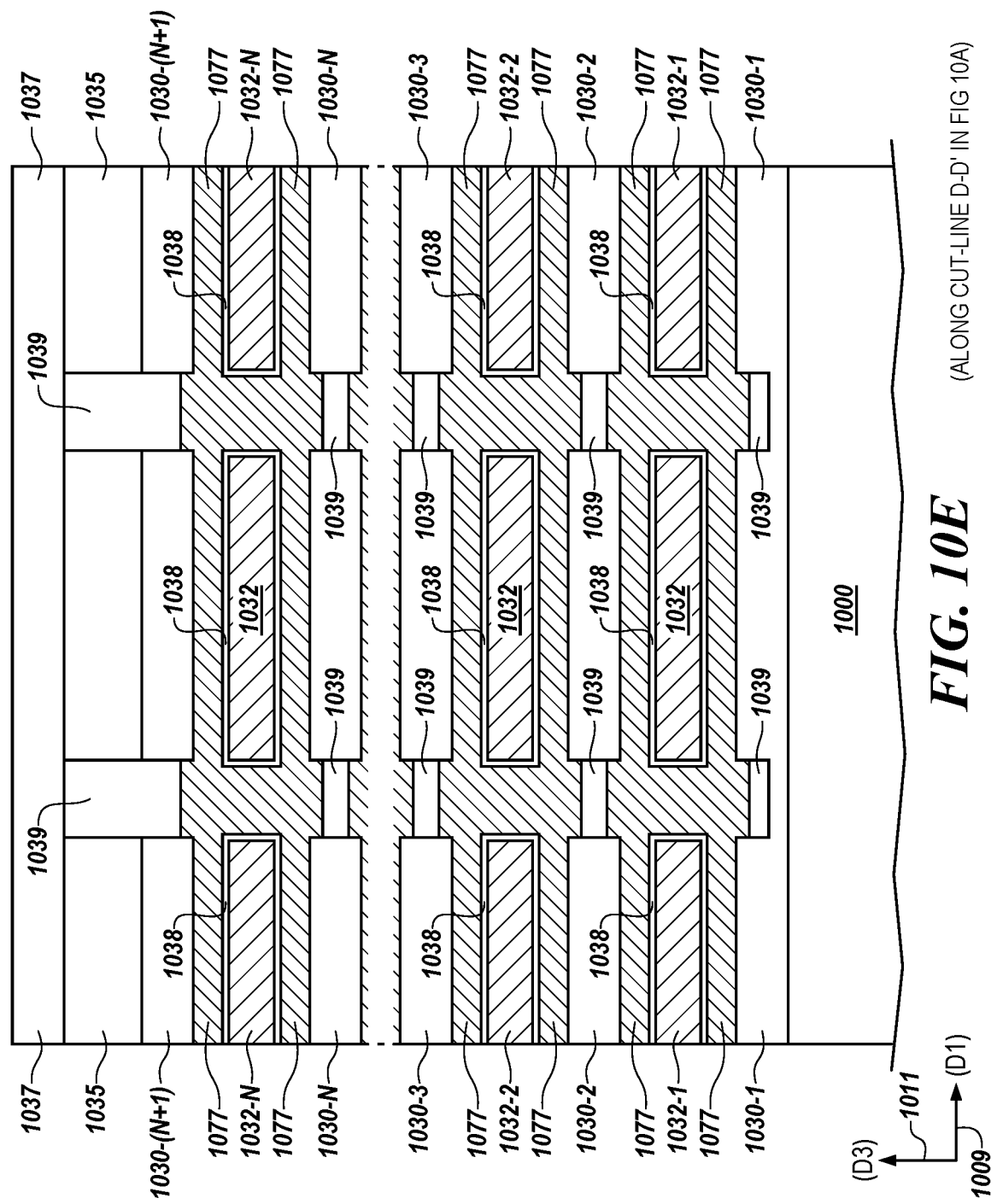

FIG. 10E illustrates a cross sectional view, taken along cut-line D-D' in FIG. 10A, showing another view of the semiconductor structure at this particular point in one example semiconductor fabrication process of an embodiment of the present disclosure. The cross sectional view shown in FIG. 10E is illustrated, right to left in the plane of the drawing sheet, extending in the first direction (D1) 1009 along an axis of the repeating iterations of alternating layers of a first conductive material, 1077-1, 1077-2, . . . , 1077-N, a first dielectric material, 1030-1, 1030-2, . . . , 1030-N, and a semiconductor material, 1032-1, 1032-2, . . . 1032-N, intersecting across the plurality of fourth dielectric fill material 1039.

In FIG. 10E, the first conductive material, 1077-1, 1077-2, . . . 1077-N, is shown filling in the space in the second vertical opening left by the etched portion of the second dielectric material 1033 and third dielectric material 1043. Fourth dielectric fill material 1039 is shown spaced along a first direction (D1) 1009 and stacked vertically in arrays extending in the third direction (D3) 1011 in the three dimensional (3D) memory. The first conductive material,

1077-1, 1077-2, . . . 1077-N, entwined with a gate dielectric material 1038, may fill the openings created by the etched second dielectric material 1033 and third dielectric material 1043. A hard mask 1037, covering the first vertical openings over the vertical stack may be etched in the same manner as the fourth dielectric material 1039. The conductive material, 1077-1, 1077-2, . . . , 1077-N, may be deposited over the hard mask 1037.

Figure 11A:
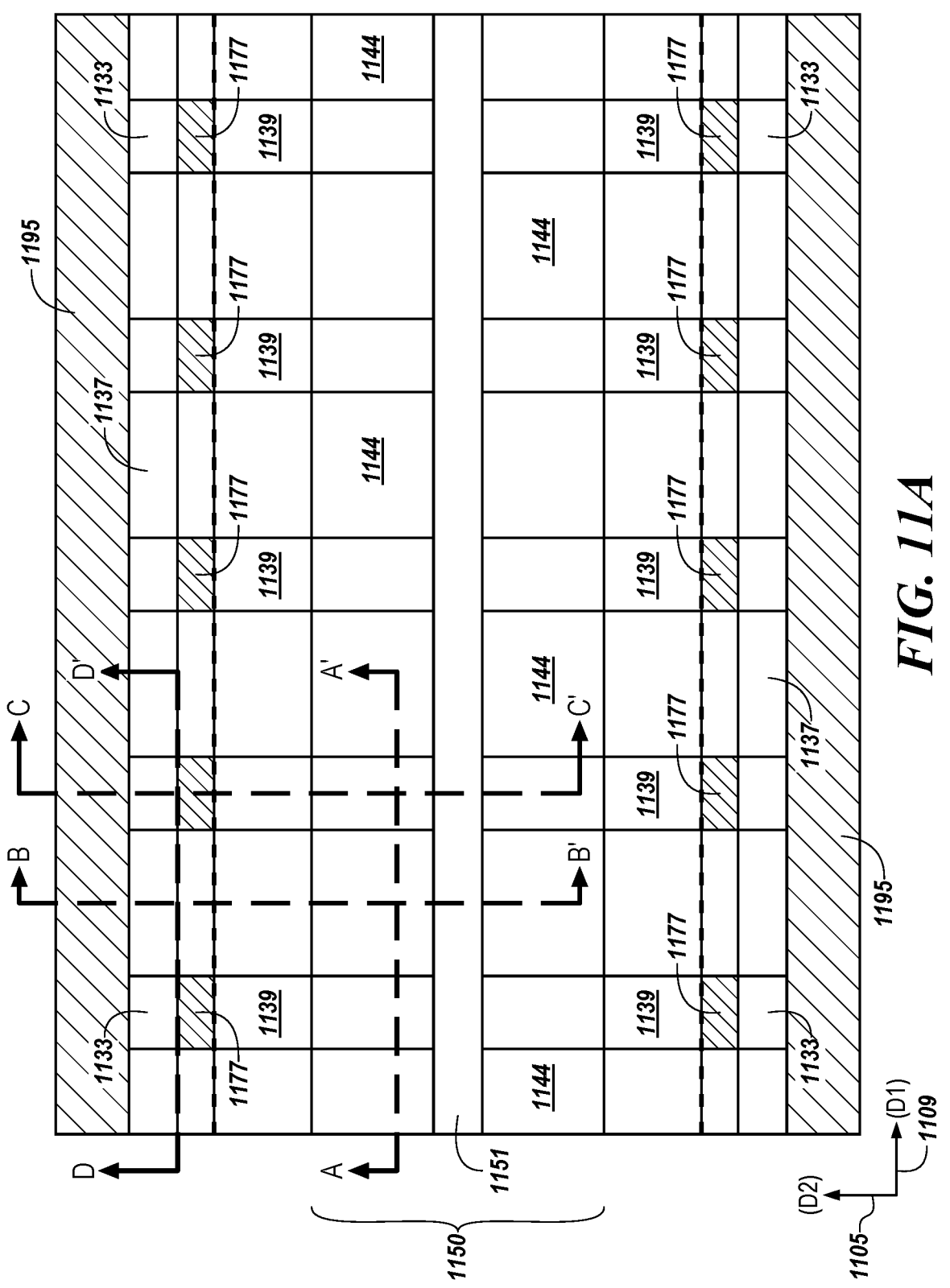
FIGS. 11A to 11E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 11A illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure. FIG. 11A illustrates a top down view of a semiconductor structure, at a particular point in time, in a semiconductor fabrication process, according to one or more embodiments. In the example embodiment of FIG. 11A, the method comprises using a photolithographic process to pattern the photolithographic mask 1137. The method in FIG. 11A further illustrates using one or more etchant processes to form a vertical opening 1151 in a storage node region 1150 (and 1144 in FIGS. 11A and 11C) through the vertical stack and extending predominantly in the first horizontal direction (D1) 1109. The one or more etchant processes forms a vertical opening 1151 to expose third sidewalls in the repeating iterations of alternating layers of a first dielectric material, 1130-1, 1130-2, . . . , 1130-N, a second dielectric material, 1133-1, 1133-2, . . . , 1133-N a semiconductor material, 1132-1, 1132-2, . . . , 1132-N, and a third dielectric material, 1143-1, 1143-2, . . . , 1143-N, in the vertical stack, shown in FIGS. 11B-11E, adjacent a second region of the semiconductor material. A first conductive material 1177 may be formed above the vertical opening 1151. A fifth dielectric material 1174 and sixth dielectric material 1184 may be formed above the first conductive material 1177. A high doped semiconductor material 1195 may be formed above the fifth dielectric material 1174 and sixth dielectric material 1184.

In some embodiments, this process is performed before the semiconductor fabrication process described in connection with FIGS. 1-3. However, the embodiment shown in FIGS. 11B-11E illustrate a sequence in which the storage node fabrication process is performed "after" the first conductive material 1177, have already been performed, e.g., access line formation first.

According to an example embodiment, shown in FIGS. 11B-11E, the method comprises forming a second vertical opening 1151 in the vertical stack (401 in FIG. 4) and selectively etching the second region 1144 of the semiconductor material, 1132-1, 1132-2, . . . , 1132-N, to form a second horizontal opening 1179 a third horizontal distance back from the vertical opening 1151 in the vertical stack (401 in FIG. 4). According to embodiments, selectively etching the second region 1144 of the semiconductor material, 1132-1, 1132-2, . . . , 1132-N can comprise using an atomic layer etching (ALE) process. As will be explained more in connection with FIG. 11C, a second source/drain region 1178 can be formed in the semiconductor material, 1132-1, 1132-2, . . . , 1132-N at a distal end of the second horizontal openings 1179 from the vertical opening.

Figure 11B:
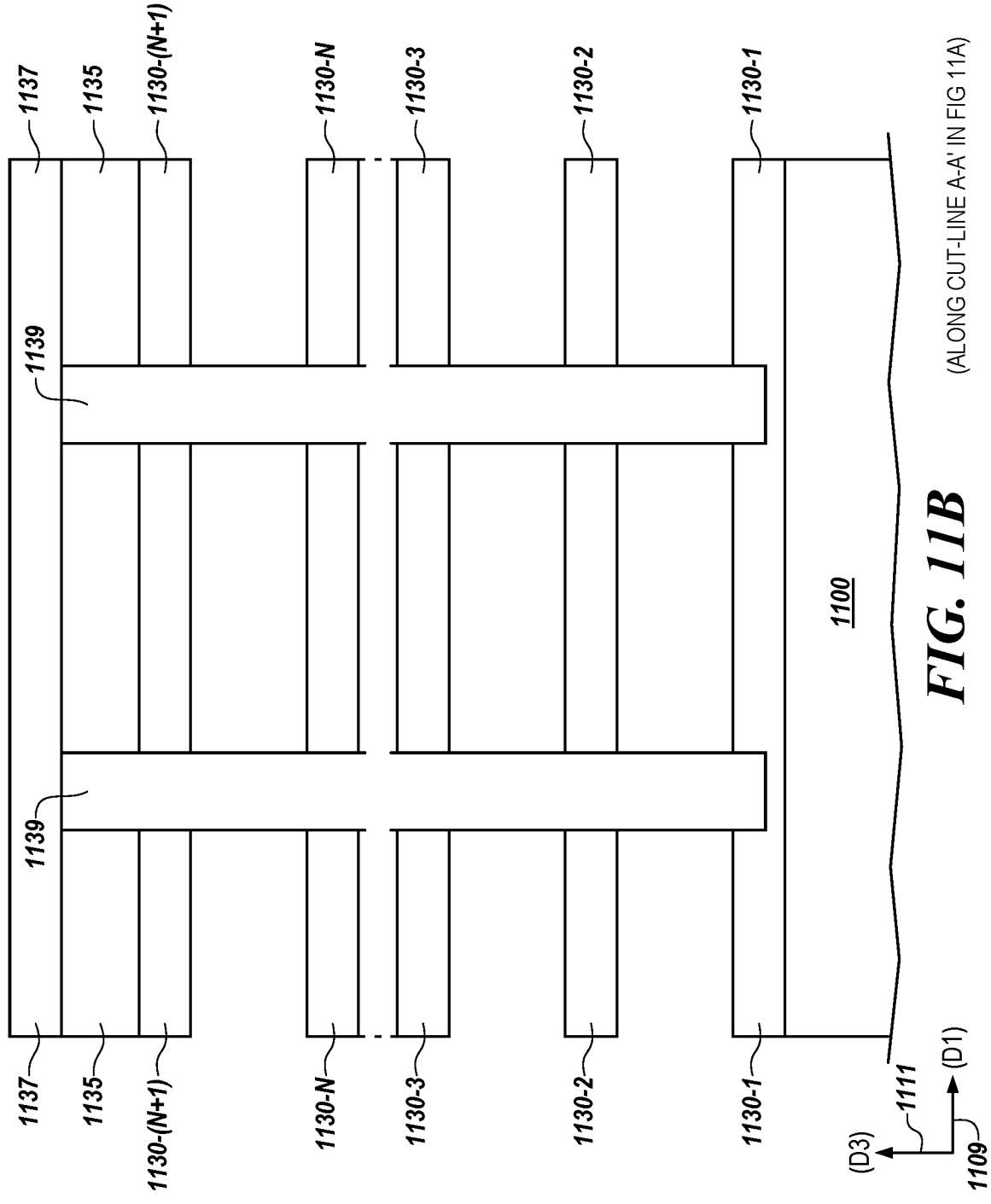

FIG. 11B illustrates a cross sectional view, taken along cut-line A-A' in FIG. 11A, showing another view of the semiconductor structure at this particular point in one example semiconductor fabrication process of an embodiment of the present disclosure. The cross sectional view shown in FIG. 11B is away from the plurality of separate, horizontal access lines, 1177-1, 1177-2, . . . 1177-N, 1177-

(N+1), . . . , 1177-(Z–1), and shows repeating iterations of alternating layers of a dielectric material, 1130-1, 1130-2, . . . , 1130-(N+1), a second dielectric material, 1133-1, 1133-2, . . . , 1133-N a semiconductor material, 1132-1, 1132-2, . . . , 1132-N, and a third dielectric material, 1143-1, 1143-2, . . . , 1143-N separated by an opening 1151, on a semiconductor substrate 1100 to form the vertical stack. As shown in FIG. 11B, a vertical direction 1111 is illustrated as a third direction (D3), e.g., z-direction in an x-y-z coordinate system, analogous to the third direction (D3) 1111, among first, second, and third directions, shown in FIGS. 1-3. The plane of the drawing sheet, extending right and left, is in a first direction (D1) 1109. In the example embodiment of FIG. 11B, the materials within the vertical stack—a dielectric material, 1130-1, 1130-2, . . . , 1130-(N+1), a second dielectric material, 1133-1, 1133-2, . . . , 1133-N a semiconductor material, 1132-1, 1132-2, . . . , 1132-N, and a third dielectric material, 1143-1, 1143-2, . . . 1143-N are extending into and out of the plane of the drawing sheet in second direction (D2) and along an axis of orientation of the horizontal access devices and horizontal storage nodes of the arrays of vertically stacked memory cells of the three dimensional (3D) memory.

Figure 11C:
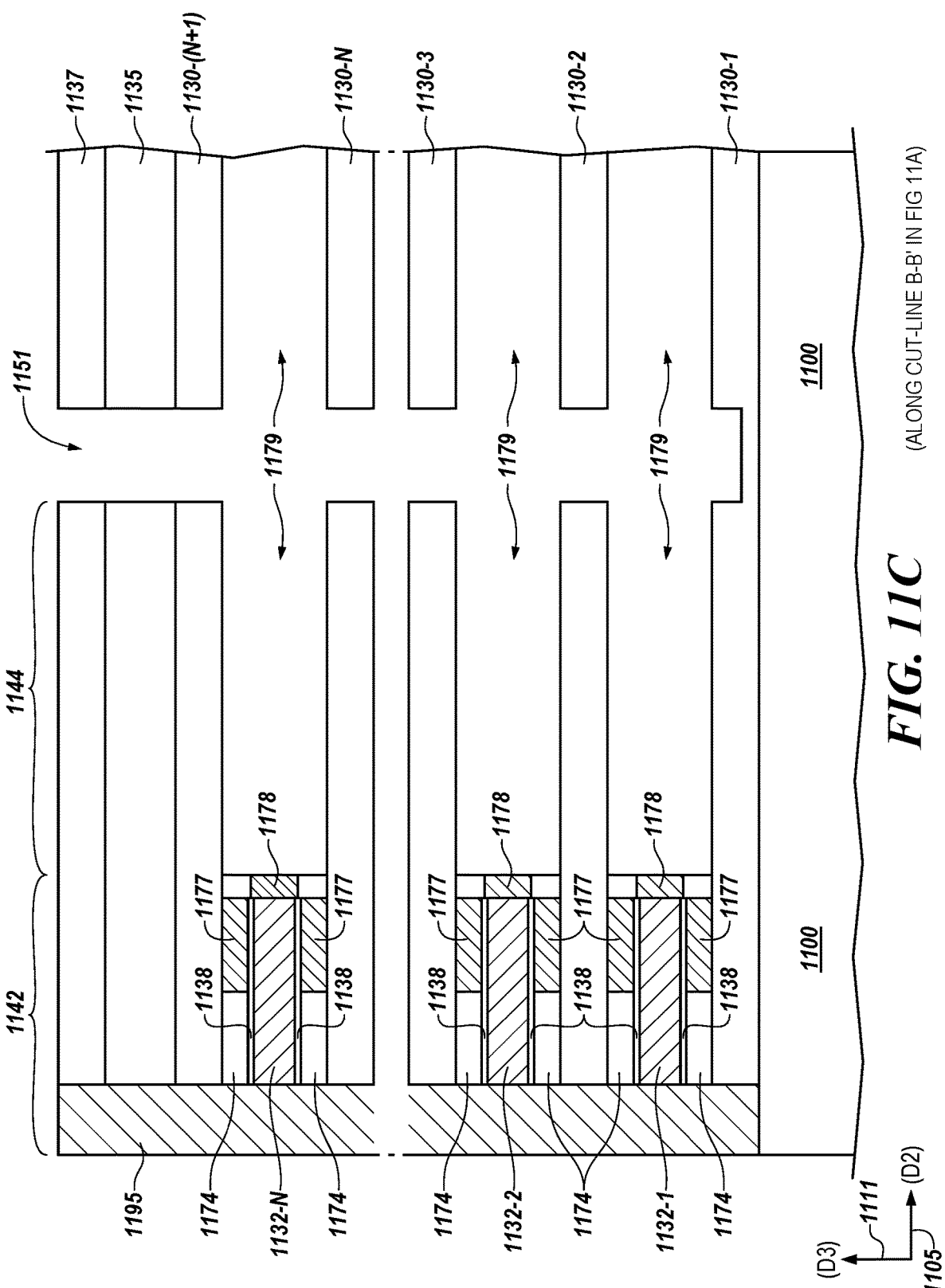

FIG. 11C illustrates a cross sectional view, taken along cut-line B-B' in FIG. 11A, showing another view of the semiconductor structure at this particular point in one example semiconductor fabrication process of an embodiment of the present disclosure. The cross sectional view shown in FIG. 11C is illustrated extending in the second horizontal direction (D2) 1105, left and right along the plane of the drawing sheet, along an axis of the repeating iterations of alternating layers of a first dielectric material, 1130-1, 1130-2, . . . , 1130-N, a second dielectric material, 1133-1, 1133-2, . . . , 1133-N a semiconductor material, 1132-1, 1132-2, . . . , 1132-N, and a third dielectric material, 1143-1, 1143-2, . . . 1143-N, along and in which the horizontally oriented access devices and horizontally oriented storage nodes, e.g., capacitor cells, can be formed within the layers of semiconductor material, 1132-1, 1132-2, . . . , 1132-N.

In the example embodiment of FIG. 11C, a vertical opening 1151 and horizontal openings 1179 are shown formed from the mask, patterning, and etching process described in connection with FIG. 11A. As shown in FIG. 11C, the semiconductor material, 1132-1, 1132-2, . . . , 1132-N, in the second region 1144 has been selectively removed to form the horizontal openings 1179. In one example, an atomic layer etching (ALE) process is used to selectively etch the semiconductor material, 1132-1, 1132-2, . . . , 1132-N, and remove a third distance back from the vertical opening 1151. Horizontally oriented storage nodes, e.g., capacitor cells, may be formed, as shown in FIGS. 11A-11E, later or first, relative to the fabrication process shown in FIGS. 4-9, in the second horizontal openings 1179.

Also shown in FIG. 11C, the first source/drain region may be formed by gas phase doping a dopant into a top surface portion of the semiconductor material 1132. In some embodiments, the first source/drain region may be adjacent a channel region. In one example, gas phase doping may be used to achieve a highly isotropic e.g., non-directional doping, to form the second source/drain region 1178 to a horizontally oriented access device in region 1142. In another example, thermal annealing with doping gas, such as phosphorous may be used with a high energy plasma assist to break the bonding. Embodiments, however, are not so limited and other suitable semiconductor fabrication techniques may be utilized. In some embodiments, the fifth dielectric material 1174 and sixth dielectric material 1184 may be deposited in the continuous second horizontal opening 1179 adjacent the first conductive material 1177 entwined with gate dielectric 1138.

According to one example embodiment, as shown in FIG. 11C a second source/drain region 1178 may be formed by flowing a high energy gas phase dopant, such as Phosphorous (P) for an n-type transistor, into the second horizontal openings 1179 to dope the dopant in the semiconductor material, 1132-1, 1132-2, . . . , 1132-N, at a distal end of the second horizontal openings 1179 from the vertical opening 1151. A fourth vertical opening may be formed adjacent a second region of the semiconductor material, 1132-1, 1132-2, . . . , 1132-N, to expose third vertical sidewalls in the vertical stack. The semiconductor material, 1132-1, 1132-2, . . . 1132-N, may be selectively etched in the second horizontal direction (D2) 1105 to form a plurality of third horizontal openings in the second region. A dopant may be doped in the side surface of the semiconductor material from the third horizontal openings to form the second source/ drain region 1178 horizontally adjacent the channel region. Horizontally oriented capacitor cells having a bottom electrode (1261 as illustrated in FIG. 12) may be deposited into the third horizontal opening to have electrical contact with the second source/drain region 1178.

As shown further in FIG. 11C, a first electrode, e.g., 1161, for horizontally oriented storage nodes are to be coupled to the second source/drain regions 1178 of the horizontal access devices. As shown later in FIG. 11C, such horizontally oriented storage nodes are shown formed in a second horizontal opening 1179 extending in second direction (D2), left and right in the plane of the drawing sheet, a third distance from the vertical opening 1151 formed in the vertical stack, e.g., 401 in FIG. 4, and along an axis of orientation of the horizontal access devices and horizontal storage nodes of the arrays of vertically stacked memory cells of the three dimensional (3D) memory. In FIG. 11C, a neighboring, opposing horizontal access line 1177-3 is illustrated by a dashed line indicating a location set inward from the plane and orientation of the drawing sheet.

Figure 11D:
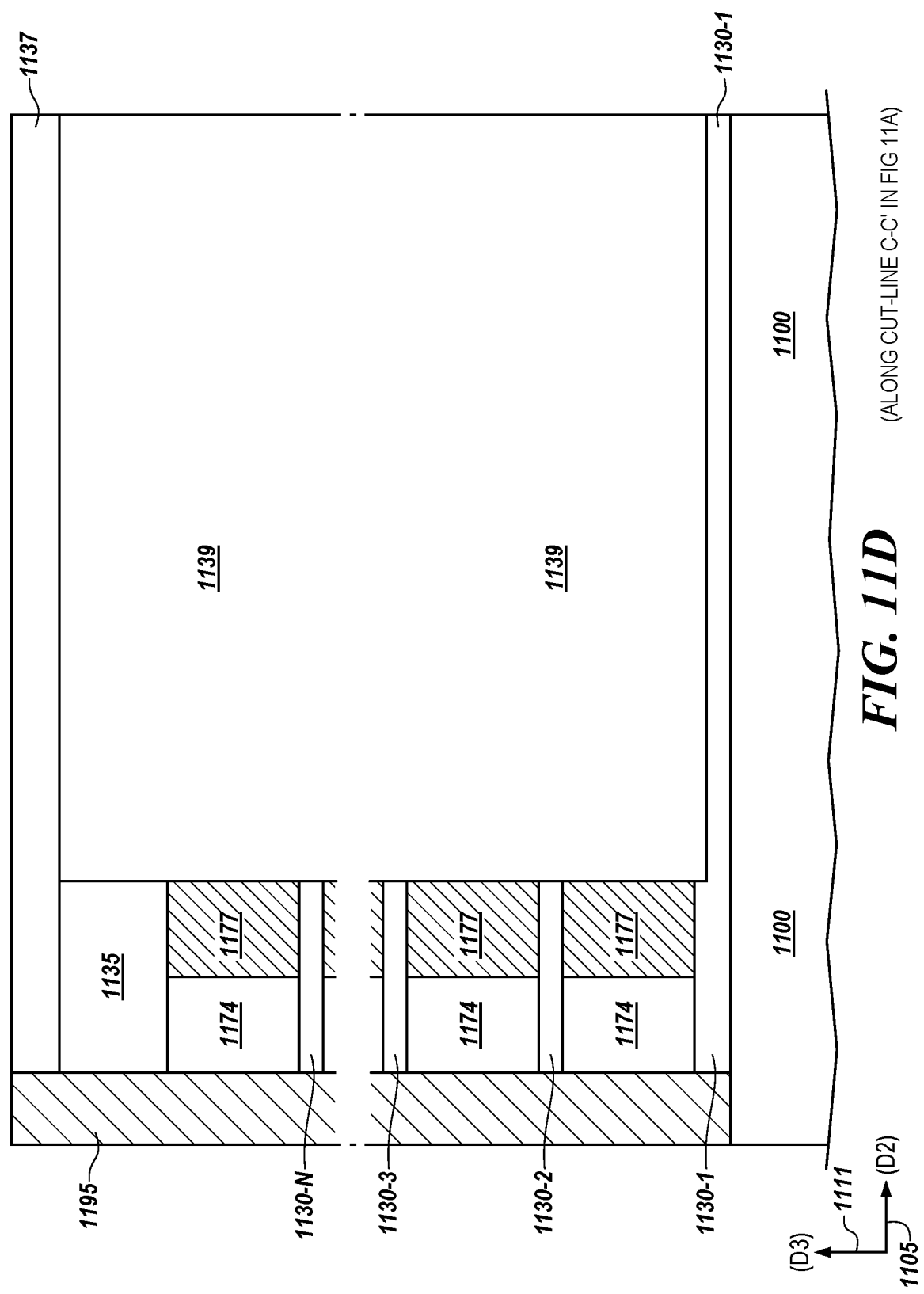

FIG. 11D illustrates a cross sectional view, taken along cut-line C-C' in FIG. 11A, showing another view of the semiconductor structure at this particular point in one example semiconductor fabrication process of an embodiment of the present disclosure. The cross sectional view shown in FIG. 11D is illustrated extending in the second horizontal direction (D2) 1105, left and right in the plane of the drawing sheet, along an axis of the repeating iterations of alternating layers of a first dielectric material, 1130-1, 1130-2, . . . , 1130-N, a second dielectric material, 1133-1, 1133-2, . . . , 1133-N a semiconductor material, 1132-1, 1132-2, . . . , 1132-N, and a third dielectric material, 1143-1, 1143-2, . . . 1143-N, outside of a region in which the horizontally oriented access devices and horizontally oriented storage nodes, e.g., capacitor cells, will be formed within the layers of semiconductor material, 1132-1, 1132-2, . . . , 1132-N. At the left end of the drawing sheet is shown the repeating iterations of alternating layers of a first dielectric material, 1130-1, 1130-2, . . . , 1130-N, a portion of the first conductive material, 1177-1, 1177-2, . . . , 1177-N, the deposited fifth dielectric material 1174, the deposited sixth dielectric material 1184, and the semiconductor material, 1132-1, 1132-2, . . . , 1132-N, at which location a horizontally oriented first conductive material, e.g., access lines 1177-1, 1177-2, . . . , 1177-N, shown in FIG. 1, et. seq., can be formed. The low doped semiconductor material 1132, though present, may be formed from a material too thin to see in this view and the fifth dielectric material 1174 and sixth dielectric material 1184 may be shown as one material dielectric material 1174 in this view.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

In some embodiments, a first conductive material 1177 may be illustrated adjacent second dielectric material 1133 and third dielectric material 1143. The first conductive material 1177 may be adjacent fourth dielectric material 1139. A high doped semiconductor material 1195 may be illustrated along the repeating iterations of alternating layers of a first dielectric material, 1130-1, 1130-2, . . . 1130-N, a portion of the first conductive material, 1177-1, 1177-2, . . . , 1177-N, the deposited fifth dielectric material 1174, the deposited sixth dielectric material 1284, and the semiconductor material, 1132-1, 1132-2, . . . , 1132-N.

Figure 11E:
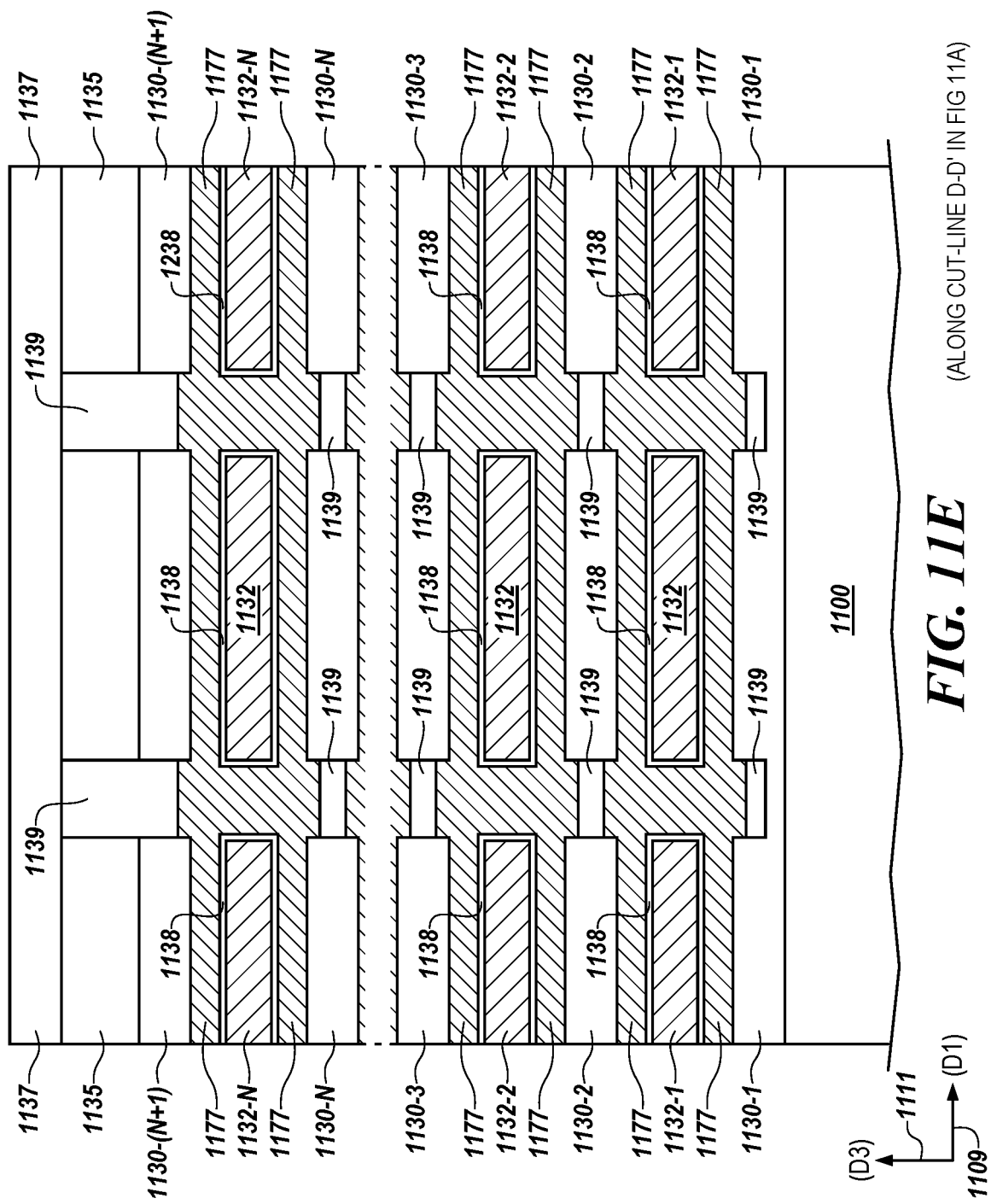

FIG. 11E illustrates a cross sectional view, taken along cut-line D-D' in FIG. 11A, showing another view of the semiconductor structure at this particular point in one example semiconductor fabrication process of an embodiment of the present disclosure. The cross sectional view shown in FIG. 11E is illustrated, right to left in the plane of the drawing sheet, extending in the first direction (D1) 1109 along an axis of the repeating iterations of alternating layers of a first dielectric material, 1130-1, 1130-2, . . . , 1130-N, a second dielectric material, 1133-1, 1133-2, . . . , 1133-N a semiconductor material, 1132-1, 1132-2, . . . , 1132-N, and a third dielectric material, 1143-1, 1143-2, . . . , 1143-N, intersecting across the plurality of separate, horizontal access lines, 1177-1, 1177-2, . . . , 1177-N, and intersecting regions of the semiconductor material, 1132-1, 1132-2, . . . , 1132-N, in which a channel region may be formed, separated from the plurality of separate, horizontal access lines, 1177-1, 1177-2, . . . , 1177-N, entwined into the gate dielectric 1138. In FIG. 11E, the first dielectric fill material 1139 is shown separating the space between neighboring horizontally oriented access devices which may be formed extending into and out from the plane of the drawing sheet as described in connection with FIGS. 4-9 and can be spaced along a first direction (D1) 1109 and stacked vertically in arrays extending in the third direction (D3) 1111 in the three dimensional (3D) memory.

Figure 12A:
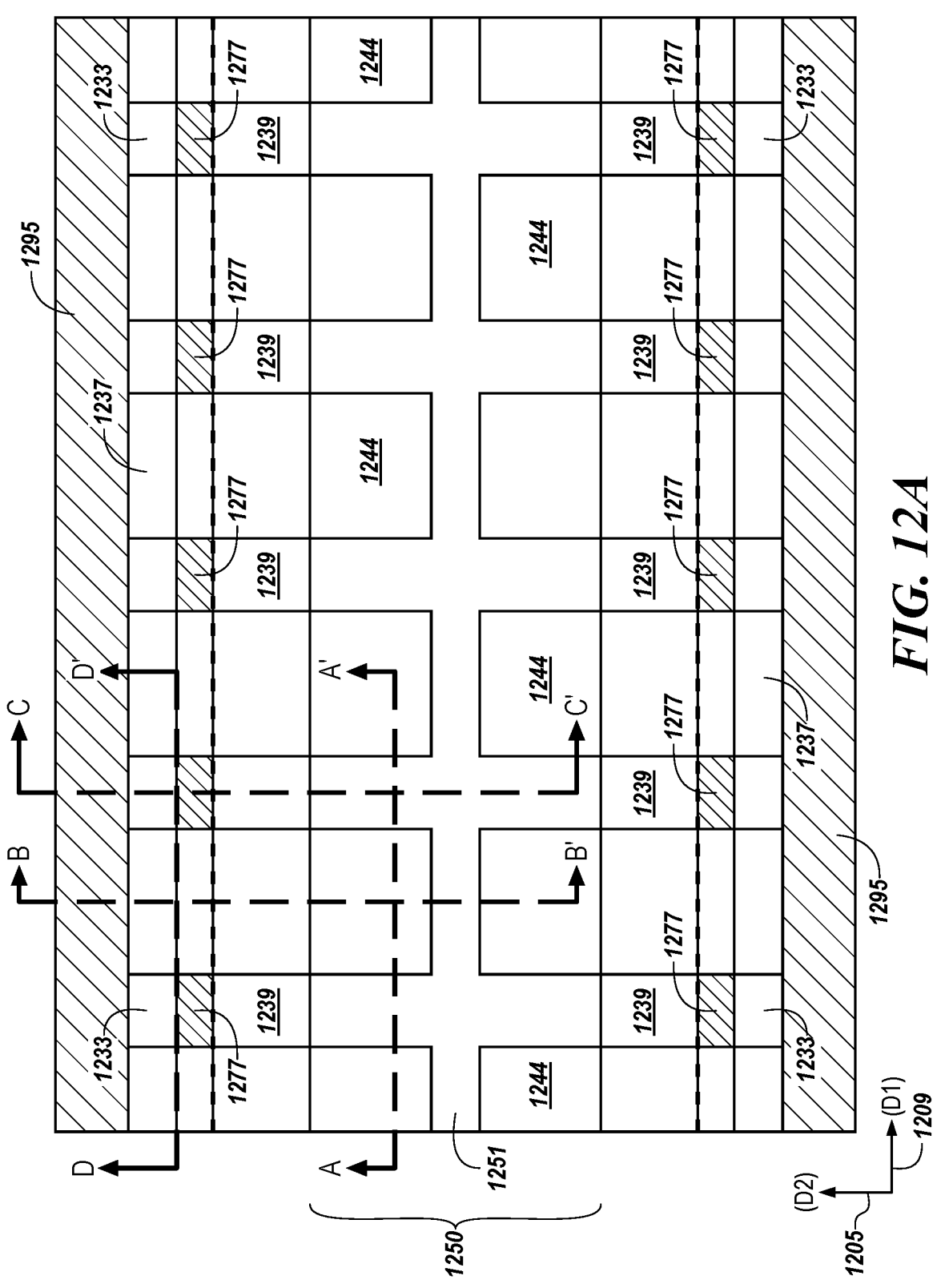
FIGS. 12A to 12E illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.

FIG. 12A illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure. FIG. 12A illustrates a top down view of a semiconductor structure, at a particular point in time, in a semiconductor fabrication process, according to one or more embodiments.

In the example embodiment of FIG. 12A, the method comprises using a photolithographic process to pattern the photolithographic mask 1237. The method in FIG. 12A further illustrates using one or more etchant processes to form a vertical opening 1251 in a storage node region 1250 (and 1244 in FIGS. 12A and 12C) through the vertical stack and extending predominantly in the first horizontal direction (D1) 1209. The one or more etchant processes forms a vertical opening 1251 to expose third sidewalls in the repeating iterations of alternating layers of a first dielectric material, 1230-1, 1230-2, . . . , 1230-N, a second dielectric material, 1233-1, 1233-2, . . . , 1233-N a semiconductor material, 1232-1, 1232-2, . . . , 1232-N, and a third dielectric material, 1243-1, 1243-2, . . . , 1243-N, in the vertical stack, shown in FIGS. 12B-12E, adjacent a second region of the semiconductor material. A first conductive material 1277 may be formed above the vertical opening 1251. A fifth dielectric material 1274 and sixth dielectric material 1284 may be formed above the first conductive material 1277. A low doped semiconductor material 1232 may be formed above the fifth dielectric material 1274 and sixth dielectric material 1284.

In some embodiments, this process is performed after selectively removing an access device region of the semiconductor material in which to form a first source/drain region, channel region, and second source/drain region of the horizontally oriented access devices, as illustrated in FIG. 10. According to an example embodiment, shown in FIGS. 12B-12E, the method comprises selectively etching the second region of the semiconductor material, 1232-1, 1232-2, . . . , 1232-N, to deposit a second source/drain region and capacitor cells through the second horizontal opening, which is a second horizontal distance back from a vertical opening 1251 in the vertical stack. In some embodiments, as shown in FIGS. 12B-12E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 1261 and a second electrode 1256 separated by a cell dielectric 1263. Other suitable semiconductor fabrication techniques and/or storage nodes structures may be used.

Figure 12B:
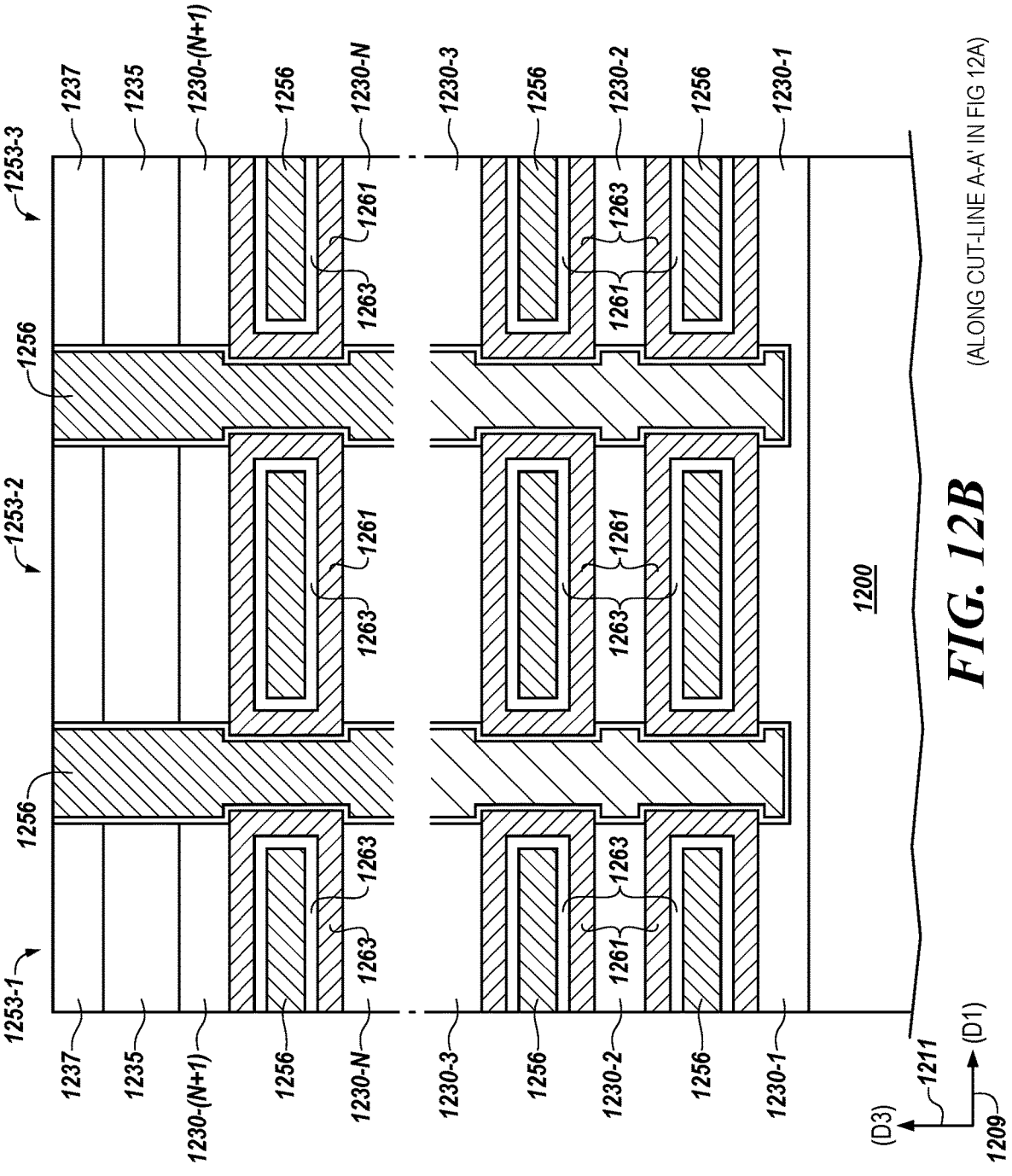

FIG. 12B illustrates a cross sectional view, taken along cut-line A-A' in FIG. 12A, showing another view of the semiconductor structure at this particular point in one example semiconductor fabrication process of an embodiment of the present disclosure. The cross sectional view shown in FIG. 12B is away from the plurality of separate, horizontal access lines, 1277-1, 1277-2, . . . 1277-N, 1277-(N+1), . . . , 1277-(Z–1), and shows repeating iterations of alternating layers of a dielectric material, 1230-1, 1230-2, . . . , 1230-(N+1), separated by horizontally oriented capacitor cells having first electrodes 1261, e.g., bottom cell contact electrodes, cell dielectrics 1263, and second electrodes 1256, e.g., top, common node electrodes, on a semiconductor substrate 1200 to form the vertical stack. As shown in FIG. 8B, a vertical direction 1211 is illustrated as a third direction (D3), e.g., z-direction in an x-y-z coordinate system, analogous to the third direction (D3) 1211, among first, second, and third directions, shown in FIGS. 1-3. The plane of the drawing sheet, extending right and left, is in a first direction (D1) 1209. In the example embodiment of FIG. 12B, the first electrodes 1261, e.g., bottom electrodes to be coupled to source/drain regions of horizontal access devices, and second electrodes 1256 are illustrated separated by a cell dielectric material 1263 extending into and out of the plane of the drawing sheet in second direction (D2) and along an axis of orientation of the horizontal access devices and horizontal storage nodes of the arrays of vertically stacked memory cells of the three dimensional (3D) memory.

Figure 12C:
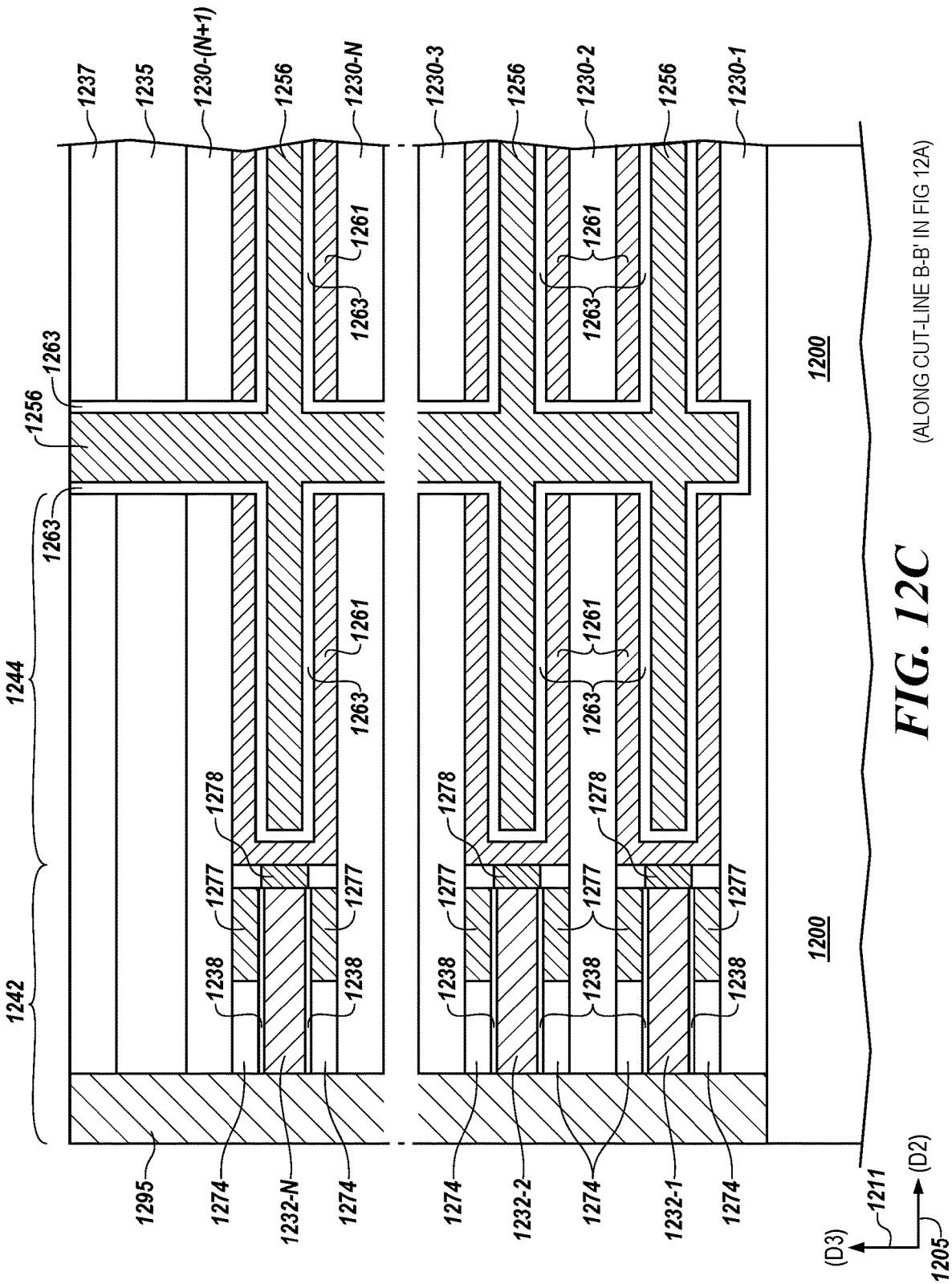

FIG. 12C illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 12C is illustrated extending in the second horizontal direction (D2) 1205, left and right along the plane of the drawing sheet, along an axis of the repeating iterations of alternating layers of a first dielectric material, 1230-1, 1230-2, . . . , 1230-N, a second dielectric material, 1233-1, 1233-2, . . . , 1233-N a semiconductor material, 1232-1, 1232-2, . . . , 1232-N, and a third dielectric material, 1243-1, 1243-2, . . . 1243-N, along and in which the horizontally oriented access devices and horizontally oriented storage nodes, e.g., capacitor cells, can be formed within the layers of semiconductor material, 1232-1, 1232-2, . . . , 1232-N. In the example embodiment of FIG. 12C, the horizontally oriented storage nodes, e.g., capacitor cells, are illustrated as having been formed in this semiconductor fabrication process and first electrodes 1261, e.g., bottom electrodes to be coupled to source/drain regions of horizontal access devices, and second electrodes 1256, e.g., top electrodes to be coupled to a common electrode plane such as a ground plane, separated by cell dielectrics 1263, are shown. However, embodiments are not limited to this example. In other embodiments, the first electrodes 1261, e.g., bottom electrodes to be coupled to source/drain regions of horizontal access devices, and second electrodes 1256, e.g., top electrodes to be coupled to a common electrode plane such as a ground plane, separated by cell dielectrics 1263, may be formed subsequent to forming a first source/drain region, a channel region, and a second source/drain region in a region of the semiconductor material, 1232-1, 1232-2, . . . 1232-N, intended for location, e.g., placement formation, of the horizontally oriented access devices, described next.

In the example embodiment of FIG. 12C, the horizontally oriented storage nodes having the first electrodes 1261, e.g., bottom electrodes to be coupled to source/drain regions of horizontal access devices, and second electrodes 1256, e.g., top electrodes to be coupled to a common electrode plane such as a ground plane, are shown formed in a second horizontal opening, extending in second direction (D2), left and right in the plane of the drawing sheet, a third distance from the vertical opening, e.g., 1251 in FIG. 12B, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 12C, a neighboring, opposing horizontal access line 1277 is illustrated by a dashed line indicating a location set inward from the plane and orientation of the drawing sheet.

In some embodiments, the fifth dielectric material 1274 and sixth dielectric material 1284 may be below the first dielectric material 1230 while remaining in direct contact with the low doped semiconductor material 1232. In one embodiment, the fifth dielectric material 1274 may be below the first dielectric material 1230, above the low doped semiconductor material 1232 while the sixth dielectric material 1284 may be below the low doped semiconductor material 1232, above the low doped semiconductor material 1032. The fifth dielectric material 1274 and sixth dielectric material 1284 may be in contact with a high doped, p-type (p+) silicon material 1295, e.g., the body region contact of the horizontally oriented access device.

Figure 12D:
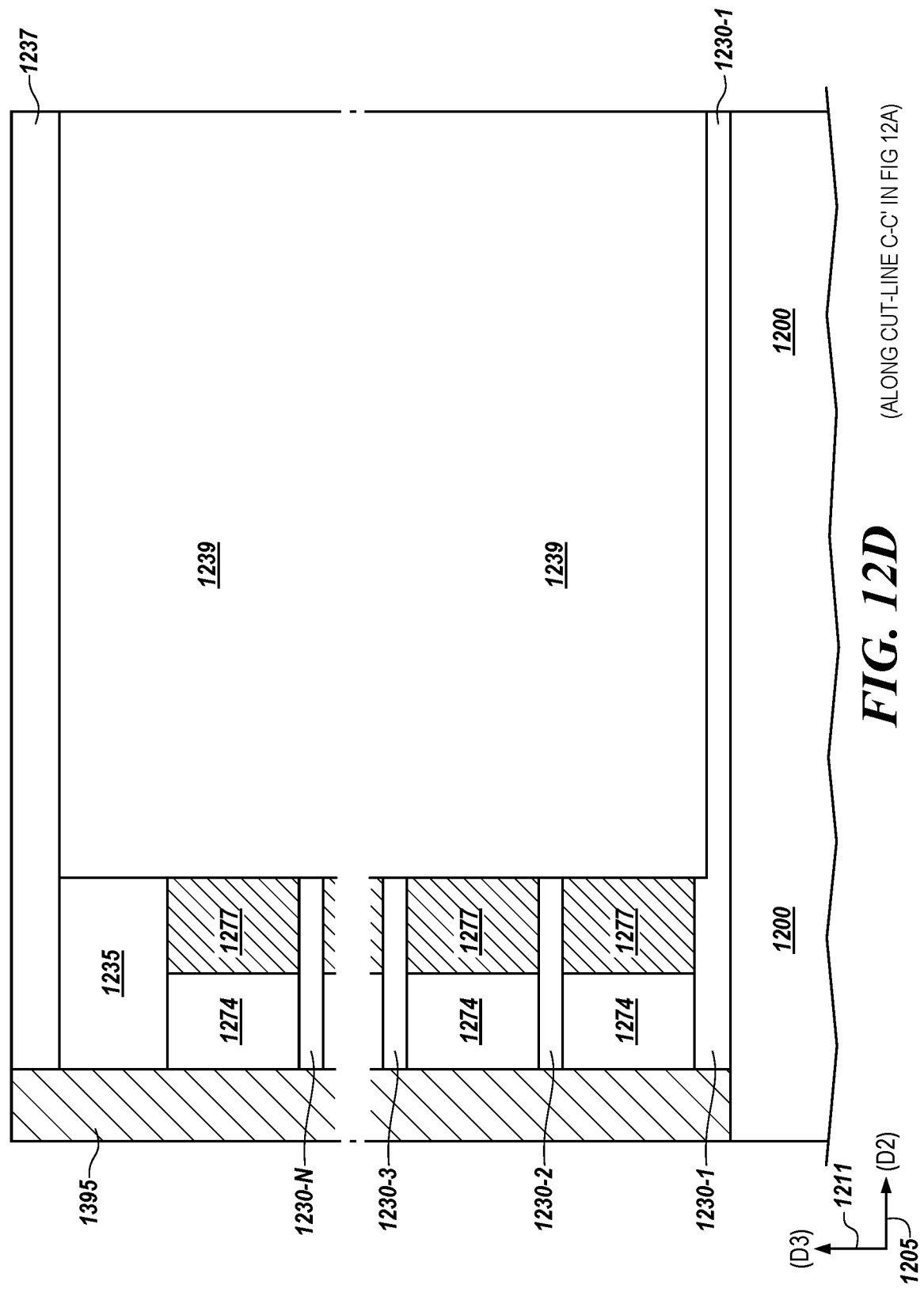

FIG. 12D illustrates a cross sectional view, taken along cut-line C-C' in FIG. 12A, showing another view of the semiconductor structure at this particular point in one example semiconductor fabrication process of an embodiment of the present disclosure. The cross sectional view shown in FIG. 12D is illustrated extending in the second horizontal direction (D2) 1205, left and right in the plane of the drawing sheet, along an axis of the repeating iterations of alternating layers of a first dielectric material, 1230-1, 1230-2, . . . , 1230-N, a second dielectric material, 1233-1, 1233-2, . . . , 1233-N a semiconductor material, 1232-1, 1232-2, . . . , 1232-N, and a third dielectric material, 1243-1, 1243-2, . . . , 1243-N, outside of a region in which the horizontally oriented access devices and horizontally oriented storage nodes, e.g., capacitor cells, will be formed within the layers of semiconductor material, 1232-1, 1232-2, . . . , 1232-N. In FIG. 12D, the fourth dielectric material 1239 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 12D, the second electrode 1256, e.g., top, common electrode to a capacitor cell structure, is additionally shown present in the space between horizontally neighboring devices. At the left end of the drawing sheet is shown the repeating iterations of alternating layers of a first dielectric material, 1230-1, 1230-2, . . . 1230-N, a portion of the first conductive material, 1277-1, 1277-2, . . . , 1277-N, the deposited fifth dielectric material 1274, the deposited sixth dielectric material 1284, and the semiconductor material, 1232-1, 1232-2, . . . , 1232-N, at which location a vertically oriented digit line, e.g., digit lines 107-1, 107-2, . . . , 107-P shown in FIG. 1, et. seq., can be integrated to form electrical contact with the second source/drain regions or digit line conductive contact material, described in more detail below. The low doped semiconductor material 1232, though present, may be formed from a material too thin to see in this view and the fifth dielectric material 1274 and sixth dielectric material 1284 may be shown as one material dielectric material 1274 in this view.

In some embodiments, a first conductive material 1277 may be illustrated adjacent fifth dielectric material 1274, the sixth dielectric material 1284. The fifth dielectric material 1274 and sixth dielectric material 1284 may be shown as one material dielectric material 1274 in this view. A body contact region 1295 may also be illustrated along the repeating iterations of alternating layers of a first dielectric material, 1230-1, 1230-2, . . . , 1230-N, a second dielectric material, 1233-1, 1233-2, . . . , 1233-N a semiconductor material, 1232-1, 1232-2, . . . , 1232-N, and a third dielectric material, 1243-1, 1243-2, . . . , 1243-N.

Figure 12E:
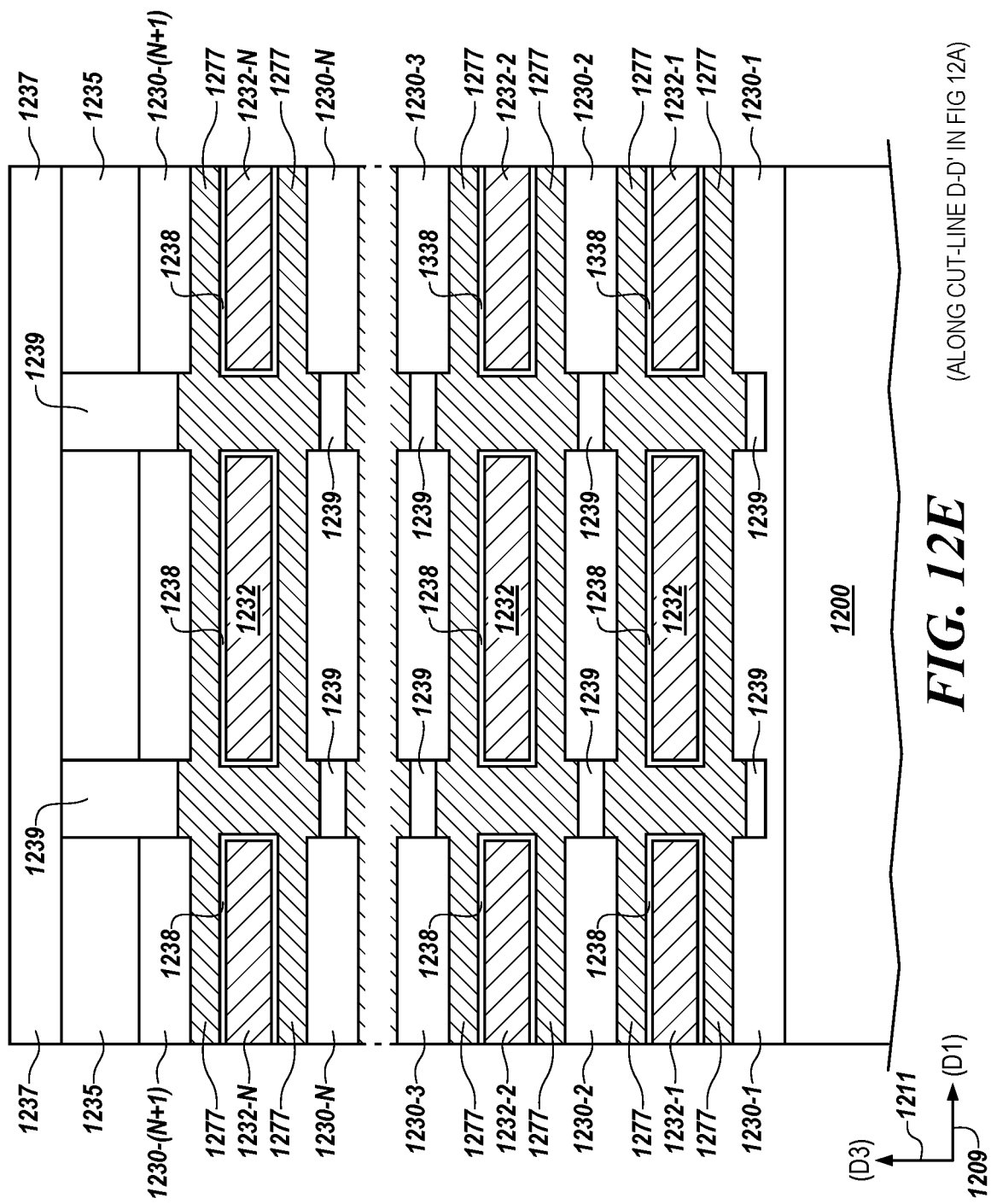

FIG. 12E illustrates a cross sectional view, taken along cut-line D-D' in FIG. 12A, showing another view of the semiconductor structure at this particular point in one example semiconductor fabrication process of an embodiment of the present disclosure. The cross sectional view shown in FIG. 12E is illustrated, right to left in the plane of the drawing sheet, extending in the first direction (D1) 1209 along an axis of the repeating iterations of alternating layers of a first dielectric material, 1230-1, 1230-2, . . . , 1230-N, a second dielectric material, 1233-1, 1233-2, . . . , 1233-N a semiconductor material, 1232-1, 1232-2, . . . , 1232-N, and a third dielectric material, 1243-1, 1243-2, . . . , 1243-N, intersecting across the plurality of separate, horizontal access lines 1277, and intersecting regions of the semiconductor material, 1232-1, 1232-2, . . . , 1232-N, in which a channel region may be formed, separated from the plurality of separate, horizontal access lines, 1277-1, 1277-2, . . . , 1277-N, by the gate dielectric 1238. In FIG. 12E, the first dielectric fill material 1239 is shown separating the space between neighboring horizontally oriented access devices and horizontally oriented storage nodes, which may be formed extending into and out from the plane of the drawing sheet as described in more detail below, and can be spaced along a first direction (D1) 1209 and stacked vertically in arrays extending in the third direction (D3) 1211 in the three dimensional (3D) memory.

Figure 13A:
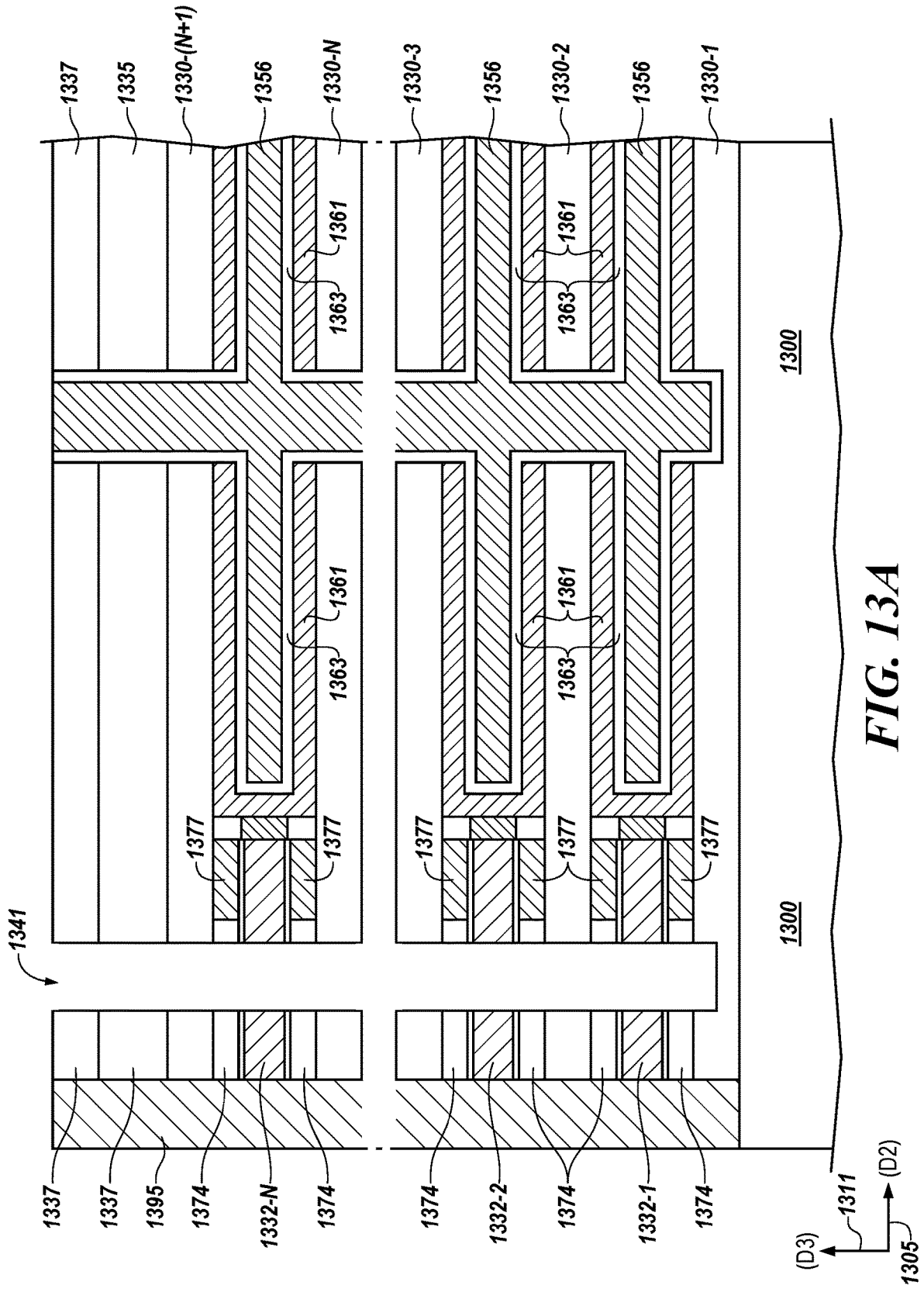
FIGS. 13A to 13B illustrate cross sectional views of an example horizontally oriented access device coupled to a horizontally oriented access lines, having vertical digit lines for semiconductor devices, in accordance with a number of embodiments of the present disclosure.

FIG. 13A illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 13A is illustrated extending in the second horizontal direction (D2) 1305, left and right along the plane of the drawing sheet, along an axis of the repeating iterations of alternating layers of a first dielectric material, 1330-1, 1330-2, . . . , 1330-N, a second dielectric material, 1333-1, 1333-2, . . . , 1333-N a semiconductor material, 1332-1, 1332-2, . . . , 1332-N, and a third dielectric material, 1343-1, 1343-2, . . . , 1343-N, along and in which the horizontally oriented access devices and horizontally oriented storage nodes, e.g., capacitor cells, can be formed within the layers of semiconductor material, 1332-1, 1332-2, . . . , 1332-N. In the example embodiment of FIG. 13A, the horizontally oriented storage nodes, e.g., capacitor cells, are illustrated as having been formed been formed in this semiconductor fabrication process and first electrodes 1361, e.g., bottom electrodes to be coupled to source/drain regions of horizontal access devices, and second electrodes 1356, e.g., top electrodes to be coupled to a common electrode plane such as a ground plane, separated by cell dielectrics 1363, are shown. However, embodiments are not limited to this example. In other embodiments, the first electrodes 1361, e.g., bottom electrodes to be coupled to source/drain regions of horizontal access devices, and second electrodes 1356, e.g., top electrodes to be coupled to a common electrode plane such as a ground plane, separated by cell dielectrics 1363, may be formed subsequent to forming a first source/drain region, a channel region, and a second source/drain region in a region of the semiconductor material, 1332-1, 1332-2, . . . , 1332-N, intended for location, e.g., placement formation, of the horizontally oriented access devices, described next.

In the example embodiment of FIG. 13A, the horizontally oriented storage nodes having the first electrodes 1361, e.g., bottom electrodes to be coupled to source/drain regions of horizontal access devices, and second electrodes 1356, e.g., top electrodes to be coupled to a common electrode plane such as a ground plane, are shown formed in a second horizontal opening, e.g., 1179 shown in FIG. 11C, extending in second direction (D2), left and right in the plane of the drawing sheet, a third distance from the vertical opening, e.g., 1151 in FIG. 11C, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 13A, a neighboring, horizontal access line 1377 is illustrated adjacent the second dielectric material, 1333-1, 1333-2, . . . , 1333-N, the third dielectric material, 1343-1, 1343-2, . . . 1343-N, the fifth dielectric material 1374, and sixth dielectric material 1384-1, 1374-2, . . . , 1374-N, with a portion of the first conductive material 1377-1 located above the semiconductor material, 1332-1, 1332-2, . . . , 1332-N, and a portion of the first conductive material 1377-2 located below the semiconductor material, 1332-1, 1332-2, . . . , 1332-N indicating a location set inward from the plane and orientation of the drawing sheet.

In some embodiments, the fifth dielectric material 1374 may be below the first dielectric material 1330, above the low doped semiconductor material 1332 while the sixth dielectric material 1384 may be below the low doped semiconductor material 1332, above the low doped semiconductor material 1332 while remaining in direct contact with the first conductive material 1377, and the low doped semiconductor material 1332. An opening where second conductive material 1341 may be vertically deposited is shown.

Figure 13B:
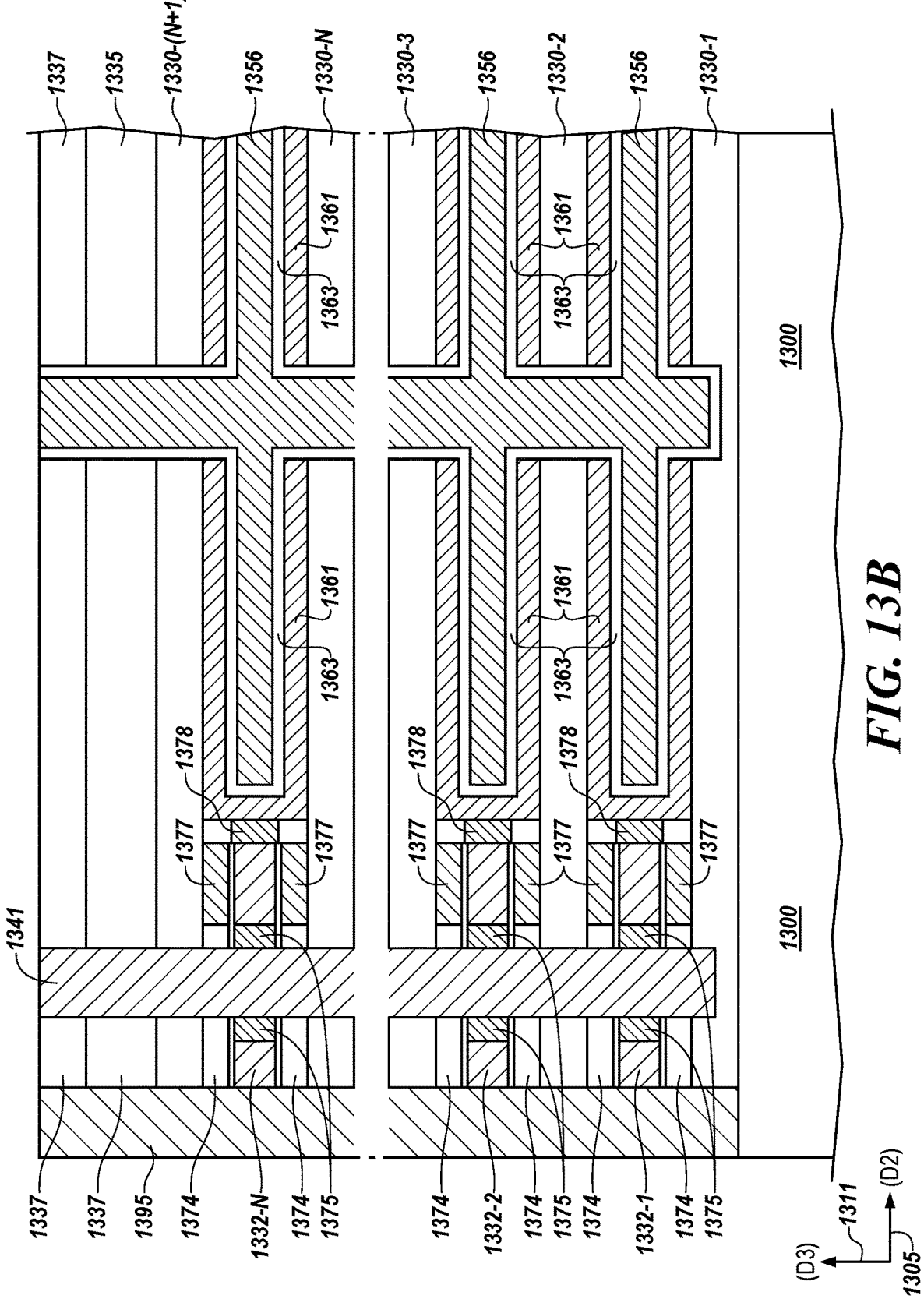

FIG. 13B illustrates an alternate cross sectional view, taken along cut-line B-B' in FIG. 12A, showing another view of the semiconductor structure at this particular point in one example semiconductor fabrication process of an embodiment of the present disclosure. The cross sectional view shown in FIG. 13B is illustrated extending in the second horizontal direction (D2) 1305, left and right along the plane of the drawing sheet, along an axis of the repeating iterations of alternating layers of a first dielectric material, 1330-1, 1330-2, . . . , 1330-N, a second dielectric material, 1333-1, 1333-2, . . . , 1333-N a semiconductor material, 1332-1, 1332-2, . . . , 1332-N, and a third dielectric material, 1343-1, 1343-2, . . . , 1343-N, along and in which the horizontally oriented access devices and horizontally oriented storage nodes, e.g., capacitor cells, can be formed within the layers of semiconductor material, 1332-1, 1332-2, . . . , 1332-N. In the example embodiment of FIG. 13B, the horizontally oriented storage nodes, e.g., capacitor cells, are illustrated as having been formed in this semiconductor fabrication process and first electrodes 1361, e.g., bottom electrodes to be coupled to source/drain regions of horizontal access devices, and second electrodes 1356, e.g., top electrodes to be coupled to a common electrode plane such as a ground plane, separated by cell dielectrics 1363, are shown. However, embodiments are not limited to this example. In other embodiments, the first electrodes 1361, e.g., bottom electrodes to be coupled to source/drain regions of horizontal access devices, and second electrodes 1356, e.g., top electrodes to be coupled to a common electrode plane such as a ground plane, separated by cell dielectrics 1363, may be formed subsequent to forming a first source/drain region, a channel region, and a second source/drain region in a region of the semiconductor material, 1332-1, 1332-2, . . . , 1332-N, intended for location, e.g., placement formation, of the horizontally oriented access devices, described next.

In the example embodiment of FIG. 13B, the horizontally oriented storage nodes having the first electrodes 1361, e.g., bottom electrodes to be coupled to source/drain regions of horizontal access devices, and second electrodes 1356, e.g., top electrodes to be coupled to a common electrode plane such as a ground plane, are shown formed in a second horizontal opening, extending in second direction (D2), left and right in the plane of the drawing sheet, a third distance from the vertical opening, e.g., 1251 in FIG. 12B, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 13B, a neighboring, horizontal access line 1377 is illustrated adjacent the second dielectric material, 1333-1, 1333-2, . . . 1333-N, third dielectric material, 1343-1, 1343-2, . . . , 1343-N, the fifth dielectric material 1374 and sixth dielectric material 1384, with a portion of first conductive material 1377-1 located above the semiconductor material, 1332-1, 1332-2, . . . , 1332-N and a portion of first conductive material 1377-2 below the semiconductor material, 1332-1, 1332-2, . . . , 1332-N, indicating a location set inward from the plane and orientation of the drawing sheet.

The first conductive material 1377 may remain in direct electrical contact on a top surface of the semiconductor material, 1332-1, 1332-2, . . . , 1332-N. In some embodiments, the fifth dielectric material 1074 may be below the first dielectric material 1030, above the low doped semiconductor material 1032 while the sixth dielectric material 1084 may be below the low doped semiconductor material 1032, above the low doped semiconductor material 1032. In some embodiments, the fifth dielectric material 1374 and sixth dielectric material 1384 may be formed below the first dielectric material 1330 while remaining in direct contact with the first conductive material 1377, the first source/drain region 1375, and the low doped semiconductor material 1332.

The second conductive material 1341 may be formed as a vertical digit line adjacent first conductive material 1377-1, 1377-2, . . . , 1377-N and high doped semiconductor material 1395 in second vertical opening 1370. The second conductive material 1341 may intersect first dielectric material, 1330-1, 1330-2, . . . , 1330-N, the fifth dielectric material 1374, the sixth dielectric material 1384, and low doped semiconductor material 1332-1, 1332-2, . . . , 1332-N. The second conductive material 1341 may form vertically oriented digit lines adjacent a first source/drain region 1375.

In some embodiments, the second conductive material 1341 may be formed from a silicide. In some embodiments, the second conductive material 1341 may comprise a titanium material. In some embodiments, the second conductive material 1341 may comprise a titanium nitride (TiN) material. In some embodiments, the second conductive material 1341 may comprise a Ruthenium (Ru) material. In some embodiments, the second conductive material 1341 may be tungsten (W).

In one embodiment, the second conductive material 1341 may be formed by gas phase doping a high energy gas phase dopant, such as phosphorus (P) atoms, as impurity dopants, at a high plasma energy such as PECVD to form a high concentration, n-type doped (n+) region within the third vertical opening 1381. A polysilicon material may be deposited into the third vertical opening 1381. For example, a highly phosphorus (P) doped (n+) poly-silicon germanium (SiGe) material into the third vertical openings 1381 to form the second conductive material 1341.

The first source/drain region 1375 may be formed by out-diffusing n-type (n+) dopants into the semiconductor material, 1332-1, 1332-2, . . . , 1332-N. In one embodiment, the plurality of patterned third vertical openings may be adjacent the first source/drain region 1375 and the high concentration, n-type dopant may be out-diffused into the low doped semiconductor material, 1332-1, 1332-2, . . . , 1332-N, to form the first source/drain region 1375. The first source/drain region 1375 may be formed on the low doped semiconductor material 1332, on both sides of vertical second conductive material 1341. Fourth dielectric material 1374 may be below the first dielectric material 1330 while remaining in direct contact with the first conductive material 1377, the first source/drain region, and the low doped semiconductor material 1332.

Figure 14A:
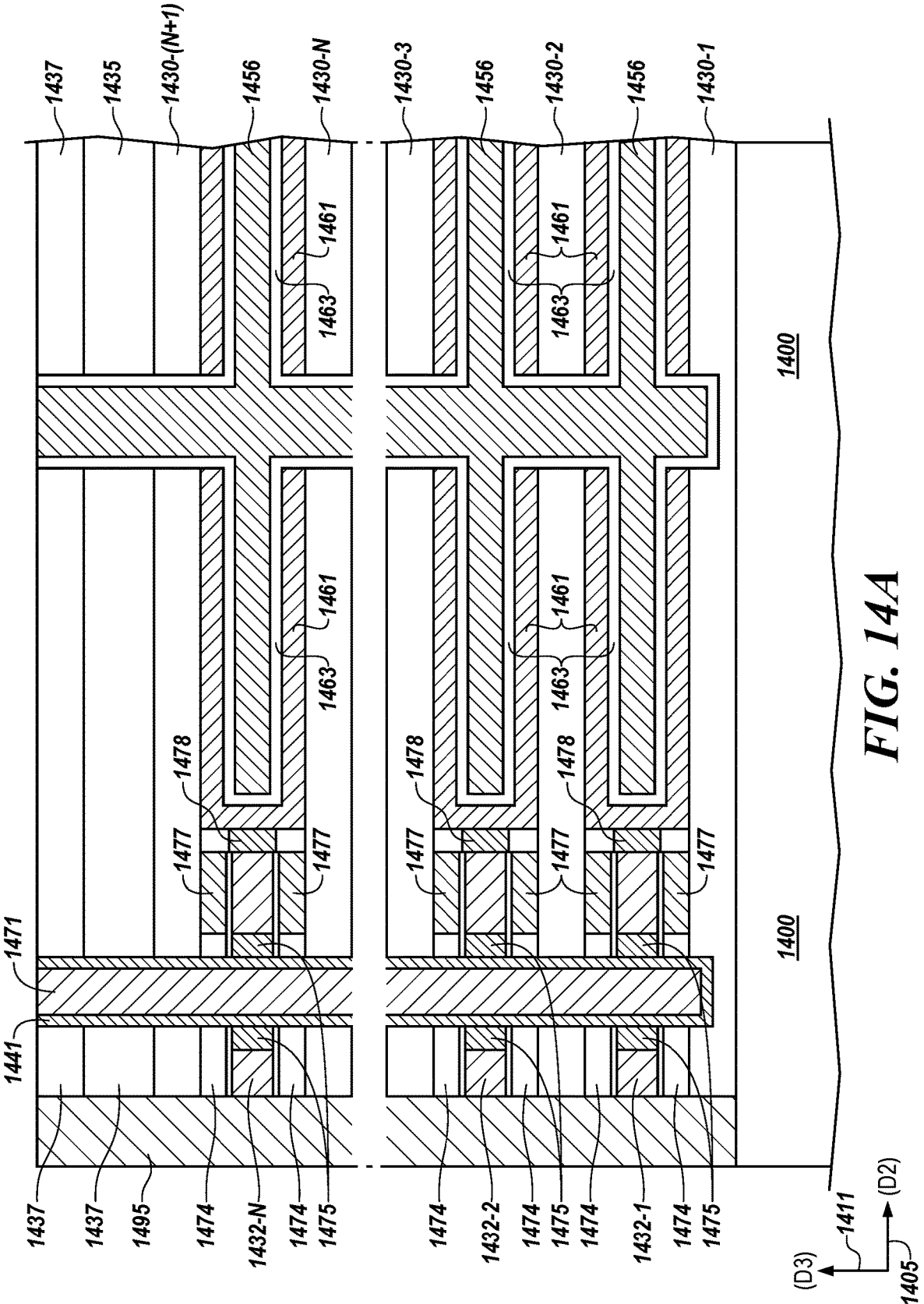
FIGS. 14A to 14B illustrate cross sectional views of an example horizontally oriented access device coupled to a horizontally oriented access lines, having vertical digit lines for semiconductor devices, in accordance with a number of embodiments of the present disclosure.

FIG. 14A illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 14A is illustrated extending in the second horizontal direction (D2) 1405, left and right along the plane of the drawing sheet, along an axis of the repeating iterations of alternating layers of a first dielectric material, 1430-1, 1430-2, . . . , 1430-N, a second dielectric material, 1433-1, 1433-2, . . . , 1433-N a semiconductor material, 1432-1,

1432-2, . . . , 1432-N, and a third dielectric material, 1443-1, 1443-2, . . . , 1443-N, along and in which the horizontally oriented access devices and horizontally oriented storage nodes, e.g., capacitor cells, can be formed within the layers of semiconductor material, 1432-1, 1432-2, . . . , 1432-N. In the example embodiment of FIG. 14A, the horizontally oriented storage nodes, e.g., capacitor cells, are illustrated as having been formed in this semiconductor fabrication process and first electrodes 1461, e.g., bottom electrodes to be coupled to source/drain regions of horizontal access devices, and second electrodes 1456, e.g., top electrodes to be coupled to a common electrode plane such as a ground plane, separated by cell dielectrics 1463, are shown. However, embodiments are not limited to this example. In other embodiments the first electrodes 1461, e.g., bottom electrodes to be coupled to source/drain regions of horizontal access devices, and second electrodes 1456, e.g., top electrodes to be coupled to a common electrode plane such as a ground plane, separated by cell dielectrics 1463, may be formed subsequent to forming a first source/drain region 1475, a channel region, and a second source/drain region in a region of the semiconductor material, 1432-1, 1432-2, . . . , 1432-N, intended for location, e.g., placement formation, of the horizontally oriented access devices, described next.

In the example embodiment of FIG. 14A, the horizontally oriented storage nodes having the first electrodes 1461, e.g., bottom electrodes to be coupled to source/drain regions of horizontal access devices, and second electrodes 1456, e.g., top electrodes to be coupled to a common electrode plane such as a ground plane, are shown formed in a second horizontal opening, e.g., 1179 shown in FIG. 11C, extending in second direction (D2), left and right in the plane of the drawing sheet, a third distance from the vertical opening, e.g., 1151 in FIG. 11C, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 14A, a neighboring, horizontal access line 1477 is illustrated adjacent the second dielectric material, 1433-1, 1433-2, . . . , 1433-N, a third dielectric material, 1443-1, 1443-2, . . . , 14743-N, the fifth dielectric material 1474, and sixth dielectric material 1484 with a portion of first conductive material 1477-1 located above the semiconductor material, 1432-1, 1432-2, . . . , 1432-N, and a portion of first conductive material 1477-2 located below the semiconductor material, 1432-1, 1432-2, . . . , 1432-N, indicating a location set inward from the plane and orientation of the drawing sheet.

In some embodiments, the fifth dielectric material 1474 may be below the first dielectric material 1430, above the low doped semiconductor material 1432 while the sixth dielectric material 1484 may be below the low doped semiconductor material 1432, above the low doped semiconductor material 1432. In some embodiments, the fifth dielectric material 1474 and sixth dielectric material 1484 may be below the first dielectric material 1430 while remaining in direct contact with the first conductive material 1477 and the low doped semiconductor material 1432. The first source/drain region 1475 may be formed on the low doped semiconductor material 1432, on both sides of vertical second conductive material 1441.

A metal material 1471 may be deposited into the third vertical opening 1481. In some embodiments, the metal material 1471 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof.

The second conductive material 1441 may be formed vertically through a third vertical openings 1481, on the outside of the metal material 1471. The second conductive material 1441 may be formed from a high concentration, n-type dopant. The high concentration, n-type dopant may be formed by depositing a polysilicon material onto the second conductive material 1441. For example, the high concentration, n-type dopant may be formed by depositing a highly phosphorus (P) doped (n+) poly-silicon germanium (SiGe) material onto the second conductive material 1441. The second conductive material 1441 coupled to the metal material 1471 may be formed vertically adjacent first conductive material 1477-1, 1477-2, . . . , 1477-N and high doped semiconductor material 1495 in second vertical opening 1470. The second conductive material 1441 coupled with the metal material 1471 may intersect first dielectric material, 1430-1, 1430-2, . . . , 1430-N, first source/drain region 1475, the fifth dielectric material 1474 and sixth dielectric material 1484, and low doped semiconductor material 1432-1, 1432-2, . . . , 1432-N.

Figure 14B:
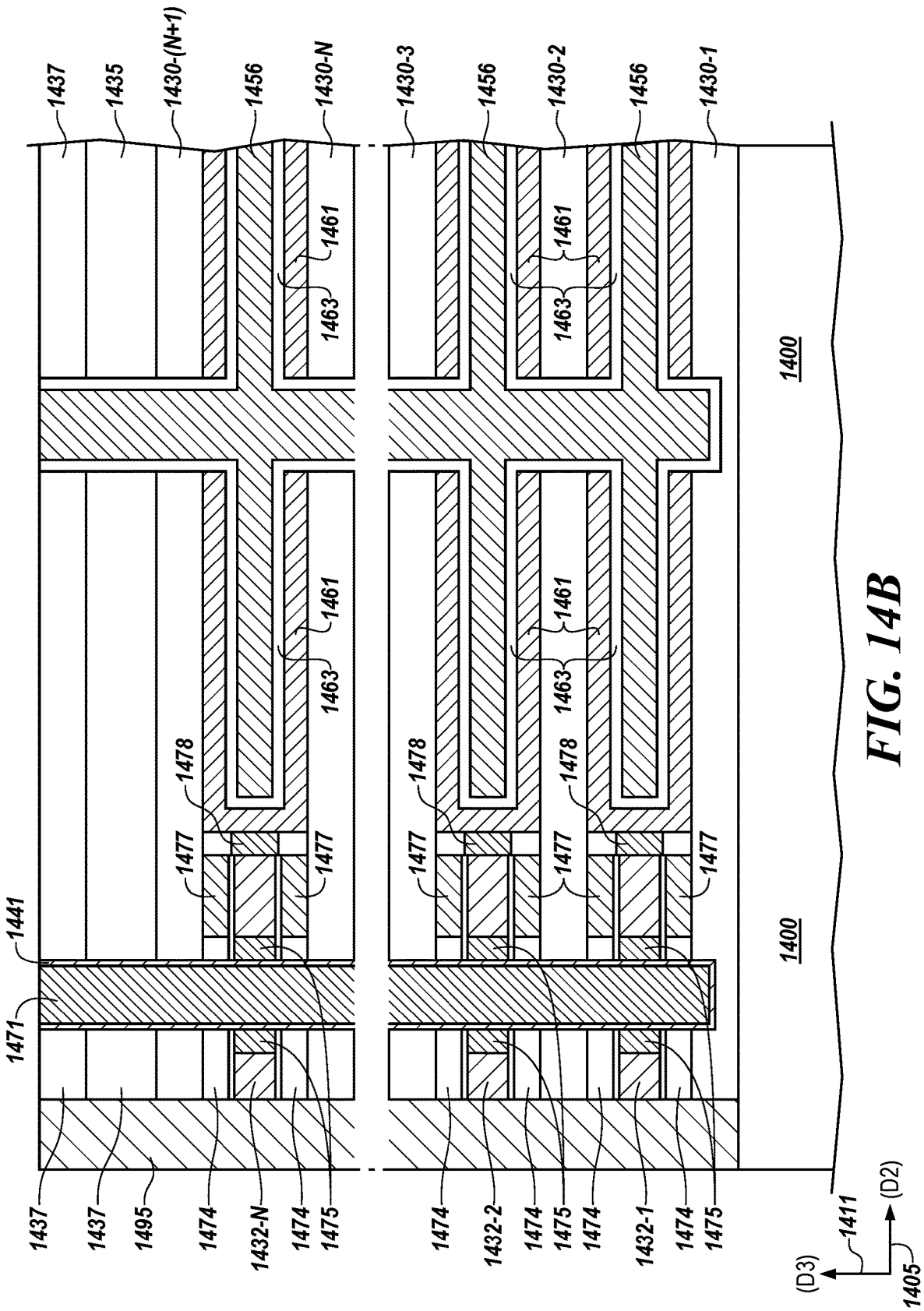

FIG. 14B illustrates an alternate cross sectional view, taken along cut-line B-B' in FIG. 12A, showing another view of the semiconductor structure at this particular point in one example semiconductor fabrication process of an embodiment of the present disclosure. The cross sectional view shown in FIG. 14B is illustrated extending in the second horizontal direction (D2) 1405, left and right along the plane of the drawing sheet, along an axis of the repeating iterations of alternating layers of a first dielectric material, 1430-1, 1430-2, . . . , 1430-N, a second dielectric material, 1433-1, 1433-2, . . . , 1433-N a semiconductor material, 1432-1, 1432-2, . . . , 1432-N, and a third dielectric material, 1443-1, 1443-2, . . . , 1443-N, along and in which the horizontally oriented access devices and horizontally oriented storage nodes, e.g., capacitor cells, can be formed within the layers of semiconductor material, 1432-1, 1432-2, . . . , 1432-N. In the example embodiment of FIG. 14B, the horizontally oriented storage nodes, e.g., capacitor cells, are illustrated as having been formed in this semiconductor fabrication process and first electrodes 1461, e.g., bottom electrodes to be coupled to source/drain regions of horizontal access devices, and second electrodes 1456, e.g., top electrodes to be coupled to a common electrode plane such as a ground plane, separated by cell dielectrics 1463, are shown. However, embodiments are not limited to this example. In other embodiments the first electrodes 1461, e.g., bottom electrodes to be coupled to source/drain regions of horizontal access devices, and second electrodes 1456, e.g., top electrodes to be coupled to a common electrode plane such as a ground plane, separated by cell dielectrics 1463, may be formed subsequent to forming a second conductive material coupled to a source/drain region and a channel region, in a region of the semiconductor material, 1432-1, 1432-2, . . . , 1432-N, intended for location, e.g., placement formation, of the horizontally oriented access devices, described next.

In the example embodiment of FIG. 14B, the horizontally oriented storage nodes having the first electrodes 1461, e.g., bottom electrodes to be coupled to source/drain regions of horizontal access devices, and second electrodes 1456, e.g., top electrodes to be coupled to a common electrode plane such as a ground plane, are shown formed in a second horizontal opening, e.g., 1179 shown in FIG. 11C, extending in second direction (D2), left and right in the plane of the drawing sheet, a third distance from the vertical opening, e.g., 1151 in FIG. 11C, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 14B, a neighboring, horizontal access line 1477-3 is illustrated adjacent the second dielectric material, 1433-1, 1433-2, . . . , 1433-N, a third dielectric material, 1443-1, 1443-2, . . . , 1443-N and the fifth dielectric material 1474 and sixth dielectric material 1484, with a portion of the first conductive material 1477-1 located above the semiconductor material, 1432-1, 1432-2, . . . , 1432-N and a portion of the first conductive material 1477-2 located below the semiconductor material, 1432-1, 1432-2, . . . , 1432-N, indicating a location set inward from the plane and orientation of the drawing sheet.

In some embodiments, the fifth dielectric material 1474 may be below the first dielectric material 1430, above the low doped semiconductor material 1432 while the sixth dielectric material 1484 may be below the low doped semiconductor material 1432, above the low doped semiconductor material 1432. In some embodiments, the fifth dielectric material 1474 and sixth dielectric material 1484 may be below the first dielectric material 1430 while remaining in direct contact with the first conductive material 1477 and the low doped semiconductor material 1432. The first source/drain region 1475 may be formed on the low doped semiconductor material 1432, on both sides of vertical second conductive material 1441.

A metal material 1471 may be deposited into the third vertical opening 1481. In some embodiments, the metal material 1471 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof.

The second conductive material 1441 may be coupled indistinguishably with the metal material 1471 within third vertical openings 1481. The second conductive material 1441 may be formed from a high concentration, n-type dopant. The high concentration, n-type dopant may be formed by depositing a polysilicon material onto the second conductive material 1441. For example, the high concentration, n-type dopant may be formed by depositing a highly phosphorus (P) doped (n+) poly-silicon germanium (SiGe) material onto the second conductive material 1441. The second conductive material 1441 coupled to the metal material 1471 may be formed vertically adjacent first conductive material 1477-1, 1477-2, . . . , 1477-N and high doped semiconductor material 1495 in second vertical opening 1470. The second conductive material 1441 coupled with the metal material 1471 may intersect first dielectric material, 1430-1, 1430-2, . . . , 1430-N, first source/drain region 1475, the fifth dielectric material 1474 and sixth dielectric material 1484, and low doped semiconductor material 1432-1, 1432-2, . . . , 1432-N.

Figure 15:
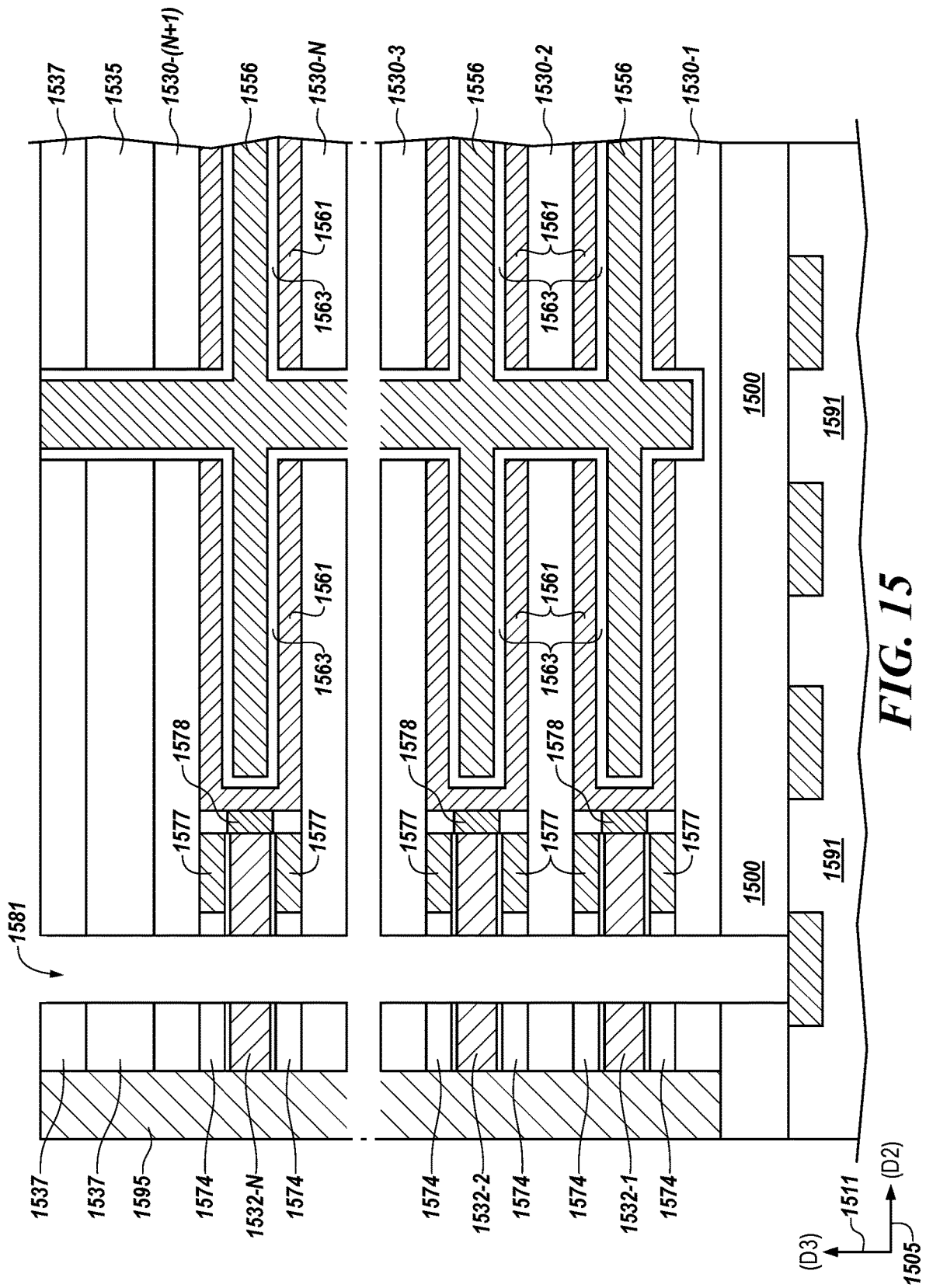
FIG. 15 illustrates a cross sectional view of an example horizontally oriented access device coupled to a horizontally oriented access lines, having vertical digit lines for semiconductor devices, in accordance with a number of embodiments of the present disclosure.

FIG. 15 illustrates an alternate cross sectional view, taken along cut-line B-B' in FIG. 12A, showing a view of the semiconductor structure at this particular point in one example semiconductor fabrication process of an embodiment of the present disclosure. The cross sectional view shown in FIG. 15 is illustrated extending in the second horizontal direction (D2) 1505, left and right along the plane of the drawing sheet, along an axis of the repeating iterations of alternating layers of a first dielectric material, 1530-1, 1530-2, . . . , 1530-N, a second dielectric material, 1533-1, 1533-2, . . . , 1533-N a semiconductor material, 1532-1, 1532-2, . . . , 1532-N, and a third dielectric material, 1543-1, 1543-2, . . . 1543-N, along and in which the horizontally oriented access devices and horizontally oriented storage nodes, e.g., capacitor cells, can be formed within the layers of semiconductor material, 1532-1, 1532-2, . . . , 1532-N. In the example embodiment of FIG. 15, the horizontally oriented storage nodes, e.g., capacitor cells, are illustrated as having been formed in this semiconductor fabrication process and first electrodes 1561, e.g., bottom electrodes to be coupled to source/drain regions of horizontal access devices, and second electrodes 1556, e.g., top electrodes to be coupled to a common electrode plane such as a ground plane, separated by cell dielectrics 1563, are shown. However, embodiments are not limited to this example. In other embodiments, the first electrodes 1561, e.g., bottom electrodes to be coupled to source/drain regions of horizontal access devices, and second electrodes 1556, e.g., top electrodes to be coupled to a common electrode plane such as a ground plane, separated by cell dielectrics 1563, may be formed subsequent to forming a first source/drain region, a channel region, and a second source/drain region in a region of the semiconductor material, 1532-1, 1532-2, . . . , 1532-N, intended for location, e.g., placement formation, of the horizontally oriented access devices, described next.

In the example embodiment of FIG. 15, the horizontally oriented storage nodes having the first electrodes 1561, e.g., bottom electrodes to be coupled to source/drain regions of horizontal access devices, and second electrodes 1556, e.g., top electrodes to be coupled to a common electrode plane such as a ground plane, are shown formed in a second horizontal opening, extending in second direction (D2), left and right in the plane of the drawing sheet, a third distance from the vertical opening, e.g., 1251 in FIG. 12B, formed in the vertical stack, e.g., 401 in FIG. 4, and along an axis of orientation of the horizontal access devices and horizontal storage nodes of the arrays of vertically stacked memory cells of the three dimensional (3D) memory. In FIG. 15, a neighboring, horizontal access line 1577 is illustrated adjacent the second dielectric material, 1533-1, 1533-2, . . . , 1533-N, third dielectric material, 1543-1, 1543-2, . . . , 1543-N the fifth dielectric material 1574 and sixth dielectric material 1584, with a portion of first conductive material 1577-1 located below the semiconductor material, 1532-1, 1532-2, . . . , 1532-N and a portion 1577-1 of first conductive material 1577-2 located below the semiconductor material, 1532-1, 1532-2, . . . , 1532-N, indicating a location set inward from the plane and orientation of the drawing sheet.

In some embodiments, the fifth dielectric material 1574 may be below the first dielectric material 1530, above the low doped semiconductor material 1532 while the sixth dielectric material 1584 may be below the low doped semiconductor material 1532, above the low doped semiconductor material 1532. In some embodiments, the fifth dielectric material 1574 and sixth dielectric material 1584 may be below the first dielectric material 1530 while remaining in direct contact with the first conductive material 1577, and the low doped semiconductor material 1532.

The second conductive material 1541 may be formed vertically through a third vertical openings 1581. The second conductive material 1541 may be formed as a vertical digit line adjacent first conductive material 1577-1, 1577-2, . . . , 1577-N and high doped semiconductor material 1595 in second vertical opening 1570. The second conductive material 1541 may intersect first dielectric material, 1530-1, 1530-2, . . . , 1530-N, the fifth dielectric material 1574 and sixth dielectric material 1584, and low doped semiconductor material 1532-1, 1532-2, . . . , 1532-N. The third vertical openings 1581 may be formed past (e.g., through) the substrate 1500 to underlying interconnection metal layers such that the second conductive material 1541 may be connected to underlying CMOS and interconnection layers beneath the substrate 1500. The connection to the underlying metal layers may provide a shorter path for the second conductive material 1541 to CMOS circuitry beneath the substrate 1500.

Figure 16B:
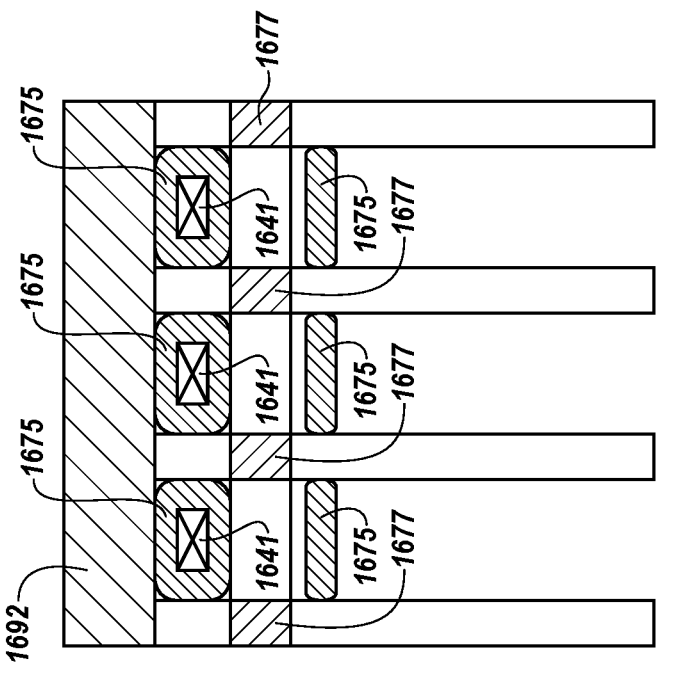
FIGS. 16A to 16B illustrate an example method, at another stage of a semiconductor fabrication process, for forming arrays of vertically stacked memory cells, having vertical digit lines for semiconductor devices and horizontally oriented access lines, in accordance with a number of embodiments of the present disclosure.
Figure 16A:
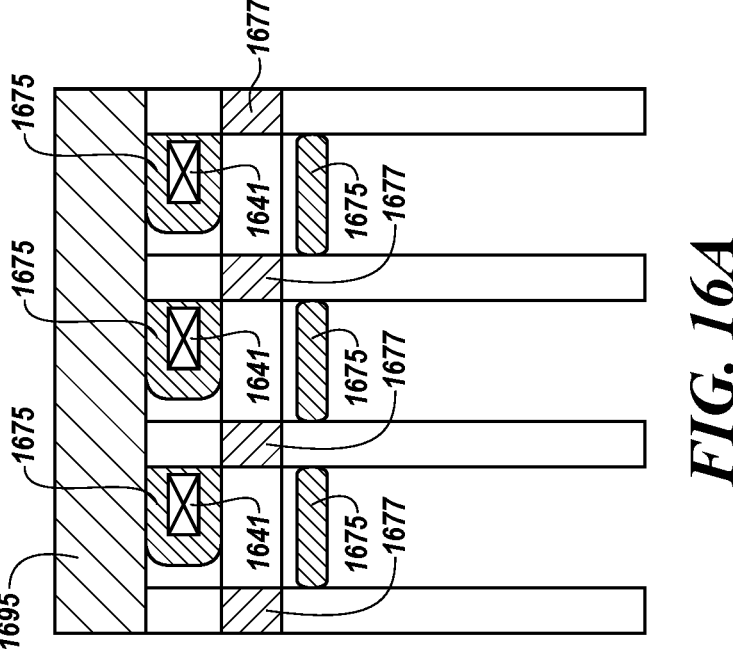

FIG. 16A illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure. FIG. 16A illustrates a top down view of a semiconductor structure, at a particular point in time, in a semiconductor fabrication process, according to one or more embodiments. In the example embodiment of FIG. 16A, the method comprises using a photolithographic process to pattern the photolithographic mask 1637 where a second conductive material 1641 is asymmetric to reserve room for a body contact 1695. The method in FIG. 16A further illustrates using one or more etchant processes to form a vertical opening 1651 in a storage node region 1650 through the vertical stack and extending predominantly in the first horizontal direction (D1) 1609. The one or more etchant processes forms a vertical opening 1651 to expose third sidewalls in the repeating iterations of alternating layers of a first dielectric material, 1630-1, 1630-2, . . . , 1630-N, a second dielectric material, 1633-1, 1633-2, . . . , 1633-N a semiconductor material, 1632-1, 1632-2, . . . , 1632-N, and a third dielectric material, 1643-1, 1643-2, . . . , 1643-N, in the vertical stack, adjacent a second region of the semiconductor material.

According to an example embodiment, the method comprises selectively etching the second region of the semiconductor material, 1632-1, 1632-2, . . . , 1632-N, to deposit a second source/drain region and capacitor cells through the second horizontal opening, which is a second horizontal distance back from a vertical opening 1651 in the vertical stack. In some embodiments, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 1661 and a second electrode 1656 separated by a cell dielectric 1663. Other suitable semiconductor fabrication techniques and/or storage nodes structures may be used.

In other embodiments, the method further comprises forming a first source/drain region and second conductive material 1641 through third vertical openings 1681. A second conductive material 1641 may be formed vertically through a plurality of patterned third vertical openings 1681 through the vertical stack. The vertically oriented digit lines are formed asymmetrically adjacent in electrical contact with the first source/drain regions 1675. The second conductive material 1641 may be formed as an asymmetric vertical digit line contact to reserve room for a body contact 1695. The high doped semiconductor material 1695 may be formed within a second vertical opening 1670 as the body contact. The high doped semiconductor material 1695 may form a body contact for the second conductive material 1641, the hard mask 1637, the fifth dielectric material 1674, and sixth dielectric material 1684. The second conductive material 1641 may form vertical digit lines adjacent a first source/drain region 1675. The first source/drain region 1675 may be formed adjacent a first conductive material 1677 and surrounding the plurality of patterned third vertical openings 1681. The first conductive material 1677 may form a lateral access line between the first vertical openings and the etched fifth dielectric material 1674 and sixth dielectric material 1684.

FIG. 16B illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure. FIG. 16B illustrates a top down view of a semiconductor structure, at a particular point in time, in a semiconductor fabrication process, according to one or more embodiments. In the example embodiment of FIG. 16B, the method comprises using a photolithographic process to pattern the photolithographic mask 1637 where a second conductive material 1641 is deposited symmetrically. The method in FIG. 16B further illustrates using one or more etchant processes to form a vertical opening 1651 in a storage node region 1650 through the vertical stack and extending predominantly in the first horizontal direction (D1) 1609. The one or more etchant processes forms a vertical opening 1651 to expose third sidewalls in the repeating iterations of alternating layers of a first dielectric material, 1630-1, 1630-2, . . . , 1630-N, a second dielectric material, 1633-1, 1633-2, . . . , 1633-N a semiconductor material, 1632-1, 1632-2, . . . , 1632-N, and a third dielectric material, 1643-1, 1643-2, . . . , 1643-N, in the vertical stack, adjacent a second region of the semiconductor material.

According to an example embodiment, the method comprises selectively etching the second region of the semiconductor material, 1632-1, 1632-2, . . . , 1632-N, to deposit a second source/drain region and capacitor cells through the second horizontal opening, which is a second horizontal distance back from a vertical opening 1651 in the vertical stack. In some embodiments, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 1661 and a second electrode 1656 separated by a cell dielectric 1663. Other suitable semiconductor fabrication techniques and/or storage nodes structures may be used.

In other embodiments, the method further comprises forming a first source/drain region and second conductive material 1641 through third vertical openings 1681. A second conductive material 1641 may be formed vertically through a plurality of patterned third vertical openings 1681 through the vertical stack. The second conductive material 1641 may be formed symmetrically as a vertical digit line contact. The vertically oriented digit lines are formed symmetrically, in vertical alignment, in electrical contact with the first source/drain regions 1675. The second conductive material 1641 may be formed in contact with an insulator material 1692 such that there is no body contact within a second vertical opening 1670. Second conductive material 1641 may form vertical digit lines adjacent a first source/drain region 1675. The first source/drain region 1675 may be formed adjacent a first conductive material 1677 and surrounding the plurality of patterned third vertical openings 1681. The first conductive material 1677 may form a lateral access line between the first vertical openings and the etched fifth dielectric material 1674 and sixth dielectric material 1684.

Figure 17A:
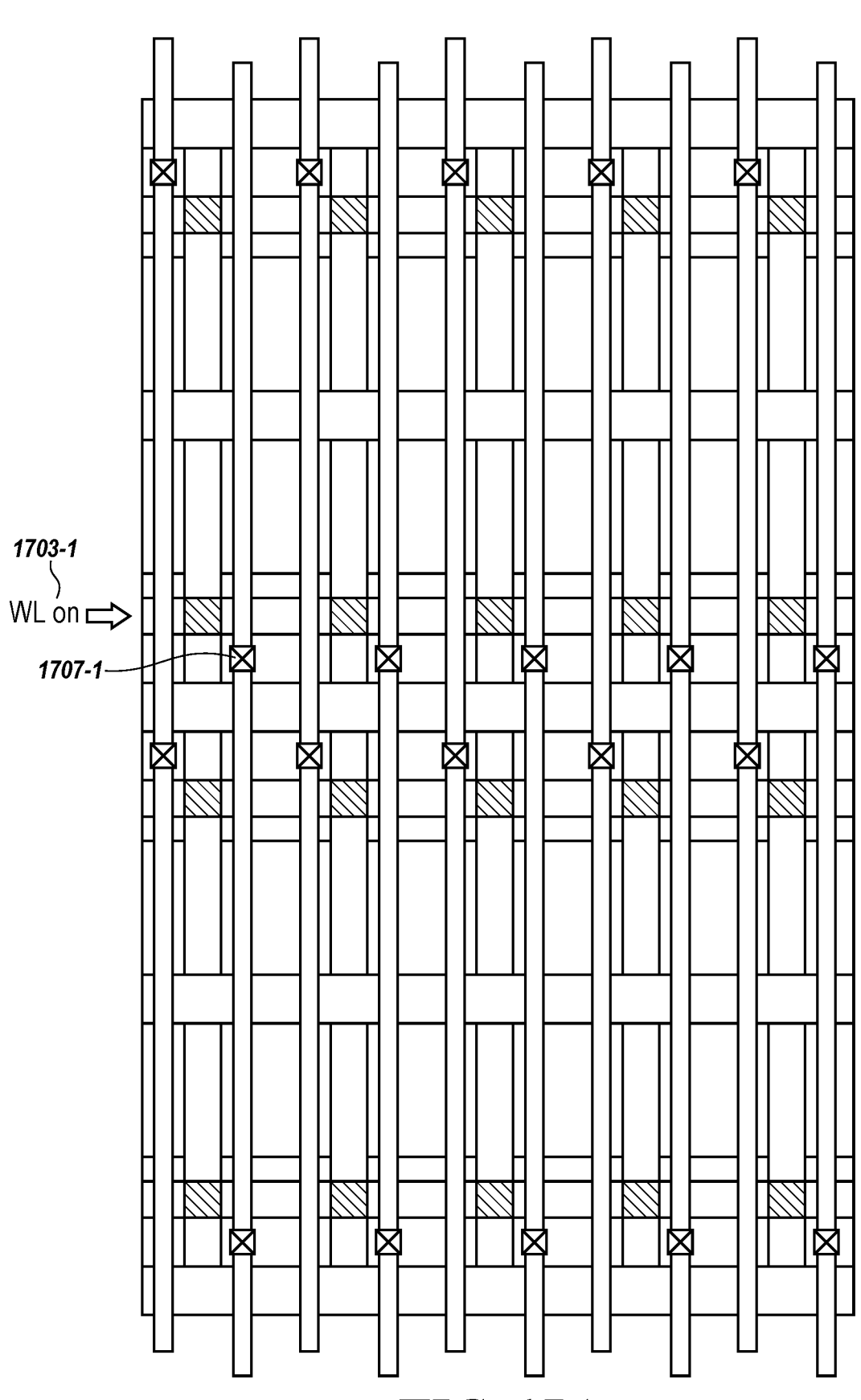
FIGS. 17A to 17B illustrate top views of an example horizontally oriented access device coupled to a horizontally oriented access lines, having vertical digit lines for semiconductor devices, in accordance with a number of embodiments of the present disclosure.

FIG. 17A illustrates an alternate top view, showing another view of the semiconductor structure at this particular point in one example semiconductor fabrication process, and in accordance with a number of embodiments of the present disclosure. FIG. 17A illustrates a top down view of a semiconductor structure with dual vertical digit lines. As illustrated in FIG. 17A, embodiments of the present disclosure may be employed in a structure wherein the array of vertically stacked memory cells is electrically coupled in a folded digit line architecture. In a folded digit line structure, the dual structures may share a single word line 1703. A folded digit line structure may be possible when the digit lines 1707 has an odd amount of word lines 1703. A folded digit line structure may be possible when only one word line is turned on in the sub array block.

Figure 17B:
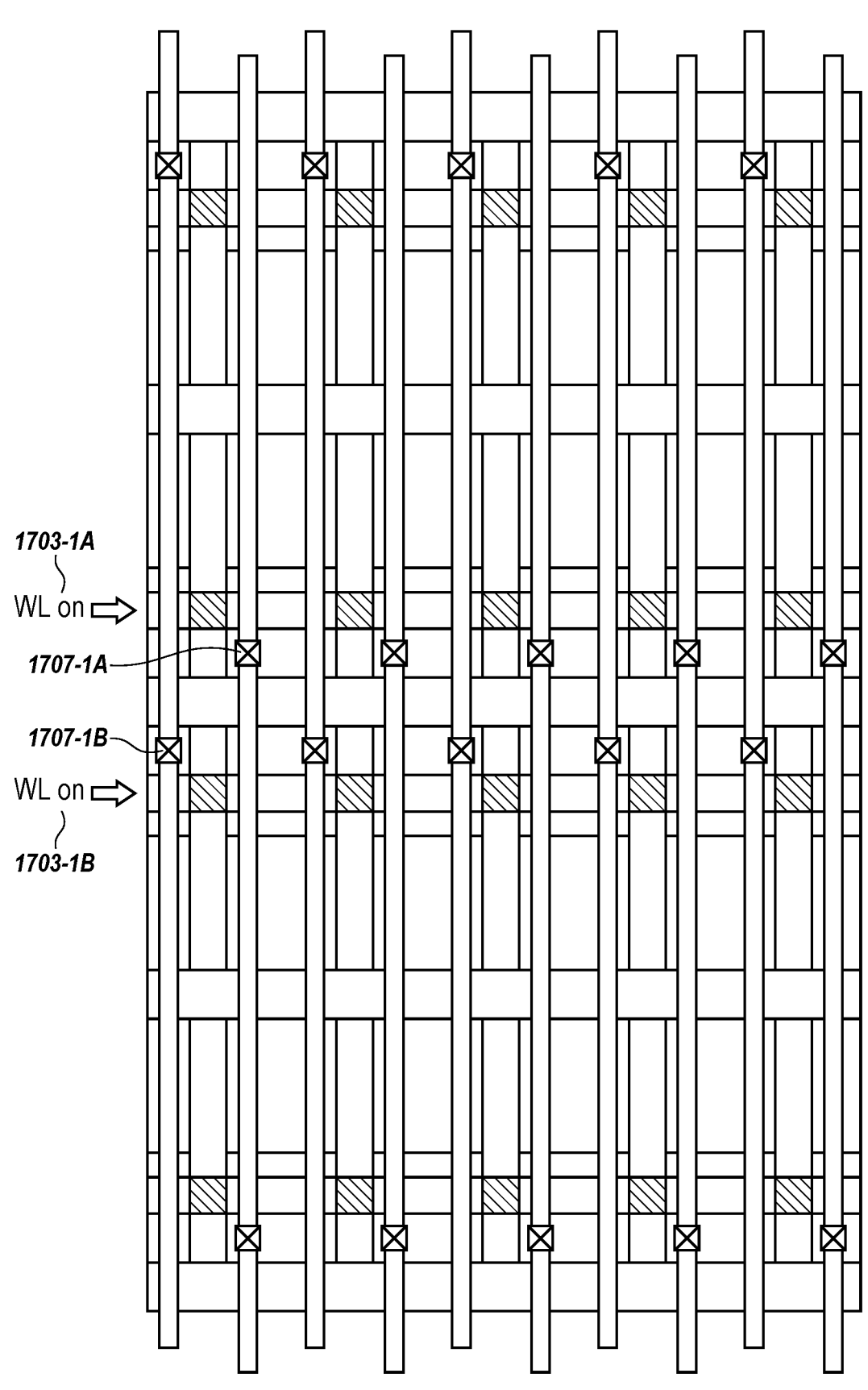

FIG. 17B illustrates an alternate top view, showing another view of the semiconductor structure at this particular point in one example semiconductor fabrication process, and in accordance with a number of embodiments of the present disclosure. FIG. 17B illustrates a top down view of a semiconductor structure with dual vertical digit lines. As illustrated in FIG. 17B, embodiments of the present disclosure may be employed in a structure wherein the array of vertically stacked memory cells is electrically coupled in an open digit line architecture. In an open digit line structure, each digit line structure may have its own word line 1703, such that a dual vertical digit line structure may have two wordlines. An open digit line structure may be possible when the digit lines 1707 has an even amount of word lines 1703. If two neighboring wordlines are turned on, only an open digit line structure may be possible; a folded digit line structure would not be possible.

Figure 18:
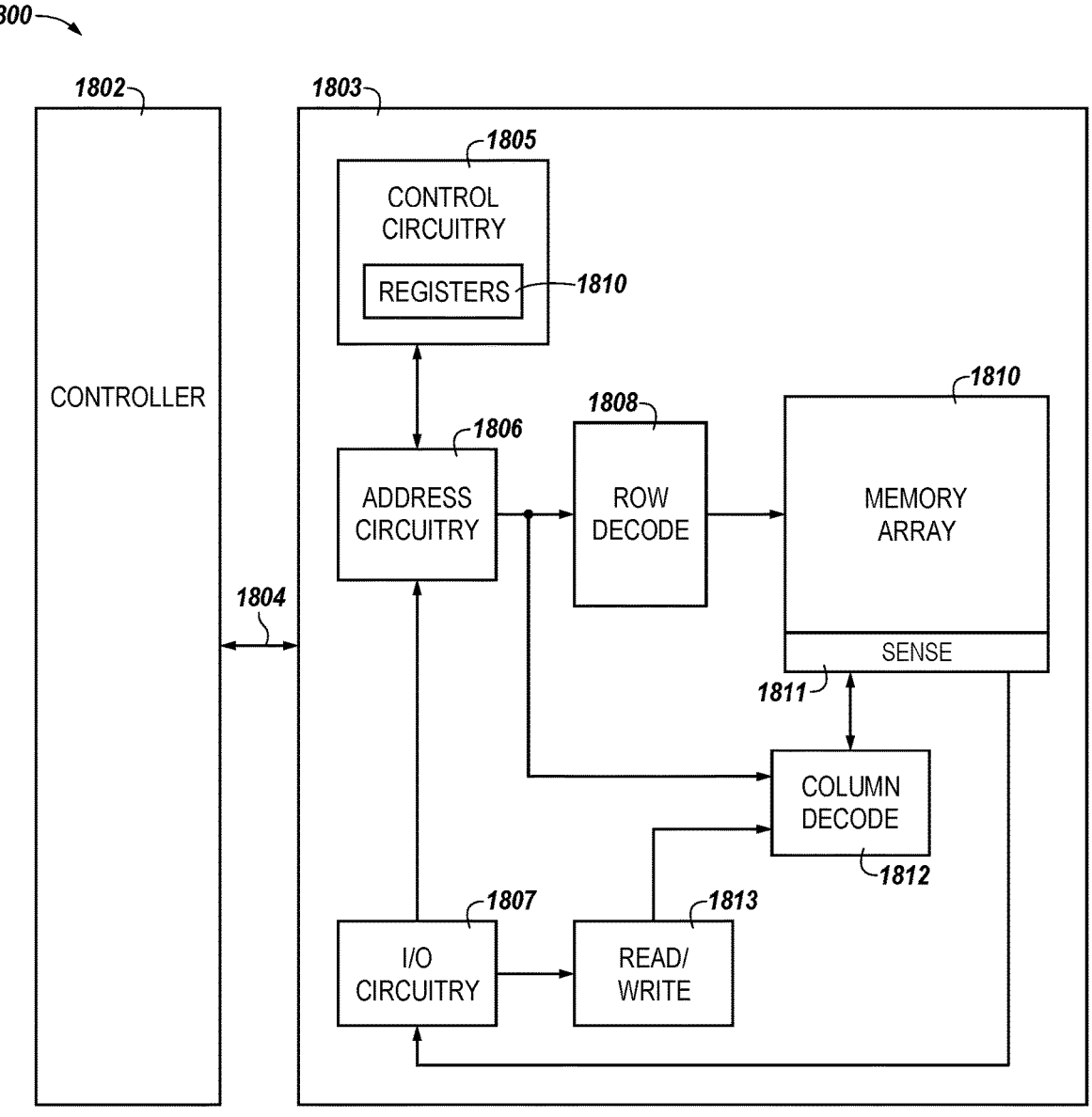
FIG. 18 is a block diagram of an apparatus in the form of a computing system including a memory device in accordance with a number of embodiments of the present disclosure.

FIG. 18 is a block diagram of an apparatus in the form of a computing system 1800 including a memory device 1803 in accordance with a number of embodiments of the present disclosure. As used herein, a memory device 1803, a memory array 1810, and/or a host 1802, for example, might also be separately considered an "apparatus." According to embodiments, the memory device 1802 may comprise at least one memory array 1810 with a memory cell formed having a digit line and body contact, according to the embodiments described herein.

In this example, system 1800 includes a host 1802 coupled to memory device 1803 via an interface 1804. The computing system 1800 can be a personal laptop computer, a desktop computer, a digital camera, a mobile telephone, a memory card reader, or an Internet-of-Things (IoT) enabled device, among various other types of systems. Host 1802 can include a number of processing resources (e.g., one or more processors, microprocessors, or some other type of controlling circuitry) capable of accessing memory 1803. The system 1800 can include separate integrated circuits, or both the host 1802 and the memory device 1803 can be on the same integrated circuit. For example, the host 1802 may be a system controller of a memory system comprising multiple memory devices 1803, with the system controller 1805 providing access to the respective memory devices 1803 by another processing resource such as a central processing unit (CPU).

In the example shown in FIG. 18, the host 1802 is responsible for executing an operating system (OS) and/or various applications (e.g., processes) that can be loaded thereto (e.g., from memory device 1803 via controller 1805).

The OS and/or various applications can be loaded from the memory device 1803 by providing access commands from the host 1802 to the memory device 1803 to access the data comprising the OS and/or the various applications. The host 1802 can also access data utilized by the OS and/or various applications by providing access commands to the memory device 1803 to retrieve said data utilized in the execution of the OS and/or the various applications.

For clarity, the system 1800 has been simplified to focus on features with particular relevance to the present disclosure. The memory array 1810 can be a DRAM array comprising at least one memory cell having a digit line and body contact formed according to the techniques described herein. For example, the memory array 1810 can be an unshielded DL 4F2 array such as a 3D-DRAM memory array. The array 1810 can comprise memory cells arranged in rows coupled by word lines (which may be referred to herein as access lines or select lines) and columns coupled by digit lines (which may be referred to herein as sense lines or data lines). Although a single array 1810 is shown in FIG. 18, embodiments are not so limited. For instance, memory device 1803 may include a number of arrays 1810 (e.g., a number of banks of DRAM cells).

The memory device 1803 includes address circuitry 1806 to latch address signals provided over an interface 1804. The interface can include, for example, a physical interface employing a suitable protocol (e.g., a data bus, an address bus, and a command bus, or a combined data/address/ command bus). Such protocol may be custom or proprietary, or the interface 1804 may employ a standardized protocol, such as Peripheral Component Interconnect Express (PCIe), Gen-Z, CCIX, or the like. Address signals are received and decoded by a row decoder 1808 and a column decoder 1812 to access the memory array 1810. Data can be read from memory array 1810 by sensing voltage and/or current changes on the sense lines using sensing circuitry 1811. The sensing circuitry 1811 can comprise, for example, sense amplifiers that can read and latch a page (e.g., row) of data from the memory array 1810. The I/O circuitry 1807 can be used for bi-directional data communication with the host 1802 over the interface 1804. The read/write circuitry 1813 is used to write data to the memory array 1810 or read data from the memory array 1810. As an example, the circuitry 1813 can comprise various drivers, latch circuitry, etc.

Control circuitry 1805 decodes signals provided by the host 1802. The signals can be commands provided by the host 1802. These signals can include chip enable signals, write enable signals, and address latch signals that are used to control operations performed on the memory array 1810, including data read operations, data write operations, and data erase operations. In various embodiments, the control circuitry 1805 is responsible for executing instructions from the host 1802. The control circuitry 1805 can comprise a state machine, a sequencer, and/or some other type of control circuitry, which may be implemented in the form of hardware, firmware, or software, or any combination of the three. In some examples, the host 1802 can be a controller external to the memory device 1803. For example, the host 1802 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:

an array of vertically stacked memory cells, the array having horizontally oriented access devices and access lines and vertically oriented digit lines, comprising: the horizontally oriented access devices having first source/drain regions and second source drain regions separated by channel regions, and gates opposing the channel regions formed fully around every surface of the channel region as gate all around (GAA) structures on a gate dielectric material;

the horizontally oriented access lines separated from the channel region by the gate dielectric;

horizontally oriented storage nodes electrically coupled to the second source/drain regions of the horizontally oriented access devices; and the vertically oriented digit lines electrically coupled to the first source/drain regions of the horizontally oriented access devices, wherein the vertically oriented digit lines are formed asymmetrically adjacent in electrical contact with the first source/drain regions; and wherein the array of vertically stacked memory cells is electrically coupled in one of an open digit line architecture or a folded digit line architecture.

2. The memory device of claim 1, wherein the gates opposing the channel regions provide a subthreshold voltage (sub-Vt) slope in a range of approximately 45 to 100 millivolts per decade (mV/dec).

3. The memory device of claim 1, wherein the vertically oriented digit lines comprise a highly phosphorus (P) doped (n+) poly-silicon germanium (SiGe) material.

4. The memory device of claim 1, wherein the vertically oriented digit lines comprise a tungsten (W) material formed on a titanium/titanium nitride (TiN) material which forms a titanium silicide with the first source/drain regions of the horizontally oriented access devices.

5. The memory device of claim 1, wherein the vertically oriented digit lines are formed symmetrically, in vertical alignment, in electrical contact with the first source/drain regions.

6. A memory device, comprising:

an array of vertically stacked memory cells, the array having horizontally oriented access devices and access lines and vertically oriented digit lines, comprising:

the horizontally oriented access devices having first source/drain regions and second source drain regions separated by channel regions, and gates opposing the channel regions formed around the channel region as gate all around (GAA) structures on a gate dielectric material;

the horizontally oriented access lines separated from the channel region by the gate dielectric;

horizontally oriented storage nodes electrically coupled to the second source/drain regions of the horizontally oriented access devices:

the vertically oriented digit lines electrically coupled to the first source/drain regions of the horizontally oriented access devices; and horizontally oriented capacitor cells having a bottom electrode formed in electrical contact with the second source/drain regions; and wherein the vertically oriented digit lines are formed asymmetrically adjacent in electrical contact with the first source/drain regions.

7. The memory device of claim 6, wherein the channel region is deposited horizontally within a vertical stack.

8. The memory device of claim 6, wherein the GAA structures include a conductive material having a top portion above a semiconductor material and a bottom material below the gate dielectric material.

9. The memory device of claim 6, wherein the vertically oriented digit lines comprise a ruthenium (Ru) material.

10. The memory device of claim 6, wherein the channel material comprises a high doped semiconductor material to form a conductive body contact to the horizontally oriented access devices.

11. The memory device of claim 6, wherein a top electrode is separated from the bottom electrode by a cell dielectric.

12. A memory device, comprising:

an array of vertically stacked memory cells, the array having horizontally oriented access devices and access lines and vertically oriented digit lines, comprising:

the horizontally oriented access devices having first source/drain regions and second source drain regions separated by channel regions, and gates opposing the channel regions formed around the channel region as gate all around (GAA) structures on a gate dielectric material;

the horizontally oriented access lines separated from the channel region by the gate dielectric material;

storage nodes electrically coupled to the second source/drain regions of the horizontally oriented access devices:

the vertically oriented digit lines electrically coupled to the first source/drain regions of the horizontally oriented access devices; and capacitor cells having a first horizontally oriented electrode electrically coupled to the first source/drain regions and a second electrode separated from the first horizontally oriented electrode by a cell dielectric; and wherein the horizontally oriented access devices are formed in a vertical stack of materials formed on a silicon substrate, the vertical stack comprising repeating iterations of a first dielectric material, a second dielectric material, a semiconductor material, and a third dielectric material.

13. The memory device of claim 12, wherein the horizontally oriented access lines opposing a channel region of the semiconductor material comprise a ruthenium (Ru) material.

14. The memory device of claim 12, wherein the channel material comprises an insulator material.

15. The memory device of claim 12, wherein the first dielectric material comprises an oxide material, the semiconductor material comprises a low doped, p-type (p–) polysilicon, and the second dielectric material and the third dielectric material comprise a silicon nitride (SiN) material, in repeating iterations vertically, to form the vertical stack.

16. The memory device of claim 12, wherein a bottom electrode formed in electrical contact with the second source/drain regions.

* * * * *